United States Patent
Ushifusa et al.

(10) Patent No.: US 8,846,439 B2
(45) Date of Patent: Sep. 30, 2014

(54) METHOD AND APPARATUS FOR FORMING PATTERN

(71) Applicant: Hitachi High-Technologies Corporation, Tokyo (JP)

(72) Inventors: Nobuyuki Ushifusa, Yokohama (JP); Naohito Uemura, Tokyo (JP); Shigeru Suzuki, Honjo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/845,476

(22) Filed: Mar. 18, 2013

(65) Prior Publication Data

US 2013/0316492 A1    Nov. 28, 2013

(30) Foreign Application Priority Data

May 28, 2012 (JP) ................... 2012-120673
Feb. 20, 2013 (JP) ................... 2013-030693

(51) Int. Cl.
| | |
|---|---|
| H01L 21/00 | (2006.01) |
| B05C 3/20 | (2006.01) |
| B41F 15/42 | (2006.01) |
| B05D 1/32 | (2006.01) |
| H01L 31/18 | (2006.01) |
| B41F 15/40 | (2006.01) |
| G03F 7/12 | (2006.01) |

(52) U.S. Cl.
CPC ... B05D 1/32 (2013.01); B05C 3/20 (2013.01); B41F 15/42 (2013.01); H01L 31/18 (2013.01); B41F 15/40 (2013.01); G03F 7/12 (2013.01)
USPC ........................................... 438/98; 118/406

(58) Field of Classification Search
CPC ...................................................... H01L 51/56
USPC ..................................... 438/98; 118/406
See application file for complete search history.

(56) References Cited

FOREIGN PATENT DOCUMENTS

| | | |
|---|---|---|
| JP | 11-068175 | 3/1999 |
| JP | 11-268236 | 10/1999 |
| JP | 2000-62138 | 2/2000 |
| JP | 2001-326391 | 11/2001 |
| JP | 2003-25706 | 1/2003 |
| JP | 2003-197983 | 7/2003 |
| JP | 2003-234516 | 8/2003 |
| JP | 2005-057124 | 3/2005 |
| JP | 2006-240303 | 9/2006 |
| JP | 2007-103580 | 4/2007 |
| JP | 2011-152487 | 8/2011 |
| JP | 2011-235519 | 11/2011 |

*Primary Examiner* — Mark A Laurenzi
(74) *Attorney, Agent, or Firm* — Antonelli, Terry, Stout & Kraus, LLP.

(57) ABSTRACT

There is provided a pattern forming apparatus which transfers a paste to a predetermined position of a pattern forming object fixed to a table through a pattern forming mask having opening portions at predetermined positions using a discharge mechanism part. To realize a pattern forming which allows the stable forming of a fine pattern with high accuracy and allows the paste to be surely filled into fine through holes, a corner portion of a distal end of the discharge mechanism part in contact with the pattern forming mask is formed into a concave shape, and a surface of the distal end portion of the discharge mechanism part including the concave shaped portion is covered with a film having liquid repellency so that the rolling of the paste is accelerated in a region formed by the concave shaped portion to form a fine pattern with high accuracy.

8 Claims, 23 Drawing Sheets

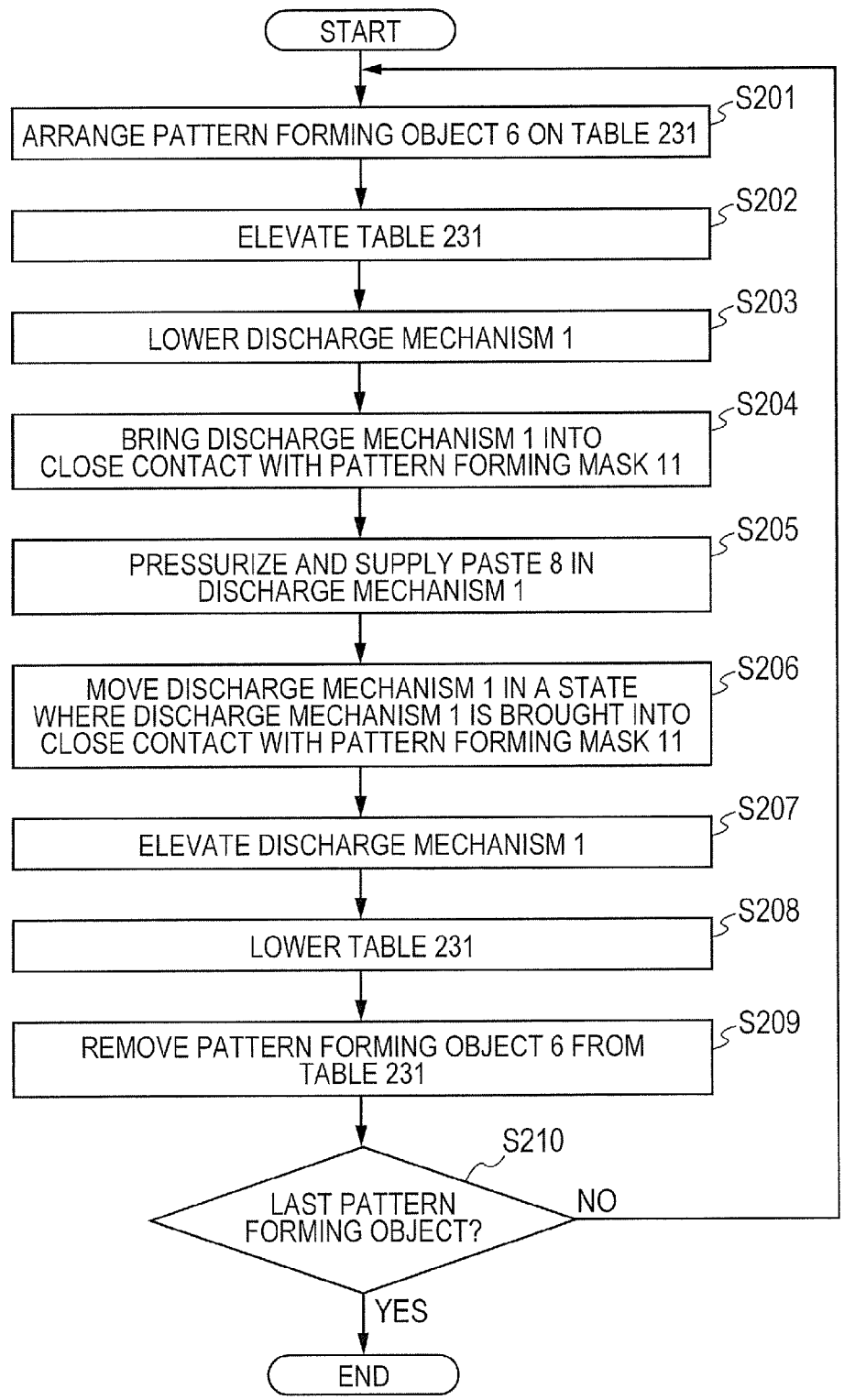

FIG. 11
(a)
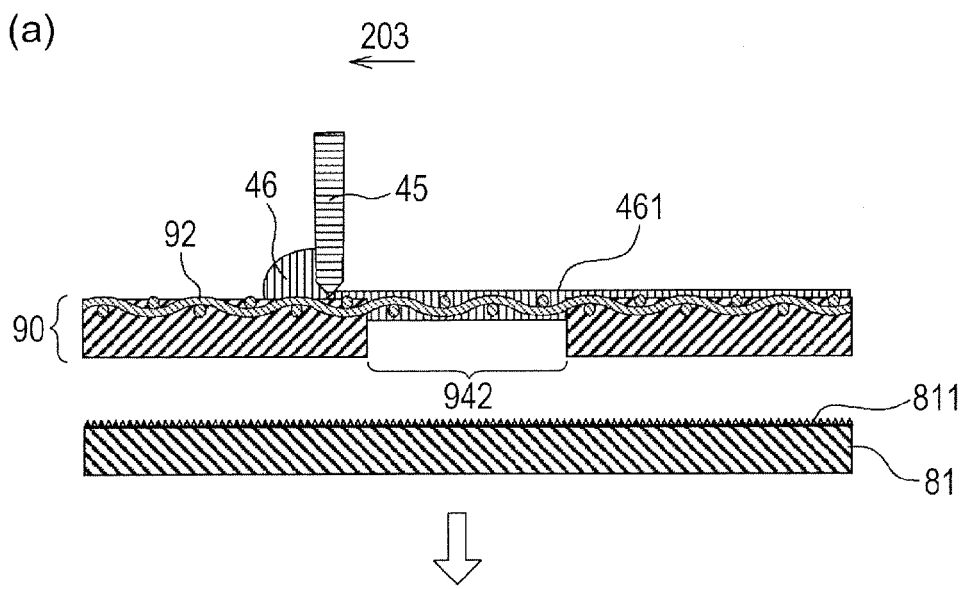
(b)
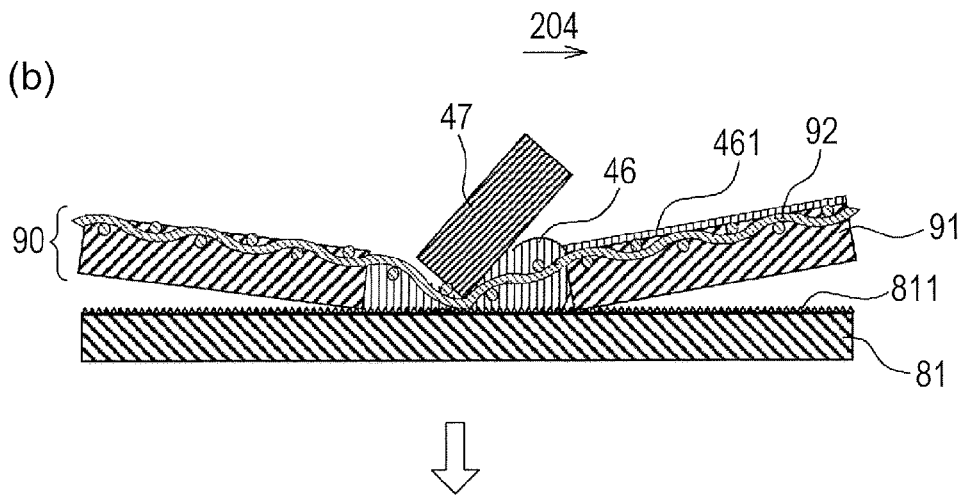
(c)
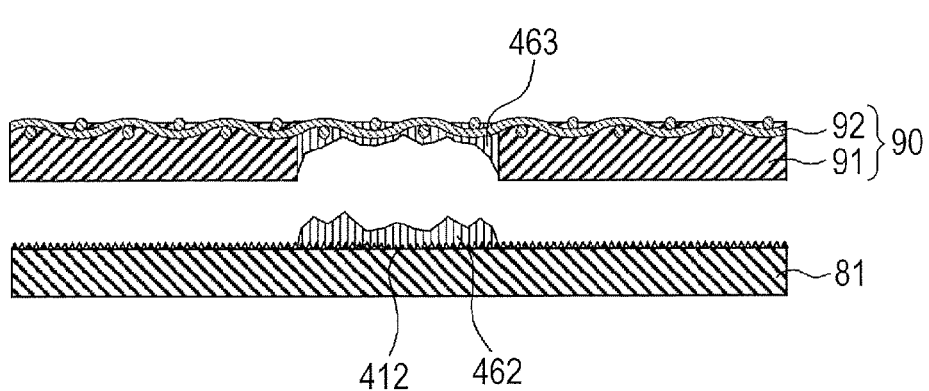

METHOD AND APPARATUS FOR FORMING PATTERN

CLAIM OF PRIORITY

The present application claims priority from Japanese Patent Application JP 2012-120673 filed on May 28, 2012 and Japanese Patent Application JP 2013-30693 filed on Feb. 20, 2013, the contents of which are hereby incorporated by reference into this application.

BACKGROUND

The present invention relates to a method and an apparatus for forming a pattern where a pattern is formed by discharging a viscous pattern forming material to a pattern forming object through a pattern forming mask having a predetermined opening pattern with respect to the pattern forming object.

As a method for forming a pattern on a pattern forming object, a pattern forming method which uses a screen mask is used in general.

The pattern forming method using a screen mask is a type of stencil pattern forming method where a paste (pattern forming material) such as ink is made to pass through a pattern forming mask having an opening pattern by squeezing (extruding the paste (pattern forming material)) by a squeegee thus transferring a desired pattern on a pattern forming object. This pattern forming method using a screen mask is used in various applications such as the formation of printed circuit wiring of an IC substrate or the formation of a pattern (formation of electrode and filling of phosphor) on an FDP (Flat Display Panel).

A mesh mask, a metal mask or the like is used as a pattern forming mask.

A mesh mask is a mask where an opening pattern is formed on a knitted material made of mesh-like stainless steel, polyester or the like using a photosensitive emulsion. For enhancing pattern forming accuracy, a mask where opening pattern is formed on a metal mesh which exhibits small deformation is popularly used.

A metal mask is a mask where an opening pattern is formed on a metal plate by laser forming, etching or the like or a mask where an opening pattern is formed on a metal plate by plating.

A pattern forming method using a screen mask is used in various pattern formations such as the pattern formation of electrode wiring, solder resist, flux or solder paste on various electronic devices or printed circuit boards, the pattern formation of a frame-like sealing material on substrate for a liquid crystal display, the pattern formation of a dielectric layer on a substrate for a plasma display, partition walls between pixels, electrode wiring and fluorescent material. A size of the mesh mask, that is, an area of a mesh, a size of a mask printing frame for pattern forming, a width of a tension mesh and the like are designed in conformity with the application.

A method for forming a pattern on a pattern forming object through a pattern forming mask substantially includes a step of filling a viscous pattern forming material (paste) into an opening pattern portion formed on a pattern forming mask, and a step of transferring the viscous pattern forming material (paste) filled into the opening pattern portion formed on the pattern forming mask to the pattern forming object through the pattern forming mask.

A pattern forming method using a screen mask uses, in general, a scraper for applying a viscous pattern forming material (paste) to a pattern forming mask by coating or a squeegee for filling a viscous pattern forming material (paste) into the inside of an opening pattern portion formed on a pattern forming mask.

On the other hand, as a method of filling a viscous pattern forming material (cream solder) in a pattern forming mask, JP-A-2000-62138 discloses a method which uses a pressurizing means in place of a scraper or a squeegee used in general in a pattern forming method using the screen mask. Further, JP-A-11-268236 discloses a method which uses a forcibly pressurizing discharge mechanism part as a method of filling a viscous pattern forming material (paste) into a pattern forming mask. These conventional examples are referred to as pressurizing discharge means hereinafter.

According to these conventional examples, a filling pressure can be controlled with high accuracy, a viscous pattern forming material can be filled into the opening portion formed in pattern forming mask from a discharge port at an appropriate filling pressure, and filling of the paste is hardly influenced by physical properties such as viscosity or viscoelasticity of the paste. Further, the paste is accumulated in the hermetic structure of a discharge mechanical part and hence, a change in physical property of the paste at the time of forming a pattern (the increase of viscosity caused by evaporation of a solvent or the like when the paste is left on a pattern forming mask or inclusion of dry solid material) can be prevented, and also entrapment of air or dust in the paste can be prevented.

Further, JP-2011-152487 discloses, as a method for forming a pattern of a solar cell, a method where a material is linearly supplied from a nozzle without using a pattern forming mask.

According to this conventional example, for example, in forming a finger electrode which intersects with a bus electrode, a pattern of the finger electrode can be formed with a large film thickness (high aspect ratio), and it is possible to prevent a surface of the finger electrode at an intersecting position from becoming uneven.

A pattern forming object used in a solar cell is cut out from a silicon ingot by a wire saw. However, there is irregularity in thickness in the pattern forming object, and also the flatness of the pattern forming object is not uniform. Further, there is a tendency that a thickness of the pattern forming object used in a solar cell is made small for enhancing light emitting efficiency and hence, the pattern forming object warps or waves. Accordingly, it is difficult to bring a pattern forming mask into uniform contact with a pattern forming object over the whole surface.

In the conventional screen printing method, it is necessary to bring the pattern forming mask into contact with the whole surface of the pattern forming object by applying a printing pressure to the squeegee. Accordingly, in stroking the squeegee on the pattern forming mask, there arises a drawback that the pattern forming mask is damaged by an edge of the pattern forming object used in a solar cell. When a thickness of the pattern forming object used in the solar cell is uniform, by arranging a substrate having the same thickness as the pattern forming object around the pattern forming object thus eliminating a stepped portion, it is possible to prevent breaking of the pattern forming mask. When the thickness of the pattern forming object is not uniform, there arises a drawback in the pattern formation due to the difference in thickness between the pattern forming object and the substrate.

As means for obviating such a drawback, a method for forming a pattern in a state where a pattern forming mask and a pattern forming object are not in contact with each other is proposed and, the method is disclosed in JP-A-2003-25706.

According to this conventional example, ink is filled into an opening portion formed in the pattern forming mask by a scraper, and high pressure gas is sprayed from a nozzle in the direction toward the pattern forming object from the pattern forming mask thus forming a pattern without bringing the mask into contact with a substrate.

SUMMARY

Along with the miniaturization of surface mounting parts in recent years, an area of a pad of a printed circuit board is decreased, and an area of an opening portion formed in a pattern forming mask is also decreased corresponding to the decrease of the area of the pad.

With respect to such an opening portion having the small opening area, in the conventional pattern forming method using a screen mask, a force which pushes a paste into the opening portion formed in the pattern forming mask is not sufficient and hence, adhesiveness between the pad of the printed circuit board and the paste in the opening portion becomes insufficient. As a result, the paste remains in the opening portion formed in the pattern forming mask thus giving rise to a case where the paste cannot be formed on the pad of the printed circuit board by patterning (transfer) or an amount of a paste formed by patterning becomes insufficient.

In general, fluidity of a paste is improved when shear (shearing force) is applied to the paste. Accordingly, by applying rolling to the paste, viscosity of the paste is lowered so that fluidity of the paste is enhanced.

However, in the method using pressurizing discharge means disclosed in JP-A-2000-62138 and JP-A-11-268236, a paste held in a hermetic pressurized vessel exhibits small fluidity so that shear (shearing force) is not applied to the paste. Accordingly, there exists a possibility that viscosity is enhanced so that fluidity is deteriorated. The poor fluidity impairs filling property of a paste into a pattern forming mask thus giving rise to a drawback that an amount of paste in the pattern forming mask becomes insufficient.

In view of the abovementioned drawback of the related art, the task of the present invention lies in that pattern formability (filling property and transfer property) can be enhanced by enhancing rolling property of a paste by enhancing removal property of the paste from a squeegee or a distal end of a discharge portion of pressurizing discharge means simultaneously with the formation of a pattern using the squeegee or the pressurizing discharge means.

In view of the above-mentioned drawback of the related art, a problem to be solved by the present invention lies in that when a pattern is formed by a paste using a squeegee, the paste is raised along a side surface of the squeegee on a side opposite to the pattern forming mask and hence, filling of the paste into the pattern forming mask becomes insufficient.

One of the tasks of the present invention lies in the finding of a method for filling a paste into a pattern forming mask having technical features which can overcome the above-mentioned drawbacks.

Further, a paste is filled into an opening pattern formed in a pattern forming mask from a squeegee or a distal end of a discharge portion of pressurizing discharge means. Accordingly, a shape of the squeegee or the distal end of the discharge portion of the pressurizing discharge means influences property of filling a paste into the patter forming mask. Accordingly, the task to be solved by the present invention lies in the structure and a surface state of the distal end of the discharge mechanism part which can enhance filling property compared to a conventional squeegee or a distal end of a discharge portion of conventional pressurizing discharge means. Particularly, the direction of a force applied to the paste is changed corresponding to an attack angle made between the distal end of the discharge mechanism part and a pattern forming surface of the pattern forming object and hence, it has been a task to be solved by the present invention that the paste can be filled into an opening pattern formed in the pattern forming mask from the substantially vertical direction.

On the other hand, in a pattern forming method using a screen mask used in general, a load generated by a printing pressure is applied to a squeegee or a discharge portion of pressurizing discharge means and hence, a distal end portion is deformed. A flat squeegee made of urethane warps as a whole and hence, an attack angle of a distal end of the squeegee becomes extremely small so that the attack angle changes due to a stepped portion of the pattern forming object. When the attack angle is changed, filling property of the paste filled into an opening portion formed in the pattern forming mask changes. Accordingly, it is the task of the present invention to reduce irregularity in filling property of the paste filled into the pattern forming mask by finding the novel structure of the distal end of the paste discharge mechanism part.

Different pattern forming masks such as a metal mask and a mesh mask are used depending on a pattern forming object. The task of the present invention lies in providing a discharge mechanism part which is compatible with any pattern forming mask.

Along with the miniaturization of a pattern forming object, a size of an opening portion formed in a pattern forming mask is decreased thus giving rise to a possibility that a thickness of a paste on the pattern forming object at the transfer is decreased depending on a size of the opening portion. Accordingly, a task of the present invention lies in providing a pattern forming mask by which an amount of paste remaining in an opening pattern portion in the pattern forming mask due to adhesion to a mesh or an emulsion after pattern forming can be decreased as much as possible thus ensuring the stable transfer of a desired amount of paste on a pattern forming object.

Further, a paste to be used differs depending on a pattern forming object. The paste is a highly viscous material which is formed by mixing a solid component and a liquid component. The task of the present invention lies in providing a discharge mechanism part which can use a paste containing at least one kind of material selected from a group of particles having solder composition, silver particles, flaky silver particles, particles containing nickel as a main component, resin particles coated with metal, ceramic particles, glass particles as a solid component depending on a purpose.

To form a pattern in a state where a pattern forming object and a pattern forming mask are not brought into contact with each other, it is necessary to form a gap formed between the pattern forming object and the pattern forming mask by applying a suction pressure to the pattern forming mask from the direction opposite to the pattern forming object.

In the method disclosed in JP-A-2003-25706, when high pressure air is blown to a pattern forming mask, the pattern forming mask is deflected. Accordingly, it is necessary to form a large gap formed between the pattern forming mask and the substrate for preventing the pattern forming mask from coming into contact with the substrate. Further, when high pressure air is blown, there exists a possibility that ink scatters. There also exists a possibility that high-pressure-air blow pressure changes when a width of a pattern of an opening portion differs.

To maintain a state where a pattern forming object and a pattern forming mask are not brought into contact with each other, it is necessary to control a height of a distal end of a discharge mechanism. The task of the present invention lies in measuring irregularity in thickness of a pattern forming object in advance, setting a height of a distal end of a discharge mechanism at a position slightly higher than the largest thickness thus surely preventing the pattern forming object from coming into contact with the pattern forming mask.

The present invention has been made in view of the above-mentioned drawbacks of the related art, and it is an object of the present invention to provide a pattern forming apparatus which can form a pattern by stably supplying a paste with high accuracy irrespective of a size of an opening area of an opening portion formed in a pattern forming mask.

The present invention has been made to overcome the above-mentioned drawbacks of the related art. To briefly explain the summary of typical inventions among the inventions described in the specification, they are as follows.

The discharge mechanism part is mounted on the pattern forming apparatus in a substantially vertical manner.

In a pattern forming apparatus which transfers a paste to a predetermined position of a pattern forming object fixed to a table through a pattern forming mask having opening portions formed at predetermined positions by using a discharge mechanism part, in addition to the filling of a paste into the pattern forming mask using a uniform pressurizing method, it the paste can be filled into the pattern forming mask using a discharge mechanism part whose distal end is formed into an arc-shaped concave shape. Further, depending on a mounting angle of a distal end portion having an arc-shaped concave shape which is mounted on a discharge mechanism body, an attack angle made between the discharge mechanism part and a pattern forming surface of the pattern forming object can be changed.

Due to such a constitution, the paste is confined in the arc-shaped concave shape portion formed on the distal end of the discharge mechanism part and, in a step of sliding the discharge mechanism part in the driving direction while bringing the discharge mechanism part of the pattern forming mask into contact with the pattern forming object, it is possible to make the paste roll along an arc-shaped concave shape of the distal end of the discharge mechanism part.

Further, at least a surface of the distal end portion of the discharge mechanism part including the arc-shaped concave portion with which the paste is brought into contact has liquid repellency. Accordingly, a frictional force generated between the paste and the surface of the discharge mechanism part is reduced so that a rolling property of the paste is increased. When the rolling property of the paste is increased, a shear speed is increased so that viscosity of the paste is lowered thus further facilitating the flow of the paste.

As a technique for quantifying liquid repellency, used is a technique where a liquid droplet is dropped on a substrate, and an angle (contact angle) of a droplet at a point where an outer peripheral portion of the droplet is brought into contact with the substrate is measured. A small contact angle means a state where the droplet wets the surface of the substrate and spreads on the surface of the substrate, while a large contact angle means a state where the droplet is formed in a raised shape on the surface of the substrate, that is, a state where the substrate repels the droplet.

It is necessary to evaluate liquid repellency of the surface of the discharge mechanism part using a solvent contained in a paste. The solvent contained in the paste is dropped on a surface of the discharge mechanism part. When a contact angle is less than 45 degrees, the paste is built up along the surface of the discharge mechanism part so that a rolling speed of the paste is lowered. When the contact angle is more than 45 degrees, liquid repellency of the surface of the discharge mechanism part is enhanced so that the paste hardly wets the surface of the discharge mechanism part and hardly spreads on the surface of the discharge mechanism part thus enhancing the rolling property of the paste. It is preferable that the contact angle is as large as possible.

As a film having liquid repellency, it is not preferable to use a film which is dissolved by a solvent contained in the paste. As a material which has resistance against the solvent contained in the paste and also has liquid repellency, $SiO_2$, a fluororesin, hydrocarbon, fluorine-containing hydrocarbon can be named.

When a discharge-mechanism-part mounting angle is decreased so as to decrease an attack angle, the relative positional displacement is generated between a housing of a discharge mechanism part head to which a printing pressure is applied and the distal end of the discharge mechanism part which is brought into contact with the pattern forming mask. Accordingly, a printing pressure is not effectively applied to the distal end portion of the discharge mechanism part. That is, when the relative positional displacement is generated at a point of load, a rotation moment is generated. In this case, when a printing pressure is increased, a force which is increased corresponding to the printing pressure is generated on the distal end of the discharge mechanism part in the direction opposite to the direction of printing pressure.

Accordingly, the direction along which the printing pressure is applied to the discharge mechanism part head is desirably aligned with the direction along which the distal end of the discharge mechanism part is brought into contact with the pattern forming mask.

The present invention is also characterized in that, in a state where one edge of the arc-shaped concave portion formed on the distal end of the discharge mechanism part is brought into contact with the pattern forming mask, a size of a gap formed between the other edge of the arc-shaped concave portion formed on the distal end of the discharge mechanism part and the pattern forming mask is ten times or more larger than an average particle size of the paste to be used. The other edge the arc-shaped concave portion formed on distal end portion of the discharge mechanism part means a distal end portion which is formed in an arc-shaped concave portion and is not brought into contact with the pattern forming mask.

The size of the gap formed between the distal end portion and the pattern forming mask is relevant to a size of solid particles contained in the paste to be used. When the discharge mechanism part is brought into contact with the pattern forming mask, not only the paste is filled into an opening portion formed in pattern forming mask but also there exists a possibility that the paste is discharged to a pattern forming object side of the pattern forming mask. Thereafter, a distal end of the discharge mechanism part which originally contributes to the formation of a pattern reaches the opening portion formed in pattern forming mask and hence, a state where the pattern forming is performed twice is brought about.

In the same manner as the filling of the paste into the opening pattern portion of the pattern forming mask, it is necessary for the opening pattern portion to have a size which is at least ten times or more larger than a particle size of a solid component contained in the paste. When the size of the opening pattern portion is smaller than such a size, fluidity of the paste is deteriorated so that the opening pattern portion is choked with particles contained in the paste whereby the paste cannot favorably pass through the opening pattern portion. Accordingly, it is necessary to set the size of the gap formed between the discharge mechanism part and the pattern forming mask at least to a value ten times or more larger than an average particle size of the paste to be used.

On the other hand, the smaller the gap formed between the distal end portion of the discharge mechanism part and the pattern forming mask, the larger a force applied to a paste becomes whereby the filling property of the paste that the paste is smoothly filled into the opening pattern portion of the pattern forming mask is enhanced.

In this manner, by forming the distal end portion of the discharge mechanism part which is brought into contact with the pattern forming mask into a particular shape, the discharge mechanism part can acquire a function of applying a paste having a predetermined thickness on the pattern forming mask by coating, a function of rolling the paste, and a function of filling the paste into the opening portion formed in the pattern forming mask.

A material for forming the discharge mechanism part is a resin which contains urethane as a main component, and has hardness of 80 degrees or more. When the hardness of the material is low, even when a support body which suppresses the deformation of the discharge mechanism part is used as a support, the distal end of discharge mechanism part is deformed due to a printing pressure applied at the time of pattern forming so that an attack angle made between the discharge mechanism part and the pattern forming surface becomes unstable.

Further, irregularities referred to as a texture are formed on a surface of a solar cell, and a transparent conductive film, a transparent insulation layer and the like are formed on the texture. To protect these thin films such as the transparent conductive film and the transparent insulation layer and the texture, the distal end of the discharge mechanism part and an emulsion for forming the pattern forming mask are required to have flexibility.

To give both shape-holding property and flexibility to the discharge mechanism part, a core member is used for forming a center portion of the discharge mechanism part. The core member preferably has conductivity and, particularly, the core member may preferably be made of stainless steel. The core member can be used as an electrode for forming a liquid-repellent film in plasma processing.

With respect to an emulsion for forming the pattern forming mask, it is preferable that the emulsion has a high hardness for forming the opening portion pattern with high accuracy. An emulsion having flexibility exhibits poor resolution so that it is difficult to form the opening portion pattern with high accuracy using such an emulsion.

On the other hand, on a surface of the solar cell, the irregularities referred to as a texture are formed. When hardness of the emulsion for forming the pattern forming mask is high, the deformation of the emulsion at the time of forming the pattern is small so that a gap is formed between the irregularities formed on the surface of the solar cell referred to as the texture and the pattern forming mask thus causing exuding of a paste for forming a pattern due to a capillary phenomenon. An emulsion having high hardness which exhibits high resolution has a deformation amount of 20% or less in the thickness direction at the time of pressing and hence, the emulsion cannot be fully deformed at the time of pattern forming. The exuding of the paste for forming a pattern increases a pattern forming width thus causing reduction of a light reception area on a surface of the solar cell or lowering of power generation efficiency.

Accordingly, it is necessary to enhance the adhesiveness between the irregularities on a surface of a solar cell referred to as a texture and an emulsion for forming a pattern forming mask. To enhance the adhesiveness between the irregularities on a surface of a solar cell referred to as the texture and an emulsion for forming a pattern forming mask, it is necessary to use an emulsion for forming a pattern forming mask which has both high flexibility and poor resolution.

In view of the above, it is possible to form a pattern forming mask which has both high resolution and high adhesiveness by providing an emulsion for forming a pattern forming mask which has the laminated structure where an emulsion having high hardness for forming an opening portion pattern with high accuracy and an emulsion having flexibility for enhancing adhesiveness between the irregularities referred to as the texture and an emulsion for forming a pattern forming mask are laminated to each other.

However, it is more important for an emulsion to be used for forming a pattern forming mask to ensure high resolution of an opening pattern. Accordingly, a thickness of the emulsion having flexibility is preferably set to a minimum necessary value. It is preferable that the emulsion having flexibility exhibits a deformation amount of 40% to 60% in the thickness direction at the time of pressing. The irregularities referred to as the texture formed on a surface of a solar cell has a thickness of approximately 5 µm and hence, it is desirable that the emulsion having flexibility has a thickness which is approximately twice as large as the thickness of the irregularities.

When there is a paste which adheres to and remains on a mesh and a wall surface of the emulsion which are exposed from a pattern forming mask opening portion after a pattern is formed, there may be a case where an amount of paste to be transferred to a pattern forming object becomes unstable. As a method for overcoming such a problem, it is effective to give liquid repellency to a mesh and a wall surface of the emulsion which are exposed from the pattern forming mask opening portion and a surface of the emulsion on a pattern forming object side which are considered as portions to which the paste adheres. The reason liquid repellency is given to the surface of the emulsion on the pattern forming object side is that it is necessary to prevent the exuding of a pattern-forming material formed on the pattern forming object.

The discharge mechanism part which is mounted on the pattern forming apparatus of the present invention may use, as a pattern forming mask, a pattern forming mask which includes a metal plate having a predetermined opening portion (metal mask). The pattern forming mask may also include an organic layer which is formed on a surface of the metal plate on a pattern forming object side.

The discharge mechanism part which is mounted on the pattern forming apparatus of the present invention may include a pattern forming mask where a pattern forming area is formed of at least a metal mesh and an emulsion made of an organic substance, and predetermined opening portions are formed in the emulsion. To consider a case where a pattern forming mask is formed of a metal mesh, an opening portion pattern is formed using an emulsion made of an organic substance and having flexibility and hence, it is possible to float the metal mesh from the pattern forming object using the emulsion whereby a damage caused on a surface of the pattern forming object caused by a discharge mechanism part can be reduced, and a pattern formed film having a stable thickness can be formed.

A pattern forming mask to be used here is required to efficiently transfer a paste to a pattern forming object and hence, it is also possible to give liquid repellency the pattern forming mask in the same manner as the discharge mechanism part. The paste which is filled into an opening pattern portion of the pattern forming mask has no fluidity to that the paste has high viscosity whereby the adhesiveness of the paste to the opening pattern portion of the pattern forming mask is increased. In view of the above, liquid repellency is given to the opening pattern portion of the pattern forming mask so that it is possible to suppress a paste which is filled into the opening pattern portion of the pattern forming mask from remaining in the opening pattern portion of the pattern forming mask whereby a transfer amount of paste can be increased.

That is, when a metal mask is used, it is necessary to efficiently transfer the paste through an opening portion formed in the metal mask after a pattern is formed, and it is also necessary to prevent the exuding of a pattern forming material to a pattern forming object. Accordingly, it is effective to form a liquid-repellent film on wall surfaces of holes which constitute the opening pattern as well as on a surface of the pattern forming object. Liquid repellency may be also given to a surface of the metal mask to which the discharge mechanism part is brought into contact.

Further, to consider a case where a mesh mask is used, when a paste adheres to and remains on a mesh and a wall surface of an emulsion which are exposed from a pattern forming mask opening portion after a pattern is formed, there is a possibility that an amount of paste to be transferred to a pattern forming object becomes unstable. As a method for overcoming such a problem, it is effective to give liquid repellency to a mesh and a wall surface of an emulsion which are exposed from a pattern forming mask opening portion as well as to a surface of the emulsion on a pattern forming object side which are portions to which a paste is considered to adhere. The reason liquid repellency is given to the surface of the emulsion on a pattern forming object side is that it is necessary to prevent the exuding of a pattern forming material to the pattern forming object. Liquid repellency may also be given to a surface of the mesh mask to which the discharge mechanism part is brought into contact.

That is, the present invention is directed to the pattern forming apparatus which transfers a paste to predetermined positions of a pattern forming object fixed to the table through the pattern forming mask having opening portions at predetermined positions using the discharge mechanism part, wherein, to realize a pattern forming which allows the stable forming of a fine pattern with high accuracy and allows the paste to be surely filled into fine through holes, a corner portion of the distal end of the discharge mechanism part which is brought into contact with the pattern forming mask is formed into a concave shape, and a surface of the distal end portion of the discharge mechanism part including the concave shaped portion is covered with a film having liquid repellency so that, in transferring the paste by filling the paste into the pattern forming mask having a desired pattern opening portion, the rolling of the paste is accelerated in an inner portion of a region formed by the concave shaped portion formed on the distal end portion of the discharge mechanism part which is covered with the film having liquid repellency and the pattern forming mask whereby it is possible to form a fine pattern with high accuracy, and filling property of the paste to fine through holes is also accelerated.

The present invention is also directed to the pattern forming apparatus which includes: a mask holding part which holds a mask for forming a pattern; a table part on which a pattern forming specimen is placed, the table part being capable of moving the specimen upwardly and downwardly thus making the specimen approach or retract from the mask held by the mask holding portion; a paste discharge part having a discharge mechanism which forms a pattern made of a paste on the specimen placed on the table part through the mask; and a discharge mechanism drive part which moves the discharge mechanism of the paste discharge part back and forth along the mask, wherein the paste discharge part includes a pair of discharge mechanisms, the pair of discharge mechanisms is mounted in an oppositely facing manner, a concave portion is formed on the discharge mechanism on a side contributing to the formation of the pattern out of the pair of discharge mechanisms mounted in an oppositely facing manner in front of a position where the discharge mechanism is brought into contact with the mask when the pair of discharge mechanisms is brought into pressure contact with the mask in the moving direction at the time of forming the pattern, the concave portion is formed such that an edge portion of the concave portion on a side opposite to an edge portion of the concave portion which is brought into contact with the mask projects toward a side of the mask and a gap is formed between the edge portion and the mask, and the paste discharge part includes a paste supply mechanism for supplying the paste between the pair of discharge mechanisms.

The present invention is also directed to a pattern forming method which includes the steps of: bringing a pattern forming specimen into close contact with a mask for forming a pattern or bringing the pattern forming specimen close to the mask; moving a pair of discharge mechanisms in one direction with respect to the mask while supplying a paste to the mask under pressure between the pair of discharge mechanisms in a state where the pair of discharge mechanisms is brought into pressure contact with the mask; transferring the pattern formed on the mask to the specimen by peeling off the specimen from the mask in a state where the movement of the pair of discharge mechanisms in one direction is finished thus forming the pattern made of the paste on the specimen, wherein the pair of discharge mechanisms is moved in one direction while being pressed to the mask to which the paste is applied so that a pattern formed on the screen is transferred to the specimen while accumulating the paste supplied into a space formed between a concave portion formed on a surface of the discharge mechanism arranged on a rear side in the direction where the discharge mechanism is moved in one direction, and pressed to the mask out of the pair of discharge mechanisms and the mask thus forming the pattern made of the paste.

As a pattern forming mask with which the discharge mechanism part mounted on the pattern forming apparatus of the present invention is used is not limited to a metal mask, a mesh mask and the like which are explained in this specification.

The present invention is applicable to a method for forming a pattern using a pattern forming method, for example, is applicable to the pattern formation in various fields such as the pattern formation of electrode wiring on an electronic device or a surface of a solar cell, the pattern formation of an electrode wiring on a printed circuit board, the pattern formation of a frame-like sealing material on a substrate for a liquid crystal display, the pattern formation of a dielectric layer, partition walls between pixels and electrode wiring on a substrate for a plasma display and a pattern for filling a fluorescent material, the pattern formation for filling a conductive material into the inside of through holes formed in a back-contact-type solar cell, the pattern formation for filling an insulation material into the inside of a concave-shaped opening portion of a semiconductor, the pattern formation of a conductive pillar having a high aspect ratio on a pad of the semiconductor, the pattern formation of an insulation layer on a surface of the semiconductor, and the pattern formation of rewiring. With the use of the technique of the present invention, it is possible to realize the pattern forming of a fine pattern, the pattern formation for filling a material into an opening portion having a high aspect ratio and the like which have been impossible to realize with the use of the related art.

To form a pattern in a state where a pattern follows irregularities formed by irregularities in thickness of a pattern forming object, it is necessary to transfer a paste to the pattern forming object through an opening portion formed in the pattern forming mask while maintaining a state where the pattern forming object and the pattern forming mask are not brought into contact with each other. Further, by bringing the pattern forming object and the pattern forming mask in a non-contact state from each other, damage on the pattern forming mask which may be caused when an edge portion of the pattern forming object is brought into contact with a pattern forming mask can be reduced and hence, a lifetime of the pattern forming mask can be extended considerably.

For this end, it is necessary to provide pattern forming apparatus with an adhesion mechanism which can form a gap formed between the pattern forming object and the pattern forming mask by applying a suction pressure to the pattern forming mask from the direction opposite to the pattern forming object. In forming the pattern in a state where the pattern forming object and the pattern forming mask are not brought into contact with each other, there exists a possibility that the pattern forming mask is pressed due to a paste discharging force generated by the discharge mechanism. In this case, there exists a possibility that a lower surface of the pattern forming mask approaches and is brought into contact with the pattern forming object. To prevent such a contact, the adhesion mechanism is provided in front of and behind the discharge mechanism in the stroke direction thus preventing the pattern forming mask from being brought into contact with the pattern forming object.

In forming a pattern by bringing the pattern forming object and the pattern forming mask into contact with each other, it is necessary to bring the pattern forming object and the pattern forming mask into close contact with each other by applying a printing pressure to the discharge mechanism. On the other hand, it is necessary to control a height of the distal end of the discharge mechanism to maintain a state where the pattern forming object and the pattern forming mask are not brought into contact with each other. It is important to detect and set a state where the contact of the pattern forming mask with the pattern forming object can surely prevented by measuring irregularities in thickness of the pattern forming object in advance and by setting a height of the distal end of the discharge mechanism at a position slightly higher than a position of the pattern forming object having the largest thickness. Means which controls the height of the distal end of the discharge mechanism is referred to as a down stop. Further, by arranging the adhesion mechanism at a position slightly higher than a height of the distal end of the discharge mechanism, a gap can be surely formed between the pattern forming mask and the pattern forming object.

In view of the above, the pattern forming apparatus includes: table means on which a specimen for forming a pattern is placed and which moves a pattern forming object in the vertical direction; mask holding means which holds a mask for forming a pattern at a predetermined height; paste discharge means which includes a discharge mechanism for forming a pattern formed of the paste on the pattern forming object placed on the table means through the mask; and discharge mechanism drive means which makes the discharge mechanism of the paste discharge means move along the mask in a reciprocating manner. The pattern forming apparatus also includes mechanism means which forms a gap formed between a mask used for forming the pattern and the pattern forming object; and mechanism means which supplies a pattern forming object for forming the pattern. The mechanism means which forms the gap formed between the mask and the pattern forming object is arranged in front of and behind the discharge mechanism which discharges the paste for forming the pattern in the moving direction. In such a constitution, the discharge mechanism which discharges a paste for forming the pattern and the mechanism means which forms the gap formed between the mask and the pattern forming object may be arranged independently, or may be arranged as an integral body.

According to the pattern forming apparatus of the present invention on which the discharge mechanism is mounted, regardless of a size of an opening area of the opening portion formed in pattern forming mask, it is possible to stably form a pattern using the paste with high accuracy.

Further, the pattern forming apparatus is configured such that the pattern forming apparatus includes the discharge mechanism and the adhesion mechanism, and the mask and the pattern forming object are not brought into contact with each other. Accordingly, in addition to the above-mentioned advantageous effects, since the mask is not brought into contact with the pattern forming object, it is possible to reduce the breaking of the mask and the wear of an emulsion so that the productivity of the device can be enhanced and a life time of the mask can be extended.

These features and advantageous of the invention will be apparent from the following more particular description of preferred embodiments of the invention, as illustrated in the accompanying drawings.

BRIEF DESCRIPTION OF THE DRAWINGS

FIG. 2 is a flowchart showing a flow of the treatment for forming a pattern using the pattern forming apparatus which mounts the discharge mechanism according to the embodiment 1 of the present invention;

FIG. 11 is an overall view of the process explaining a pattern forming state of a bus electrode wiring shown in a comparison example according to the embodiment 2 of the present invention;

DETAILED DESCRIPTION OF THE PREFERRED EMBODIMENTS

Figure 1:
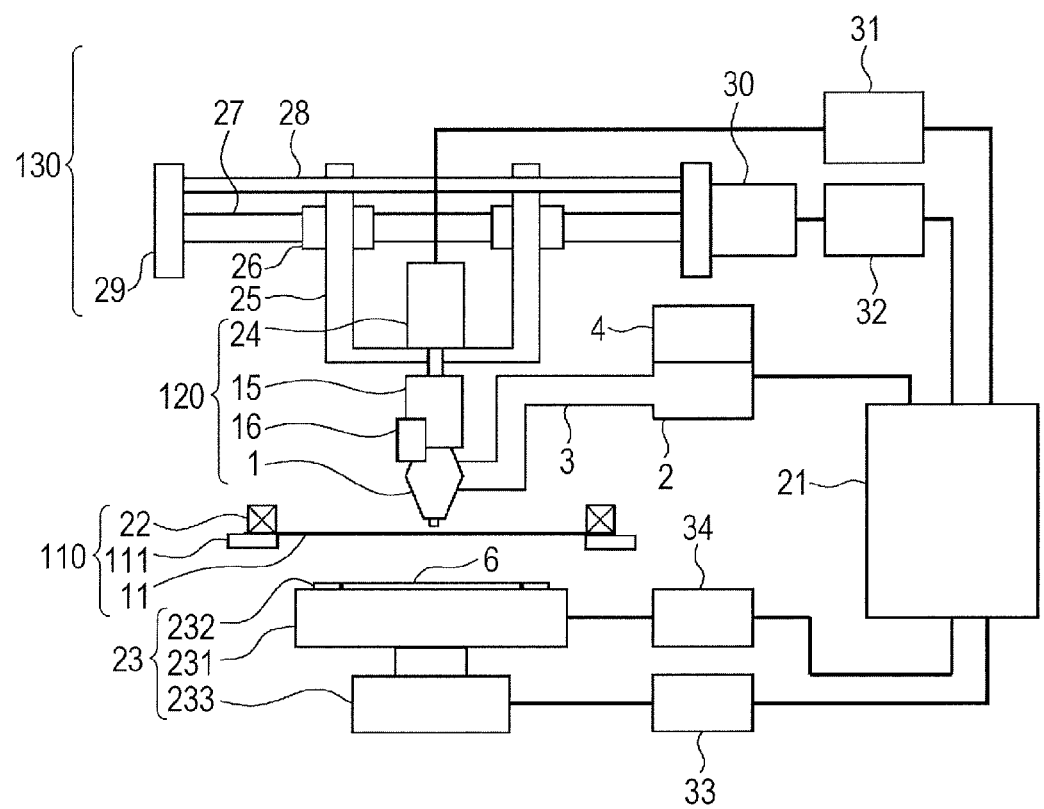
FIG. 1 is a block diagram showing the schematic constitution of a pattern forming apparatus which mounts a discharge mechanism part thereon according to an embodiment 1 of the present invention.

The present invention is directed to a pattern forming apparatus which, using a discharge mechanism part, transfers a paste to a predetermined position of a pattern forming object fixed to a table through a pattern forming mask having opening portions at predetermined positions, wherein, to realize the pattern forming which allows the stable forming of a fine pattern with high accuracy and allows the paste to be surely filled into fine through holes, a portion of a distal end portion of the discharge mechanism part which is brought into contact with the pattern forming mask is formed into a concave shape, and a surface of the distal end portion of the discharge mechanism part including the concave shaped portion is covered with a film having liquid repellency so that, in transferring the paste to a predetermined position of the pattern forming object by filling the paste into the pattern forming mask in which a desired pattern opening portion is formed, the rolling property of the paste is accelerated in a region formed by the concave shaped portion formed on the distal end portion of the discharge mechanism part which is covered with the film having liquid repellency and the pattern forming mask thus generating a region where a force which pushes the paste to a pattern forming mask side is generated whereby it is possible to form a fine pattern with high accuracy, and filling property of the paste to fine through holes is also accelerated.

The present invention will hereinafter be described by taking specific examples.

In the below-described embodiments, a description will be made after divided in plural sections or in plural embodiments if necessary for convenience's sake. These plural sections or embodiments are not independent of each other, but in a relation such that one is a modification example, details or complementary description of a part or whole of the other one unless otherwise specifically indicated.

In the below-described embodiments, when a reference is made to the number of elements (including the number, value, amount and range), the number is not limited to a specific number but can be greater than or less than the specific number unless otherwise specifically indicated or in the case it is principally apparent that the number is limited to the specific number.

In all the drawings for describing the below-described embodiments, members having like function will be identified by like reference numerals and overlapping descriptions will be omitted. The embodiments of the present invention will hereinafter be described specifically referring to drawings.

[Embodiment 1]

The constitution of a pattern forming apparatus 100 on which a discharge mechanism part 1 according to an embodiment 1 is mounted will be explained in conjunction with FIG. 1. FIG. 1 is a front view of the pattern forming apparatus 100 on which the discharge mechanism part 1 according to the embodiment 1 is mounted. In FIG. 1, for the sake of brevity, the description of a discharge portion 101 formed on a distal end of the discharge mechanism part 1, and a platform, side walls, support struts, supporting members and the like of the device are omitted.

The pattern forming apparatus 100 includes a pattern forming mask portion 110, a pattern-forming-object supporting table part 23, a discharge mechanism unit 120, a drive mechanism part of the discharge mechanism unit 130, a paste pressurizing mechanism 2, a paste introducing passage 3, a paste storage tank 4 and a control part 21.

The pattern forming mask portion 110 includes a pattern forming mask 11 which has pattern opening portions formed corresponding to a desired circuit pattern of a pattern forming object (object on which a pattern is to be formed) (for example, a printed circuit board) 6, a screen print frame 22 having a rectangular shape as viewed in a plan view which is held in a tension applied state using a tension mesh surrounding the pattern forming mask 11, and a support member 111 which supports the screen print frame 22. The pattern-forming-object supporting table part 23 includes a table 231 on which the pattern forming object 6 is mounted, a chuck portion 232 which fixes the pattern forming object 6 mounted on the table 231, and a vertical drive part 233 which drives the table 231 upwardly and downwardly. The discharge mechanism unit 120 includes the discharge mechanism part 1, a discharge mechanism part fixing jig 16, a discharge mechanism part head 15, and a pneumatic cylinder 24.

The pneumatic cylinder 24 is fixed to a support member 25 and drives the discharge mechanism unit 120 which is connected to the pneumatic cylinder 24 upwardly and downwardly. The support member 25 is supported on a bearing portion 26 which is engaged with a drive shaft 27. The drive shaft 27 is formed of a ball screw. The drive shaft 27 is rotationally driven by a motor 30 so that the bearing portion 26 engaged with the drive shaft 27 is moved in the lateral direction in the drawing by rotary driving the motor 30, and the discharge mechanism unit 120 is moved in the lateral direction in the drawing along a guide shaft 28. The drive shaft 27 and the guide shaft 28 are supported on a fixing plate 29.

The control part 21 controls operations of respective parts of the pattern forming apparatus 100. Firstly, a pneumatic cylinder drive part 31 which drives the pneumatic cylinder 24 is controlled in response to a control signal from the control part 21 so that the pneumatic cylinder 24 is driven. A driver part 32 of the motor 30 is controlled in response to a control signal from the control part 21 so that the motor 30 is rotated in the normal direction or in the reverse direction. Further, a chuck drive part 34 which drives the chuck portion 232 of the pattern-forming-object supporting table part 23 is controlled in response to a control signal from the control part 21 so that the open and close operation of the chuck portion 232 which fixes the pattern forming object 6 mounted on the table 231 is performed. Still further, the table drive part 33 which drives the vertical drive part 233 of the pattern-forming-object supporting table part 23 is controlled in response to a control signal from the control part 21 so that the table 231 is moved upwardly and downwardly.

The manner of operation of the pattern forming apparatus having the above-mentioned constitution will be explained in conjunction with a flowchart shown in FIG. 2.

Firstly, a pattern forming object 6 is conveyed using conveying means not shown in the drawing and is mounted on the pattern-forming-object supporting table part 23 (S201), and the pattern forming object 6 is fixed and held on the pattern-forming-object supporting table part 23 using the chuck portion 232. Next, the table 231 is elevated by driving the vertical drive part 233 using the table driver part 32 (S202) thus bringing the pattern forming object 6 into close contact with the pattern forming mask 11 of the pattern forming mask portion 110. Next, the pneumatic cylinder 24 is driven by the pneumatic cylinder drive part 31 so that the discharge mechanism part head 15 is lowered (S203) whereby the discharge portion 101 formed on a distal end of the discharge mechanism part 1 (see FIG. 3A) is brought into close contact with the pattern forming mask 11 (S204). At this time of the operation, the discharge mechanism unit 120 is positioned at a left end portion of FIG. 1.

Next, a paste in the discharge mechanism part 1 is pressurized and supplied by paste supply means not shown in the drawing (S205). While pressurizing and supplying the paste, the motor 30 is driven by controlling the driver part 32 so that the drive shaft 27 formed of a ball screw is rotated whereby the discharge mechanism unit 120 and the discharge mechanism part 1 mounted on a distal end of the discharge mechanism unit 120 are moved from left to right along the pattern forming mask 11 in a state where the discharge mechanism unit 120 and the discharge mechanism part 1 are pressed to the pattern forming mask 11. Accordingly, a pattern of the pattern forming mask 11 is formed on the pattern forming object 6 using the paste (S206). After the discharge mechanism part 1 is moved by a predetermined distance, the driver part 32 stops the driving of the motor 30 so that the movement of the discharge mechanism part 1 is stopped.

Next, the pneumatic cylinder 24 is driven by the pneumatic cylinder drive part 31 so that the discharge mechanism part head 15L is elevated (S207) whereby the discharge mechanism part 1 is separated from the pattern forming mask 11 by pulling. Next, the vertical drive part 233 is controlled by the table drive part 33 so that the table 231 is lowered (S208) whereby the pattern forming object 6 held by the chuck portion 232 is peeled off from the pattern forming mask 11 by pulling. When the table 231 reaches a lowering end, the operation of the table 231 by the vertical drive part 233 is stopped. The chuck drive part 34 is controlled so that the chuck portion 232 which holds the pattern forming object 6 is released, and the pattern forming object 6 is removed from the table 231 by handling means not shown in the drawing (S209). It is determined whether or not the pattern forming object 6 which has been taken out is the last pattern forming object 6 (S210). When it is determined that the object is the last pattern forming object 6 (YES), the processing is finished.

On the other hand, when a substrate to be processed next exists (NO), the process flow ranging from S201 is executed again. In this case, however, the discharge mechanism part head 15 is lowered in S203, and the same processing as the above-mentioned processing is performed using the discharge mechanism part 1 in S204, S206 and S207. Then, a pattern is formed by moving the discharge mechanism part 1 which is brought into close contact with the pattern forming mask 11 from right to left in FIG. 1.

When an area of a portion of the pattern forming object to be treated where a pattern is to be formed is larger than an area on which a pattern can be formed by operating the discharge mechanism part 1 once, the following operation is performed in place of taking out the pattern forming object from the table 231 in S209. That is, the table 213 is moved in the direction (X direction) perpendicular to a surface of paper on which FIG. 1 is drawn by a predetermined distance using a table moving mechanism not shown in the drawing. Next, the operations from S202 to S208 are executed. This processing is repeatedly executed until a pattern is formed over the whole surface of the portion of the pattern forming object where the pattern is to be formed.

Figure 3A:
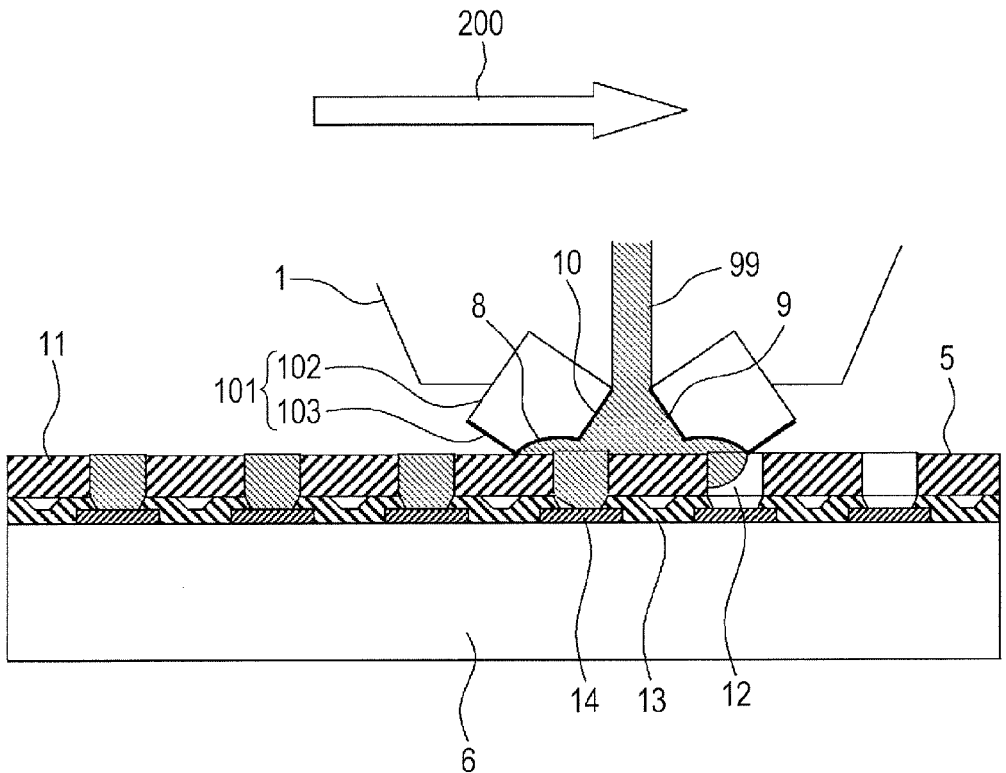
FIG. 3A is a side view of a discharge mechanism including a mask and a pattern forming object for showing the schematic constitution of the discharge mechanism of the embodiment 1 of the present invention.

The constitution of the discharge portion 101 formed on the distal end of the discharge mechanism part 1 according to the embodiment 1 will be explained in conjunction with FIG. 3A. FIG. 3A is a cross-sectional view simulating a state where a pattern is formed using the discharge portion 101 formed on the distal end of the discharge mechanism part 1 according to this embodiment 1. For the sake of brevity, the description of the discharge mechanism part fixing jig 16, the discharge mechanism part head 15 and the like which are provided for fixing the discharge mechanism part 1 to the pattern forming apparatus is omitted.

The discharge part 101 formed on the distal end of the discharge mechanism part 1 is formed of a polyurethane resin body 102, and a liquid-repellent film 103 is formed on a portion of the surface of the discharge portion 101 (mainly a portion which is brought into contact with the paste). A concave portion 8 having an arc-shape is formed on the discharge portion 101 formed on the distal end of the discharge mechanism part 1. In forming the pattern, a printing pressure is applied so as to bring the pattern forming mask 11 and the discharge portion 101 formed on the distal end of the discharge mechanism part 1 into close contact with each other. In such a state where the discharge portion 101 is pressed to the pattern forming mask surface 5, a paste 9 in a paste storing tank 4 is supplied under a pressurized state to an space formed between a pair of discharge portions 101 formed on the distal end of the discharge mechanism part 1 from a paste introducing passage 3 through a paste flow passage 99 formed in the discharge mechanism part 1. By operating (moving or scanning) the discharge mechanism unit 120 in the pattern forming direction 200 along the guide shaft 28 in the above-mentioned state, the paste 9 is filled into the pattern opening portions 12 formed in the pattern forming mask 11 and hence, a pattern can be formed on the pattern forming object 6.

In this embodiment, the pair of left and right discharge portions 101 is mounted on the discharge mechanism part 1 and hence, by moving the discharge mechanism part 1 only once in the direction indicated by an arrow 200 or in the direction opposite to the direction indicated by the arrow 200, a paste 9 supplied between the pair of left and right discharge parts 101 can be applied to the pattern forming mask surface 5 by coating so that the paste 9 is filled into the opening pattern portion 12 formed on the pattern forming mask 11 by either one of the discharge parts 101 whereby a pattern is formed on the pattern forming object 6. That is, the paste 9 is filled into the pattern opening portions 12 formed in the pattern forming mask 11 using the discharge portion 101 described on a left side of FIG. 3A when the discharge mechanism part 1 is moved in the direction indicated by the arrow 200, and the paste 9 is filled into the pattern opening portions 12 formed in the pattern forming mask 11 using the discharge portion 101 described on a right side of FIG. 3A when the discharge mechanism part 1 is moved in the direction opposite to the direction indicated by the arrow 200.

Figure 3B:
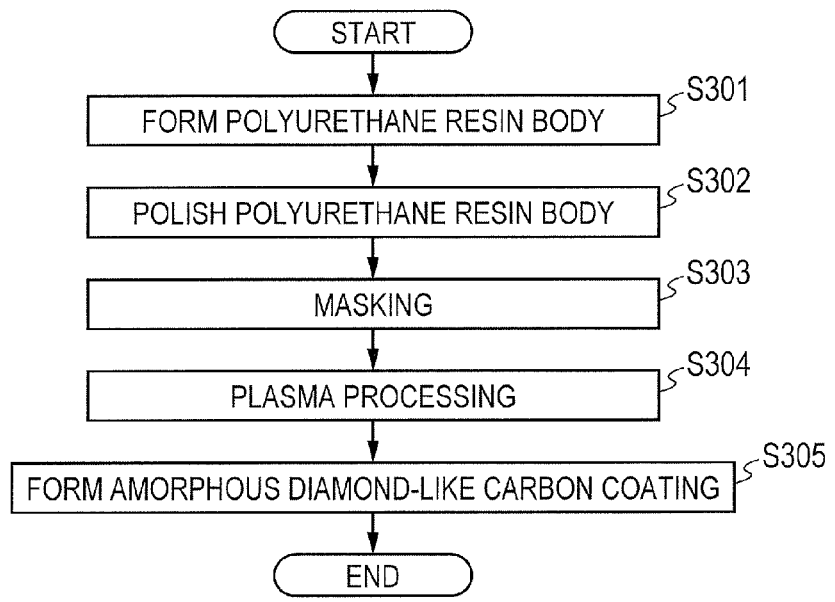
FIG. 3B is a flowchart showing a manufacturing method of a discharge part according to the embodiment 1 of the present invention.

One example of a method of manufacturing the discharge portion 101 formed on the distal end of the discharge mechanism part 1 according to this embodiment 1 will be explained in conjunction with a flowchart in FIG. 3B.

Firstly, as a provisional step, a structural body which constitutes a base of the discharge portion 101 formed on the distal end of the discharge mechanism part 1 is prepared.

Figure 3C:
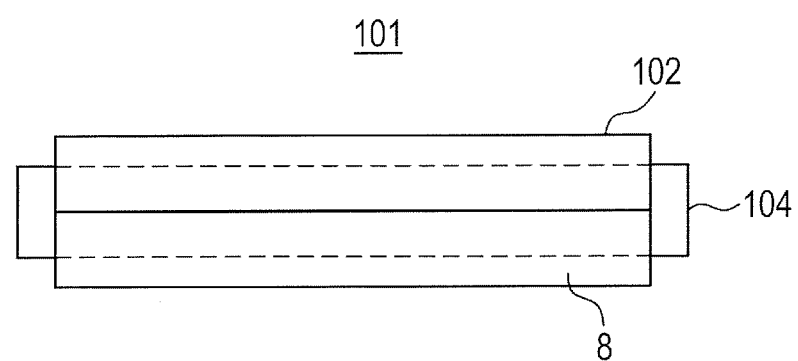
FIG. 3C is a front view of the discharge part according to the embodiment 1 of the present invention.
Figure 3D:
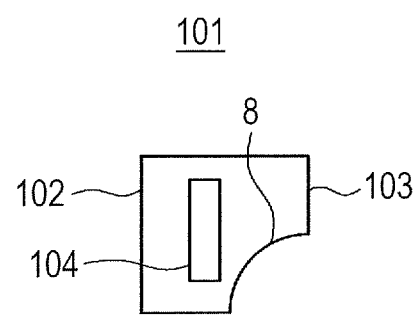
FIG. 3D is a side view of the discharge part according to the embodiment 1 of the present invention.

Using a mold having a predetermined size, a solution which becomes a raw material for forming the polyurethane resin body 102 in which a core member 104 (see FIG. 3C or FIG. 3D) is arranged is poured into the mold. The solution is heated in accordance with a proper temperature profile thus curing the polyurethane resin body 102. At a stage where the temperature of the polyurethane resin body 102 is lowered, the discharge mechanism part 1 is taken out from the mold so that the structural body of the discharge portion 101 where the polyurethane resin body 102 is formed around the core member 104 is formed (S301). In this manner, the polyurethane resin body 102 having hardness of 80 degree or more is formed.

Polishing is applied to polyurethane resin body 102 using a polisher so as to form the distal end of the discharge portion 101 into a predetermined shape (an arc-shaped concave portion 8) (S302). As a provisional step, polishing for forming the distal end of the discharge portion into a predetermined shape (an arc-shaped concave portion 8) in 101 is applied to both sides of the discharge portion 101 in pair.

Next, liquid-repellent treatment for forming a material having liquid repellency against a paste used for printing is applied to a surface of the distal end portion of the polyurethane resin body 102 which forms the discharge portion 101 including a portion to which polishing is applied. As one example of such treatment, a method which forms a hydrocarbon film will be explained.

The hydrocarbon film is formed by plasma processing. Firstly, masking is applied to the discharge portion 101 formed in a preceding step, and only portions where a hydrocarbon film is formed including polished portions of the distal end portion are exposed (S303).

A power source connection terminal (not shown in the drawing) is mounted on the core member 104 (see FIG. 3C or FIG. 3D) of the discharge portion 101, the discharge portion 101 is conveyed into the inside of a film forming device chamber not shown in the drawing as a material gas, and high frequency electric power is applied to the core member 104 of the discharge portion 101 through the power source connection terminals in a state where a carbon compound containing gas is introduced into the film forming device chamber (S304). Accordingly, plasma is generated in the film forming device chamber, and a diamond-like hydrocarbon film (diamond-like carbon film) 103 is formed on film forming portions of the polyurethane resin body 102 to which masking is not applied by plasma CVD. In this manner, the diamond-like carbon film 103 which constitutes a liquid-repellent film 103 is formed on a surface of the polyurethane resin body 102 of the discharge portion 101 formed on the distal end of the discharge mechanism part 1 (S305).

Through the above-mentioned steps, the discharge portion 101 is formed in such a manner that the concave portion 8 is formed on the distal end portion and a material having liquid repellency against a paste used for printing is formed on the surface including the concave portion 8.

Next, the constitution of the discharge mechanism unit 120 will be explained in conjunction with some specific examples.

Firstly, the first example of the structure of the discharge mechanism unit 120 will be explained in conjunction with FIG. 3A. The discharge mechanism unit 120 basically has the same structure in all specific examples explained hereinafter. The discharge portion 101 mounted on the distal end of the discharge mechanism part 1 is formed through the steps explained in conjunction with FIG. 3B. The arc-shaped concave portion 8 to which the water-repellent treatment is applied using a diamond-like carbon film 103 is formed at a corner of the polyurethane resin body 102 on a side where the polyurethane resin body 102 is brought into contact with the pattern forming mask 11. In FIG. 3A, the core member 104 is not shown.

In forming the pattern, the paste 9 passes through the paste passage 99 formed in the discharge mechanism part 1. Then, the paste 9 is brought into contact with a paste contact surface 10 having gone through water-repellent treatment in the ink carbon film 103 of the polyurethane resin body 102 which forms the discharge portion 101 mounted on the distal end of the discharge mechanism part 1. Thereafter, the paste 9 enters the pattern forming mask opening portions 12 formed in the pattern forming mask 11 so that the pattern forming mask opening portions 12 is filled with the paste 9. Further, the paste 9 rolls in a space defined by the arc-shaped concave portion 8 formed in the discharge mechanism part 1 and the surface 5 of the pattern forming mask 11 thus generating a force which presses the paste 9 to the surface 5 of the pattern forming mask 11. Accordingly, the pattern opening portion 12 is filled with the paste 9 until the paste 9 reaches the electrode pad 14 on the pattern forming object 6 through the pattern opening portions 12 of the pattern forming mask 11 formed in the pattern forming mask 11. Portions of the pattern forming object 6 are covered with a solder resist 13 except for the predetermined pattern opening portions corresponding to the electrode pads 14.

The phenomenon that the paste 9 rolls in the arc-shaped concave portion 8 formed on the surface of the polyurethane resin body 102 and reaches the electrode pad 14 on the pattern forming object 6 through the pattern opening portion 12 formed in the pattern forming mask will be explained in detail in conjunction with FIG. 4A and FIG. 4B. Here, the polyurethane resin body 102 forms the discharge portion 101 formed on the distal end of the discharge mechanism. In an actual operation, the paste 9 supplied in a pressurized state through the paste passage 99 is filled also in the discharge portion 101 formed on the distal end of the discharge mechanism part 1. However, to facilitate the explanation, only a portion of the paste 9 is described in the drawing. A state of the discharge portion 101 formed on the discharge mechanism part 1 on a left side will be explained by adding a subscript L. A state of the discharge portion 101 formed on the distal end of the discharge mechanism part 1 on a right side is substantially equal to the state on a left side.

Figure 4A:
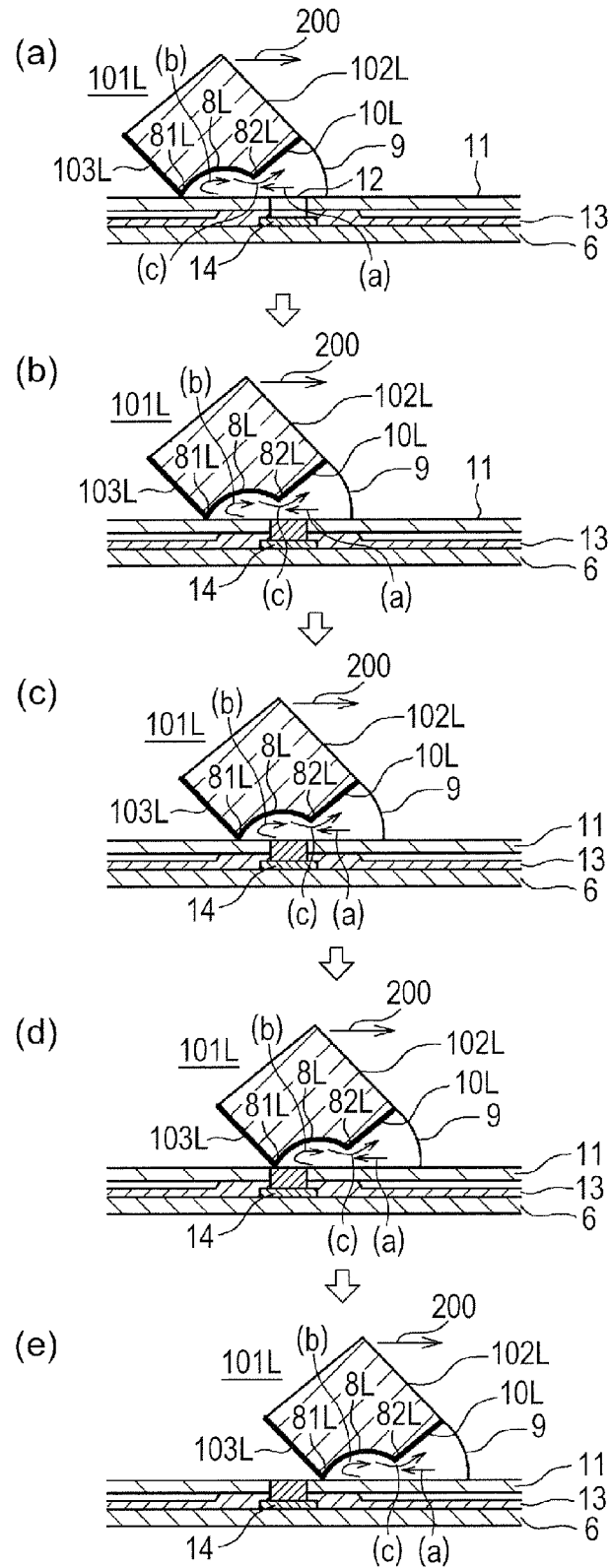
FIG. 4A is a view explaining the movement of the discharge mechanism part with respect to the mask and the state of flow of a paste in the distal end portion of the discharge mechanism part when the pattern is formed in the discharge mechanism according to the embodiment 1 of the present invention.

Firstly, in conjunction with FIG. 4A, the explanation is schematically made in a chronological order with respect to modes (a) to (e) where when the discharge mechanism part 1 is moved in the direction indicated by the arrow 200 while pressing the discharge mechanism part 1 to the pattern forming mask 11, the paste 9 is filled into a space over the electrode pad 14 on the pattern forming object 6 through the pattern opening portions 12 formed in the pattern forming mask 11 from the arc-shaped concave portion 8L of the surface of the distal end of the discharge portion 101L of the discharge mechanism part 1 on which the liquid-repellent film 103L is formed by arranging the states (a) to (e) in a chronological order.

(a) shows a state before the arc-shaped concave portion 8L of the surface of the discharge portion 101L formed on the distal end of the discharge mechanism part 1 on which the liquid-repellent film 103L is formed reaches the pattern opening portions 12 formed in the pattern forming mask 11. The discharge portion 101L is fixed to the discharge mechanism part 1 in a state where a corner portion 81L is brought into a pressure contact with the surface 5 of the pattern forming mask 11 and a gap is formed between another corner 82L of the arc-shaped concave portion 8L and the surface 5 of the pattern forming mask 11, and the tangential direction of the arc-shaped concave portion 8L in the vicinity of the corner portion 82L extends in the downward and rightward direction in a state shown in FIG. 4A. Accordingly, a space formed between the arc-shaped concave portion 8L and the surface 5 of the pattern forming mask 11 is formed into a bulged inner space where a distance of the inside of the inner space thereof is set larger than a distance of an inlet (outlet) for the paste 9 formed between the corner portion 82L and the surface 5.

When the discharge mechanism part 1 shown in (a) is moved in the direction indicated by an arrow 200 direction in a state where the corner portion 81L of the discharge portion 101L is brought into pressure contact with the surface 5 of the pattern forming mask 11, a paste 9 supplied to an area in front of the discharge mechanism part 1 in the advancing direction is moved in the same direction as the discharge mechanism part 1 by being pushed by a paste initial contact surface 10L of the discharge portion 101L formed on the distal end of the discharge mechanism part 1. A portion of the paste 9 which is moved in the same direction as the discharge mechanism part 1 enters the inside of the arc-shaped concave portion 8L through the gap G (see FIG. 4B) formed between the corner portion 82L formed on the distal end of the arc-shaped concave portion 8L of the discharge portion 101L having a surface on which a liquid-repellent film 103L is formed and projects toward a pattern forming mask 11 side and the pattern forming mask 11 ((a) in FIG. 4A and FIG. 4B). The paste 9 which enters the inside of the arc-shaped concave portion 8L impinges on the corner portion 81L of the discharge portion 101L which is brought into pressure contact with the surface 5 of the pattern forming mask 11 and leaks upwardly ((b) in FIG. 4A and (c) in FIG. 4B). The paste 9 which leaks upwardly is extruded toward a paste initial contact surface 10L side of the discharge portion 101L through the gap G along an upper surface of the arc-shaped concave portion 8L having the surface on which the liquid-repellent film 103 is formed ((c) in FIG. 4A(a)).

When the discharge mechanism part 1 further advances in the direction indicated by an arrow and the corner portion 82L formed on the distal end of the arc-shaped concave portion 8L of the discharge portion 101L reaches a position above the pattern opening portion 12 formed in the pattern forming mask 11 as shown in FIG. 4A(b), a portion of the paste 9 which is extruded to a paste initial contact surface 10L side of the discharge portion 101L through the gap G along the upper surface of the arc-shaped concave portion 8L having the surface on which the liquid-repellent film 103L is formed is pushed into the pattern opening portion 12 ((c) in FIG. 4A(b)).

When the discharge mechanism part 1 further advances in the direction indicated by an arrow, and the corner portion 82L formed on the distal end of the discharge portion 101L passes over the pattern opening portion 12, and the arc-shaped concave portion 8L reaches the position above the pattern opening portion 12, a force which pushes the paste 9 into the pattern opening portion 12 no more acts as shown in FIG. 4A(c). Accordingly, in the same manner as the state shown in FIG. 4A(a), the paste 9 which enters the inside of the arc-shaped concave portion 8L through the gap G formed between the corner portion 82L formed on the distal end of the arc-shaped concave portion 8L of the discharge portion 101L and the pattern forming mask 11 is pushed out to a paste initial contact surface 10L side of the discharge portion 101 through the gap G along the upper surface of the arc-shaped concave portion 8L having the surface on which the liquid-repellent film 103 is formed ((c) in FIG. 4A(c)).

The discharge mechanism part 1 further advances in the direction indicated by an arrow, and the corner portion 81L of the arc-shaped concave portion 8L of the discharge portion 101L pressed to the pattern forming mask 11 as shown in FIG. 4A(d) reaches the position above the pattern opening portion 12 formed in the pattern forming mask 11. Here, a portion of the paste which impinges on the corner portion 81L in the arc-shaped concave portion 8L having the surface on which the liquid-repellent film 103L is formed is pushed into the pattern opening portion 12 formed in the pattern forming mask, and a remaining portion of the paste 9 leaks upwardly ((b) in FIG. 4A(d)) and is pushed out to the paste initial contact surface 10L of the discharge portion 101 through the gap G along the upper surface of the arc-shaped concave portion 8L ((c) in FIG. 4A(d)).

When the discharge mechanism part 1 further advances in the direction indicated by an arrow and the corner portion 81L of the arc-shaped concave portion 8L of the discharge portion 101L passes over the pattern opening portion 12 formed in the pattern forming mask 11 as shown in FIG. 4A(e), the pattern forming using the pattern opening portion 12 is finished.

In this manner, with the use of the discharge portion 101L on which the arc-shaped concave portion 8L is formed, the paste 9 is pushed into the pattern opening portion 12 formed in the pattern forming mask 11 twice, that is, in a state shown in FIG. 4A(b) and in a state shown in FIG. 4A(d) and hence, the pattern opening portion 12 is surely filled with the paste 9.

Figure 4B:
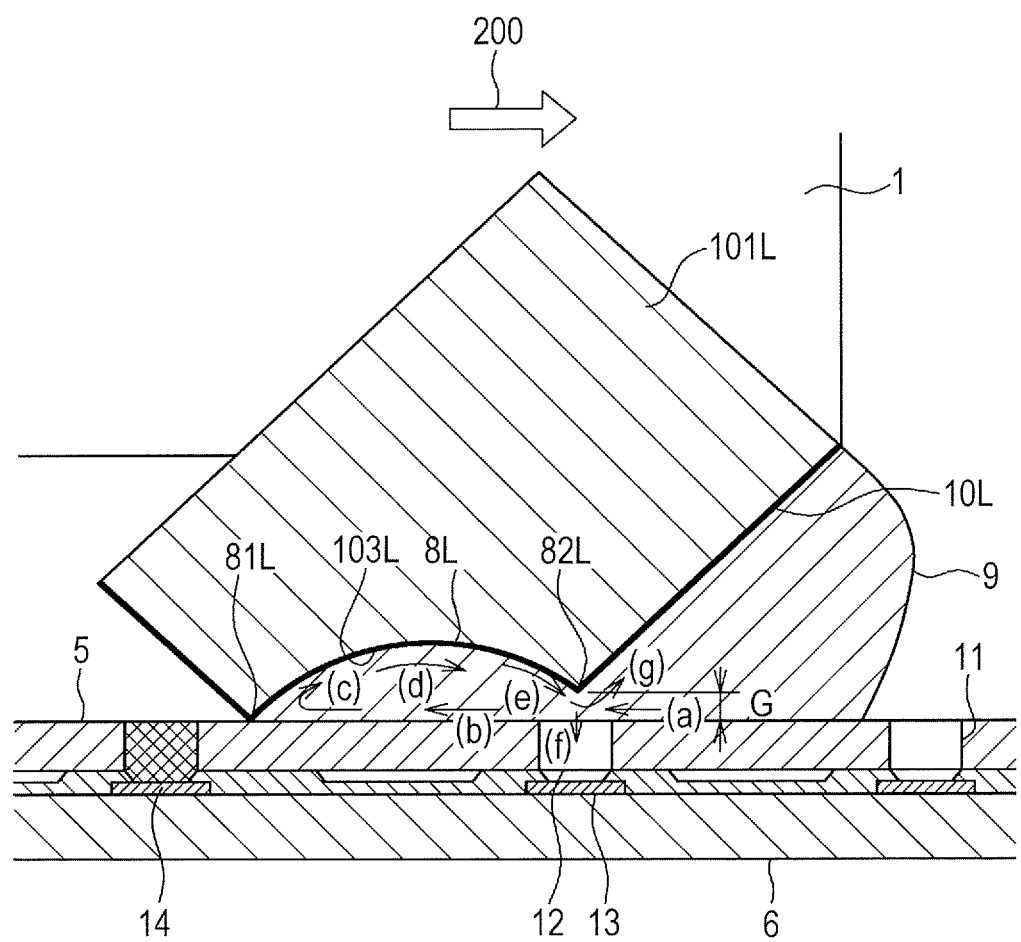
FIG. 4B is a view explaining the state of the flow of the paste in the distal end portion of the discharge mechanism part when the pattern is formed in the discharge mechanism according to the embodiment 1 of the present invention.

Here, a state where the paste 9 rolls in the arc-shaped concave portion 8L having the surface on which the liquid-repellent film 103L is formed and a portion of the paste is pushed into the inside of the pattern opening portion 12 formed in the pattern forming mask 11 as shown in FIG. 4A(b) is further explained in conjunction with FIG. 4B.

In FIG. 4B, a change in position of the paste 9 relative to the discharge mechanism part 1L in the arc-shaped concave portion 8L of the discharge portion 101 formed on the distal end of the discharge mechanism part 1 having the surface on which the liquid-repellent film 103 is formed is indicated by arrows. Symbols (a) to (g) affixed to the arrows indicating the movement of the paste 9 in FIG. 4B are not directly relevant to symbols (a) to (e) described in FIG. 4A.

When the discharge mechanism part 1 is driven by the discharge mechanism part drive mechanism 130 so that the discharge mechanism part 1 advances in the direction indicated by an arrow 200 in a state where the edge portion 81L formed on a lower end of the discharge portion 101L formed on the distal end of the discharge mechanism part 1 is pressed to the surface 5 of the pattern forming mask 11, a paste 9 supplied to an area in front of the discharge portion 101L enters the inside of the space formed between the arc-shaped concave portion 8L having the surface on which the liquid-repellent film 103L is formed and the surface 5 of the pattern forming mask 11 through the gap G formed between the edge portion 82L of the arc-shaped concave portion 8L formed on the discharge portion 101L on a side opposite to a side which is brought into contact with the pattern forming mask 11 and the pattern forming mask 11 from the position (a).

The paste 9 which has already existed at the position (b) at this point of time is pushed to an edge portion 81L side of the arc-shaped concave portion 8L in the direction indicated by the arrow. Since the edge portion 81L is brought into contact with the surface 5 of the pattern forming mask 11, the paste 9 which reaches the end portion 81L is pushed upwardly (c) and, thereafter, the paste 9 is pushed back in the direction (d) opposite to the direction indicated by the arrow (b).

Accordingly, the paste 9 which has already existed at positions (c) and (d) is further pushed back in the opposite direction from the position (d) along the liquid-repellent film 103 formed on the wall surface of the arc-shaped concave portion 8L, and is pushed out by receiving a downward force along the tangential direction of the edge portion 82L. The paste 9 is further pushed out by receiving the downward force at a distal end portion of the edge portion 82L whose tangential direction extends downwardly toward a right side in FIG. 4B, and a portion of the paste 9 is pushed into the inside of the opening portion 12 formed in the pattern forming mask 11 (f) so that the inside of the opening portion 12 is filled with the paste 9 and the paste 9 is connected with the electrode pad 14 formed on the pattern forming object 6.

The paste 9 which cannot enter the opening portion 12 is discharged from the gap G formed between the end portion 82L and the pattern forming mask 11 to a paste initial contact surface 10L side of the discharge portion 101L (e). That is, the paste 9 which enters the inside of the arc-shaped concave portion 8L rolls in the arc-shaped concave portion 8L and is discharged to the outside of the arc-shaped concave portion 8L again.

In this manner, when the discharge mechanism part 1 advances in the direction indicated by the arrow 200, the paste 9 which enters the inside of the arc-shaped concave portion 8L from the gap G formed between the end portion 82L of the arc-shaped concave portion 8L formed in the discharge portion 101L and the surface 5 of the pattern forming mask 11 rolls in the arc-shaped concave portion 8L having the surface on which a liquid-repellent film 103L is formed and is discharged to the outside of the arc-shaped concave portion 8L from the gap G formed between the end portion 82L and the surface 5 of the pattern forming mask 11. At this point of time, a portion of the discharged paste 9 is pushed into the inside of the opening portion 12 formed in the pattern forming mask 11 and hence, the inside of the opening portion 12 is surely filled with the paste 9.

The pattern forming mask portion 110 used for forming a pattern is of a combination mesh type in which a metal plate 11 is arranged in a space within the pattern forming mask screen print frame 22 and the metal plate 11 is supported on the pattern forming mask screen print frame 22 in a tension state by way of a tension mesh (not shown in the drawing) which is mounted between the metal plate 11 and the pattern forming mask screen plate frame 22 around the whole periphery of the screen plate frame 22.

In the pattern forming mask portion 110, openings 12 having a predetermined pattern are formed on the metal plate 11 within a pattern forming effective region corresponding to an area where the discharge mechanism part 1 moves above the metal plate 11 so that the pattern forming mask portion 110 is used as a screen print making for forming a pattern.

For verifying the effect brought about by the shape and the surface treatment of the discharge portion 101 mounted on the pattern forming device 100 according to the embodiment 1, the discharge portion 101 according to the embodiment 1 is compared with a comparison example. The result of the comparison will be explained in conjunction with FIG. 5. The discharge mechanism part 1 is perpendicularly mounted on the discharge mechanism part head 15 (see FIG. 1).

In the discharge portion 101 used for the verification experiment, an arc-shaped concave portion 8L is formed on the corner portion 81L formed on the side which is brought into contact with the pattern forming mask 11 as shown in FIG. 5(a). The arc-shaped concave portion 8L is formed such that, when the corner portion 81L is brought into contact with the pattern forming mask 11 in a state where the discharge mechanism part 1 is mounted on the discharge mechanism part head 15, a gap G (see FIG. 4B) is formed between the other end 82L of the arc-shaped concave portion 8L which projects toward a pattern forming mask 11 side and the surface 5 of the pattern forming mask 11.

As a paste used in the verification experiment of the embodiment 1, (A): LF-204-15(made by TAMURA Corporation, particle size of the solder particle: 1 to 12 µm) and (B): M705-BPS7-T1J (made by Senju Metal Industry, particle size of the solder particle: 1 to 6 µm) are used. By using a discharge mechanism part formed of a resin containing urethane as a main component, pattern forming is performed using a pattern forming mask which is formed by forming pattern opening portions 12 having a diameter of 50 µm to 200 µm in a metal plate having a thickness of 70 µm as the pattern forming mask 11.

As the discharge portion 101L formed on the distal end of the discharge mechanism part 1 used in the verification experiment, the discharge portion 101L prepared by this embodiment having a surface on which a liquid-repellent film 103 is formed for giving liquid repellency to the discharge portion 101L, and a discharge portion of a comparison example having a surface on which a liquid-repellent film is not formed and to which the liquid-repellent treatment is not applied (not shown in the drawing) are prepared, wherein these discharge portions have the same shape. Then, these discharge portions are subjected to comparison analysis.

In the pattern opening portion 12 (see FIG. 4B), a value (4H/D) obtained by dividing an area of a wall surface of the pattern opening portion 12 where a diameter of the opening portion 12 is set to D and a depth of the opening portion 12 is set to H ($\pi$DH) by an area of the pattern opening portion ($\pi D^2/4$) constitutes a pattern forming difficulty index. That is, it is aimed that the paste can be favorably transferred when the pattern forming difficulty index is 2.8 or more.

As a result of experiment, in a case where the above-mentioned (A) is used as the paste, when the gap G between the distal end portion 82L of the discharge mechanism portion on the side which is not brought into contact with the pattern forming mask 11 and the surface 5 of the pattern forming mask 11 is set to 0.12 mm or less, a paste 9 is prevented from flowing in the arc-shaped concave portion 8L formed on the discharge portion 101L and hence, an amount of paste transferred to the pattern forming object 6 is decreased. This phenomenon appears more conspicuously in the case where the pattern forming is performed by the discharge portion to which no liquid repellent treatment is applied.

Further, in a case where the above-mentioned (B) is used as the paste, when the gap G between the distal end portion 82L of the discharge mechanism portion on the side which is not brought into contact with the pattern forming mask 11 and the surface 5 of the pattern forming mask 11 is set to 0.06 mm or less, the paste 9 is prevented from flowing in the arc-shaped concave portion 8L formed on the discharge portion 101L and hence, an amount of paste transferred to the pattern forming object 6 is decreased. This phenomenon also appears more conspicuously in the case where the pattern forming is performed by the discharge portion to which no liquid-repellent treatment is given.

On the other hand, when the gap G between the distal end portion 82L of the discharge portion 101L on the side which is not brought into contact with the pattern forming mask 11 and the surface 5 of the pattern forming mask 11 is set larger than 1 mm, at the timing of forming the pattern, a paste 9 cannot be confined in a space formed by the arc-shaped concave portion 8L formed on the discharge portion 101L and the surface 5 of the pattern forming mask 11 and hence, the paste 9 leaks from the inside of the arc-shaped concave portion 8L. Accordingly, a downward force applied to the paste 9 to be filled into the pattern opening portion 12 of the pattern forming mask 11 is weakened and hence, a sufficient filling amount of paste 9 and a sufficient transfer amount of the paste 9 cannot be obtained. This phenomenon also appears more conspicuously in the case where the pattern forming is performed by the discharge portion to which no liquid-repellent treatment is applied.

However, the gap G is set to 1 mm depending on a shape of the arc-shaped concave portion 8 formed on the distal end of the discharge portion 101L. Accordingly, although the gap is limited to 1 mm in the case of the discharge portion 101 used in the experiment, even when the gap G is set to 1 mm or larger, provided that a space which can confine a portion of a paste 9 in the arc-shaped concave portion 8 is formed such that the tangential direction of the distal end portion 82 of the arc-shaped concave portion 8 is directed in the direction toward the surface 5 of the pattern forming mask 5 (the case where the tangential direction of the distal end portion 82L extends downwardly and rightwardly in FIG. 5(a)), a paste can be confined in the arc-shaped concave portion 8 and hence, the pattern opening portion can be sufficiently filled with the paste and the transfer can be sufficiently performed.

From the result of this experiment, it is understood that, in a state that one edge portion 81L of the arc-shaped concave portion 8 formed on the distal end of the discharge portion 101L is brought into contact with the surface 5 of the pattern forming mask 11, it is necessary that the gap G between the other end portion 82L of the arc-shaped concave portion 8L and the surface 5 of the pattern forming mask 11 is set to a value ten times as large as an average particle size of the paste to be used. The other end portion 82L of the arc-shaped concave portion 8 formed on the distal end of the discharge mechanism part means the distal end portion 82L of the arc-shaped concave portion 8L formed into an arc-shaped concave shape which is formed on the distal end of the discharge portion 101L, the distal end portion 82L not being brought into contact with the surface 5 of the pattern forming mask 11.

In any one of cases, a transfer amount of paste in the discharge portion 101L prepared by this embodiment to which liquid repellency is given is larger than a transfer amount of paste in the discharge portion to which no liquid-repellent treatment is applied. This is because the surface of the arc-shaped concave portion 8L formed on the distal end of the discharge portion 101L has liquid repellency so that rolling of the paste 9 is not impaired whereby the viscosity of the paste 9 can be held at a low level.

The above-mentioned explanation is also applicable to the discharge portion 101R when the discharge mechanism part 1 advances in the direction opposite to the direction indicated by an arrow 200.

As comparison examples, a pattern forming experiment where a discharge portion 101L' in which curved surface forming is not applied to a distal end of the discharge portion is used as shown in FIG. 5(b) and, a pattern forming experiment where a discharge portion 101L' in which linear oblique polishing is applied to a distal end of the discharge portion is used as shown in FIG. 5(c) are performed. Also in this case, a comparison analysis is performed by using the discharge portion to which the liquid repellency is given and the discharge portion to which liquid-repellent treatment is not applied. In this case, both discharge portions have the same shape.

As a result, when the discharge portion 101L' shown in FIG. 5(b) where curved surface forming not is applied to the distal end portion of the discharge portion 101L' is used, favorable pattern cannot be formed unless a diameter of the opening portion 12 of the pattern is 150 µm or larger. When the liquid repellency is given to the discharge portion 101L', slipping property of the paste 9 on a back surface of the discharge portion is increased and hence, a paste filling amount in the opening portion 12 of the pattern forming mask 11 is lowered and hence, the pattern forming property is decreased compared to the case where the discharge portion 101L' to which liquid repellency is not applied. Accordingly, a favorable pattern cannot be formed unless the diameter of the opening portion 12 of the pattern is 180 µm or larger.

When the discharge portion 101L' having a distal end portion to which a linear oblique polishing is applied as shown in FIG. 5(c) is used, favorable pattern forming cannot be performed unless a diameter of the opening portion 12 of the pattern is 120 µm or larger. On the other hand, although the slipping property of the paste 9 on the surface of the discharge portion 101L" is increased when liquid repellency is given to the discharge portion 101L', a favorable filling amount of the paste 9 into the opening portion 12 of the pattern forming mask 11 can be obtained and hence, pattern forming property substantially equal to pattern forming property of the discharge mechanism part to which no liquid repellency is not given can be obtained. However, favorable pattern forming cannot be performed unless a diameter of the opening portion 12 is 120 µm or more.

On the other hand, as shown in FIG. 5(d), when pattern forming is performed using a discharge portion 101L''' having a concave portion formed of a plurality of surfaces, a substantially similar result as in the case where the pattern is formed using the discharge portion 101 having an arc-shaped concave shaped cross section according to this embodiment shown in FIG. 5(a) can be obtained and hence, all patterns formed using pattern opening portions 12 having diameters of 50 µm to 200 µm formed in the pattern forming mask 11 can be favorably transferred on the pattern forming object 6. Also in this case, a transfer amount is larger and the irregularity in transfer amount is smaller in the case using the discharge portion 101L''' to which the liquid repellency is added than in the case using the discharge portion 101L''' to which no liquid-repellent treatment is applied and hence, favorable pattern forming is obtained.

In this manner, by mounting the discharge mechanism part 1 provided with the discharge portion 101 explained in the embodiment 1 on the pattern forming device 100, irrespective of a size of an opening area of the opening portion 12 of the pattern forming mask 11, a pattern can be formed using the paste 9 in a stable manner with high accuracy. For this purpose, it is necessary to form the distal end portion of the discharge portion 101 into a particular shape where a downward force is applied to the paste 9 in the direction toward the pattern opening portions 12 and to add the liquid repellency to at least the distal end portion of the discharge portion 101 with which the paste 9 is brought into contact including the portion which is formed into the particular shape.

Due to such a constitution, in filling a paste into the pattern opening portion 12 of the pattern forming mask 11 having a desired opening portion and in transferring the paste 9 onto the pattern forming object 6, the rolling of the paste 9 in a space formed by a portion of the distal end portion of the discharge portion 101 which is formed into a particular shape and the pattern forming object 6 is accelerated and the filling property of the paste 9 into the pattern opening portion 12 of the pattern forming mask 11 is accelerated, and a force by which the paste 9 is filled into the opening portion 12 of the pattern forming mask 11 in the substantially vertical direction can be applied to the paste 9.

In the example explained above, the example where a diamond-like carbon film 103 is formed by a plasma CVD as the liquid-repellent film 103 formed on the surface of the discharge portion 101 is explained. However, the present embodiment is not limited to this constitution, and in place of the diamond-like carbon film 103, for example, $SiO_2$ or a fluororesin film may be formed on the surface of the discharge portion 101.

Firstly, a case where an $SiO_2$ film is formed as the liquid-repellent film 103 on the surface of the discharge portion 101 will be explained.

Alkoxysilane containing solution is applied to at least a portion of the discharge portion 101 to which the paste 9 is applied by spraying. Thereafter, the alkoxysilane containing solution is dried so that the $SiO_2$ film having the liquid repellency is formed on a surface of the discharge portion 101.

The film made from the alkoxysilane used in this case is not contaminated by various solvents contained in the paste 9, is stable and is excellent in liquid repellency against water or solvents.

Here, spraying is used as a film making method. However, alkoxysilane containing solution may be applied by aerosol deposition or dipping and the solution is dried thus forming the liquid-repellent film 103.

In this manner, it is possible to prepare the discharge mechanism part 1 of this embodiment 1 having the liquid-repellent film 103 made of $SiO_2$ which is formed on at least the portion with which the paste 9 is brought into contact at the time of printing.

Next, a case where fluororesin film is formed as the liquid-repellent film 103 formed on the surface of the discharge mechanism part 1 will be explained. A copolymer (PFA) of tetrafluoroethylene and perfluoro alkoxy ethylene is mixed into a polyurethane resin and is applied at least to a portion of the discharge portion 101 with which the paste 9 is brought into contact by spraying. Thereafter, the polyurethane resin is cured by heating in accordance with a similar temperature profile as a temperature profile used for curing the discharge mechanism part, a film in which the copolymer (PFA) of tetrafluoroethylene and perfluoro alkoxy ethylene having the liquid repellency is uniformly dispersed all over can be formed on the surface of the discharge portion 101 formed on the distal end the discharge mechanism part 1.

As a fluororesin having the liquid repellency, PTFE, FEP, ETFE and the like can be named in addition to PFA. However, as a film having excellent organic solvent resistance, a large contact angle and a small friction coefficient, the film made of a copolymer (PFA) of tetrafluoroethylene and perfluoro alkoxy ethylene is considered as the most favorable film.

As a method for forming a film including a copolymer of tetrafluoroethylene and perfluoro alkoxy ethylene, the liquid-repellent film 103 is formed by mixing a copolymer into the polyurethane resin, applying the mixture by spraying and curing the film by heating. However, the liquid-repellent film 103 can be formed by applying the mixture of the copolymer and the polyurethane resin by dipping and performing curing thereafter.

In this manner, obtained is the discharge portion 101 where the liquid-repellent film 103 in which the copolymer of tetrafluoroethylene and perfluoro alkoxy ethylene is dispersed is formed on at least a portion of the discharge portion 101 with which the paste 9 is brought into contact can be formed.

The result of verification of the pattern forming state using the above-mentioned discharge portion 101 having the SiO$_2$ or fluororesin film formed on the surface thereof is substantially similar to the result of verification of the pattern forming state using the discharge portion 101 having the diamond-like carbon film formed on the surface thereof as the liquid-repellent film 103 explained above.

In this manner, in the pattern forming device on which the discharge portion 101 using the SiO$_2$ or fluororesin film as the liquid-repellent film 103 is mounted, irrespective of a size of an opening area of the opening portion 12 of the pattern forming mask 11, a pattern can be formed using the paste 9 in a stable manner with high accuracy. For this purpose, the discharge portion 101 formed on the distal end of the discharge mechanism part 1 is formed into a particular shape explained in FIG. 4A, FIG. 4B and FIG. 5($a$) and FIG. 5($d$) and the liquid repellency is given to the discharge portion 101 formed on at least the distal end of the discharge mechanism part 1 with which the paste 9 is brought into contact. Accordingly, in filling a paste into the opening portion 12 of the pattern forming mask 11 having desired opening portions and in transferring the paste to a pattern forming object, the rolling of the paste is accelerated, the filling property of the paste 9 into the pattern opening portion 12 of the pattern forming mask 11 is accelerated, and a force by which the paste 9 is filled into the opening portion 12 of the pattern forming mask 11 in the substantially vertical direction can be applied to the paste.

Next, a case where a mesh mask is used as the pattern forming mask 11 will be explained.

Figure 6A:
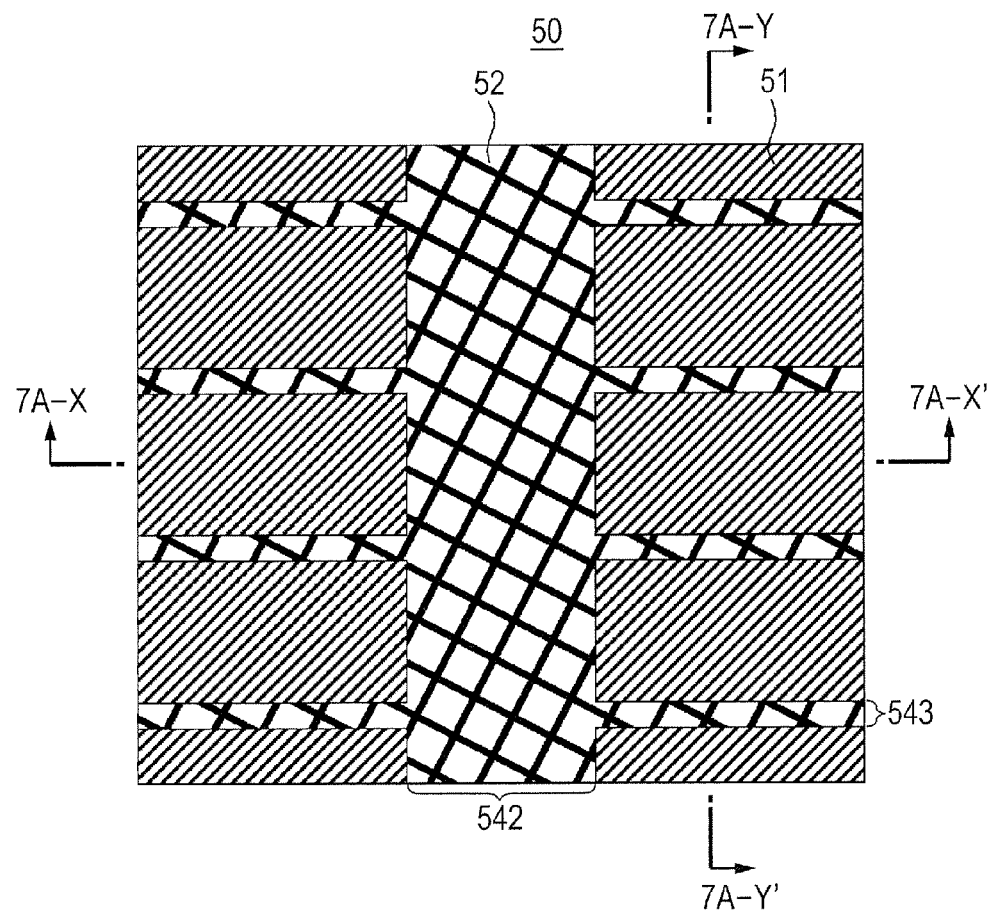
FIG. 6A is a locally enlarged schematic plan view of a pattern forming mask as viewed from a pattern forming object side according to the embodiment 1 of the present invention.

In this example, a metal mesh mask 50 shown in FIG. 6A is used as the pattern forming mask 11. As a metal mesh 52, a #325 plain weave using a high strength wire rod having a rod diameter of 16 μm and a mesh thickness of 35 μm is used. Pattern opening portions 542, 543 having diameters of 50 μm to 200 μm are formed on the metal mesh 52 using an emulsion 51 having a thickness of 35 μm and a thickness of 55 μm so that the metal mesh mask 50 shown in FIG. 6A is formed and the metal mesh mask 50 (described merely as mesh mask hereinafter) is used.

To perform separation of the metal mesh mask 50 from the pattern forming object 6 using mesh tension, the tension of the pattern forming mask is set to 0.2 mm or less (measured using tension gauge STG-80NA made by Protec Co., Ltd.).

In this example, it is necessary that the metal mesh 52 used in the metal mesh mask 50 used as the pattern forming mask 11 has an aperture of 40% or more and the diameter of the rod used in the metal mesh 52 is smaller than a half of the opening width of the metal mesh 52.

Figure 6B:
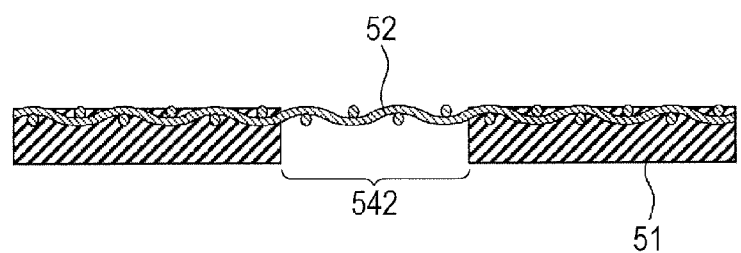
FIG. 6B is a cross-sectional view of the pattern forming mask in FIG. 6A taken along a line 7A-X-7A-X'.
Figure 6C:
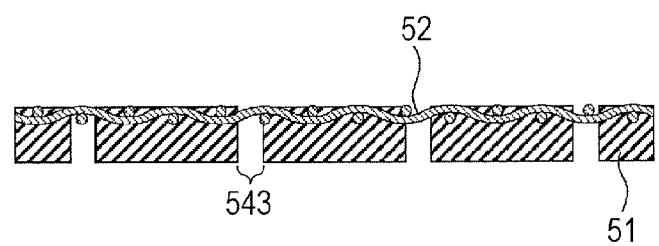
FIG. 6C is a cross-sectional view of the pattern forming mask in FIG. 6A taken along a line 7A-Y-7A-Y'.

In a pattern opening portion 542 (see FIG. 6B) or a pattern opening portion 543 (see FIG. 6C) formed in the metal mesh mask 50, assuming the pattern opening portion 542 or 543 as a circular opening pattern whose diameter has the same size as a width of the pattern opening portion 542 or 543, a value (4H/D) obtained by dividing an area of a wall surface of the circular pattern opening ($\pi$DH) by an area of the pattern opening portion ($\pi$D$^2$/4) constitutes a pattern forming difficulty index. That is, in this embodiment, it is aimed that the paste 9 can be favorably transferred when the pattern forming difficulty index is 2.8 or larger.

Figure 7A:
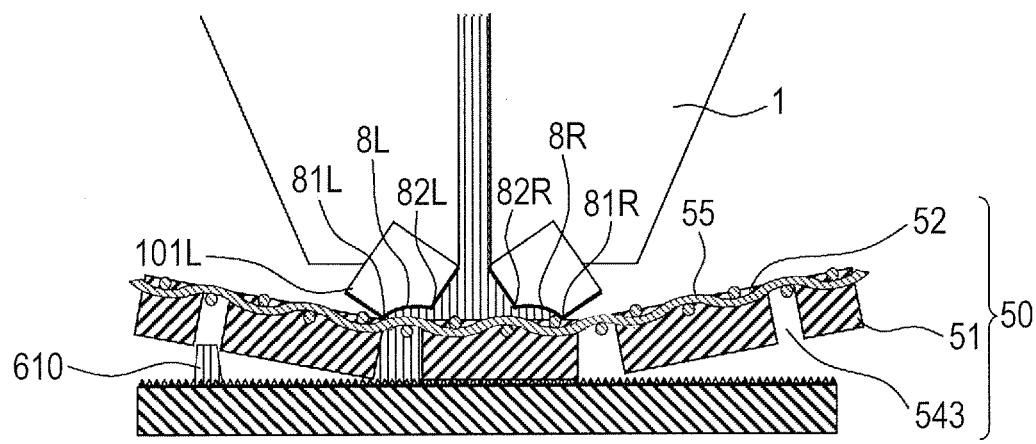
FIG. 7A is a side view of the discharge mechanism including the mask and the pattern forming object for explaining the pattern forming state using the portion shown by the cross-section of the pattern forming mask shown in FIG. 6C taken along the line 7A-Y-7A-Y' according to the embodiment 1 of the present invention.

When the metal mesh mask 50 is used as the pattern forming mask 11, as shown in FIG. 7A, a gap is formed between the metal mesh mask 50 and the pattern forming object 6 and hence, unlike the contact pattern forming using the pattern forming mask 11 used in the case shown in FIG. 3A, in a state where one end portion 81L of the arc-shaped concave portion 8 formed on the distal end of the discharge portion 101 is brought into contact with the surface 5 of the pattern forming mask 11, the metal mesh mask 50 assumes not a horizontal state but an inclined state. However, since an arc-shaped concave portion 8L of the discharge portion 101L and an arc-shaped concave portion 8R of the discharge portion 101R where the end portions 81L and 81R thereof are brought into contact with the metal mesh mask 50 are present on both sides of the discharge mechanism part 1, a gap G (see FIG. 4B) between the other end 82L of the arc-shaped concave portion 8L and the other end 82R of the arc-shaped concave portion 8R and the surface 55 of the metal mesh mask 50 can be held uniform.

Figure 7B:
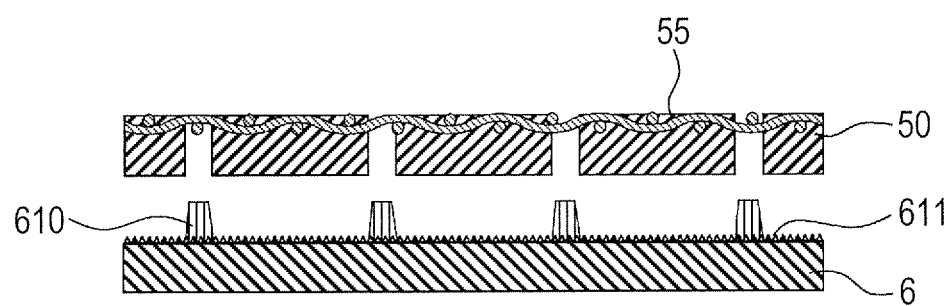
FIG. 7B is a side view of the mask and the pattern forming object explaining a pattern forming state using the portion shown by the cross-section of the pattern forming mask shown in FIG. 6C taken along the line 7A-Y-7A-Y' according to the embodiment 1 of the present invention.

As a result, the discharge mechanism part 1 includes the discharge portion 101L having the arc-shaped concave portion 8L formed therein and the discharge portion 101R having the arc-shaped concave portion 8R formed therein to which make a pair and hence, even when the metal mesh mask 50 is used as the pattern forming mask 11, as shown in FIG. 7B, a favorable pattern 610 can be formed on the pattern forming object 6.

It is necessary that a size of the gap G formed between the other end 82L of the arc-shaped concave portion 8L and the surface 55 of the metal mesh mask 50 and a size of the gap G formed between the other end 82R of the arc-shaped concave portion 8R and the surface 55 of the metal mesh mask 50 (see FIG. 4B) are set to a size ten times as large as the average particle size of the paste to be used or larger.

A particle size of a solder particle of the paste 9 to be used when the metal mesh mask 50 is used is set to 12 μm or smaller in the same manner as the previously explained contact pattern forming using the pattern forming mask 11. Accordingly, the gap G between the discharge portion 101 formed on the distal end of the discharge mechanism part 1 on the side which is not brought into contact with the mesh mask and the surface 5 of the pattern forming mask 11 is set to 0.6 mm.

In a case where (A) LF-204-15 is used as a paste, when the gap between the distal end portion 82L (R) of the discharge portion 101L (R) on the side which is not brought into contact with the metal mesh mask 50 and the metal mesh mask 50 is set smaller than 0.12 mm, the paste 9 is prevented from flowing in the arc-shaped concave portion 8L (R) formed on the distal end of the discharge portion 101L (R) so that the transfer amount of the paste is decreased.

When (B) M705-BPS7-T1J is used as the paste, when the gap G between the distal end portion 82L (R) of the discharge portion 101L (R) on the side which is not brought into contact with the metal mesh mask 50 and the metal mesh mask 50 is set smaller than 0.06 mm, the paste is prevented from flowing into the arc-shaped concave portion 8L (R) formed in the discharge portion 101L (R) so that the transfer amount of the paste is decreased.

On the other hand, when the gap G between the discharge portion 101L (R) on the side which is not brought into contact with the metal mesh mask 50 and the surface 55 of the metal mesh mask 50 is set larger than 1 mm, in forming the pattern, the paste cannot be confined in the arc-shaped concave portion 8L (R) formed in the discharge portion 101L (R) and hence, the paste leaks from the inside of the arc-shaped concave portion 8L (R). Accordingly, since a force applied to the paste to be filled into the pattern opening portions 542 and 543 of the metal mesh mask 50 is weakened, a sufficient filling amount and a sufficient transfer amount of the paste 9 cannot be obtained.

The gap G is set to 1 mm due to the shape of the arc-shaped concave portion 8L (R) formed on the distal end of the discharge portion 101L (R), and the 1 mm is the limit in the case of the discharge portion 101 L (R) used in the experiment. However, even when the gap G is set to 1 mm or larger, provided that the tangential direction of the distal end portion 82L (R) of the arc-shaped concave portion 8L (R) is directed to the direction of the surface 55 of the metal mesh mask 50 so that a space which can confine a portion of the paste 9 in the arc-shaped concave portion is formed, it is possible to confine the paste in the arc-shaped concave portion 8L (R) and hence, the pattern opening portion can be sufficiently filled with the paste and the transfer can be sufficiently performed.

In any of the above-mentioned cases, the transfer amount of the paste on the pattern forming object 6 is larger in the case of the discharge portion 101L (R) to which the liquid repellency is added and which is made in this embodiment than in the case of the discharge portion 101L (R) formed on the distal end of the discharge mechanism part 1 to which no liquid-repellent treatment is applied. It is supposed that the result is caused by a fact that, since the surface of the arc-shaped concave portion 8L (R) formed on the discharge portion 101L (R) has the liquid repellency, the paste 9 is not prevented from performing rolling so that the low viscosity of the paste 9 can be held.

A result of verifying the pattern forming state in this example is similar to the result of verifying the pattern forming state using the combination mesh type mask portion 110 using the metal plate 11 as described above. That is, all patterns formed using the pattern forming portion 542 or 543 having a diameter of 50 μm to 200 μm formed in the metal mesh mask 50 can be favorably transferred on the pattern forming object 6.

In this manner, by mounting the discharge mechanism part 1 provided with a pair of discharge portions 101L and 101R according to this embodiment on the pattern forming device 100, irrespective of a size of an opening area of the opening portion 12 (542 or 543) of the pattern forming mask 11 including the metal mesh mask 50, a pattern can be formed using the paste 9 in a stable manner with high accuracy. For this purpose, by forming the pair of discharge portions 101L and 101R into a particular shape and by adding the liquid repellency to at least portions of the pair of discharge portions 101L and 101R with which the paste 9 is brought into contact, in filling the paste 9 into the pattern opening portion 12 (542 or 543) of the pattern forming mask 11 including the metal mesh mask 50 and having a desired opening portion and in transferring the pattern on the pattern forming object 6 using the paste 9, the rolling of the paste 9 is accelerated in a space formed by portions of the pair of discharge portions 101L and 101R which are formed into a particular shape (symbol 8 in FIG. 3A, for example) and a surface 5 of the mask (55) and hence, a force which acts on the opening portion 12 (542 or 543) of the pattern forming mask 11 including the metal mesh mask 50 in the substantially vertical direction, and by which the paste 9 is filled into the opening portion 12 (542 or 543) can be applied to the paste 9. Accordingly, the filling property of the paste 9 into the opening portion 12 (542 or 543) of the pattern forming mask 11 including the metal mesh mask 50 can be accelerated.

Next, a result of confirmation experiment of this embodiment by changing the kinds of paste used in the experiment will be explained. In this confirmation experiment of this embodiment, as a pattern forming mask 11, a metal mesh mask 50 is used.

In a pattern forming device 100 by which the confirmation experiment of this embodiment is performed, a paste 9 used in the experiment is of a material having a high viscosity formed by mixing a solid component and a liquid component. As the solid component, a component including at least one kind of material selected from a group of particles having solder composition, silver particles, flaky silver particles, particles including nickel as a main component, spherical resin particles covered with metal, ceramics particles and glass particles as a main component can be used. Characteristics and the result of pattern forming of the object to which the pastes are applied are shown as follows.

The paste using the particles having solder composition as the solid component is used for a surface mounting technique such as a pad bump of the printed circuit board or the like, for forming solder connection terminals such as a pad bump of a semiconductor wafer or the like and so on. A shape of the particle having solder composition used in the paste is substantially spherical.

A diameter of the particle having solder composition can be selected from approximately 1 μm to approximately 30 μm according to the pattern to be used in the pattern forming device. In this case, by taking the fluidity of the paste in the opening portion into account, a size of the opening pattern 12 formed in the pattern forming mask 11 is set ten times as large as the diameter of the particle having solder composition or larger so that the favorable pattern forming can be performed.

That is, when the particle size of the particle having solder composition is set to 1 μm, it is necessary that a size of the opening pattern (diameter of a circle when the opening pattern is a circular pattern, a line width when the opening pattern is a line pattern) is set to 10 μm or larger. When the particle size of the particle having solder composition is set to 30 μm, it is necessary that a size of the opening pattern is set to 300 μm or larger. For forming a fine pattern, it is necessary to use particles having solder composition having a fine particle size.

The paste using the silver particles as the solid component is used for forming a wiring pattern formed of low-temperature firing ceramics, forming electrodes of a solar cell or the like. A shape of the silver particle to be used in the paste is substantially spherical.

A diameter of the silver particle is set to approximately 2 nm to approximately 10 μm. When a fine pattern is formed, it is necessary to use particles having a fine particle size.

The paste using the flaky silver particles as the solid component is a conductive adhesive agent which is used when parts are mounted on a printed circuit board and, along with the miniaturization of the electronic parts, is used for mounting the parts on the substrate having projected electrodes. The flaky silver particle is a particle having an irregular shape formed into a foil-like shape by applying pressure to the silver particle. This paste has a characteristic that, since the conductivity is assured by a contact resistance, high accuracy is not required in transfer size of the pattern formed by a pattern forming. However, according to this embodiment, the discharge property is improved and hence, there is no possibility that a partial defective applying of the paste is generated so that the pattern can be surely formed.

The paste using the particles including nickel as a main component as the solid component is used for a capacitor in which the formation of ultrathin conductor is necessary. A diameter of the particles including nickel as a main component is set to approximately 10 nm to approximately 100 nm. It is characterized that by lowering the viscosity of the paste so that the paste has the fluidity.

When a mesh thickness of the metal mesh 52 which forms the metal mesh mask 50 is small, the amount of the paste 9 which the metal mesh mask 50 holds is decreased. When a large discharge amount is demanded, it is desired to use the metal mesh 52 having a large mesh thickness, while in forming a fine electrode wiring pattern or in forming a thin film electrode of a capacitor, it is desired to use the metal mesh 52 having a small mesh thickness. When it is necessary to make the mesh thickness of the metal mesh 52 thinner than the mesh thickness after weaving, by rolling the metal mesh 52 using a roll, it is possible to use the mesh having a desired mesh thickness. It is possible to select the kinds of a mesh (number of mesh, aperture, rod diameter, mesh thickness or the like) according to the device to which the mesh is used.

In this confirmation experiment, it is possible to improve the discharge property of the metal mesh 52 and hence, it is possible to form a uniform, extremely thin and fine pattern so that a favorable pattern forming result can be obtained.

The paste using the spherical resin particle covered with metal as the solid component is anisotropic conductive paste and is used for a terminal of a display as well as for mounting of parts on a printed circuit board which allows an electric connection even when resistance is higher than metal connection. A diameter of the resin particle covered with metal is set to approximately 10 µm. It is characterized that a pattern is formed on the printed circuit board in a state where the paste is applied to the whole surface of a pad portion of the parts for mounting. According to this embodiment, the discharge property is improved and hence, there is no possibility that a partial defective applying of the paste is generated so that a favorable pattern forming result can be obtained.

The paste using the ceramics particle as the solid component is used for a dielectric pattern forming of the low-temperature firing ceramics, an insulation pattern forming of electronic circuits, a pattern forming of an etching resist against copper clad polyimide film, a pattern forming for scribing insulation layer of a solar cell or the like. This embodiment has a reliable transferring ability and hence, there is no possibility that a partial defective applying of the paste is generated so that a favorable pattern forming result can be obtained.

The paste using the glass particles as the solid component is used as a sintering aid to be added to silver paste, for a dielectric pattern forming of a low-temperature firing ceramics, for an insulation pattern forming of electronic circuits or the like.

The ceramics particles and the glass particles are manufactured by milling and hence, the particles have a milled shape. In a case using these particles, it is necessary to set the opening pattern of the pattern forming mask to be used is set to ten times as large as the average particle sizes or larger.

In the discharge mechanism part 1 used in this embodiment, the arc-shaped concave portion 8 is formed on one corner of the discharge portion 101 and the portion of the discharge portion 101 which is brought into contact with the paste 9 has the liquid repellency against the paste 9. With respect to all the paste, by using the pattern forming device 100 on which the discharge mechanism part 1 provided with the discharge portion 101 is mounted, irrespective of a size of an opening area of the pattern opening portion 12 of the pattern forming mask 11, a pattern can be formed in a stable manner with high accuracy.

In this manner, on the pattern forming device 100 on which the discharge mechanism part 1 used in this embodiment is mounted, the discharge mechanism part 1 which can form a pattern in a stable manner with high accuracy using the paste can be mounted, irrespective of a size of an opening area of the pattern opening portion 12 of the pattern forming mask 11, provided that the diameter of the pattern opening portion 12 is set ten times as large as the particle size of the particle in the paste having composition such as solder or larger. For this purpose, by forming the distal end portion 101 of the discharge mechanism part 1 into a particular shape and by adding the liquid repellency 103 to at least the distal end portion 101 of the discharge mechanism part with which the paste is brought into contact, in filling the paste into the opening pattern portion 12 of the pattern forming mask 11 having a desired opening portion and in transferring the paste to the pattern forming object, the rolling of the paste is accelerated, the filling property of the paste into the opening portion 12 of the pattern forming mask 11 is accelerated, and a force by which the paste is filled into the opening portion 12 of the pattern forming mask 11 in the substantially vertical direction can be applied to the paste.

[Embodiment 2]

As one example of pattern forming of a device which demands a forming of wiring having a high aspect ratio where a height of the paste with respect to a line width is large, an example to which an embodiment 2 is applied in forming an electrode wiring pattern on a surface of a solar cell surface will be explained. This embodiment is substantially equal to the embodiment 1 except for a device which forms a pattern, a discharge mechanism part, a pattern forming mask and a paste.

Figure 8:
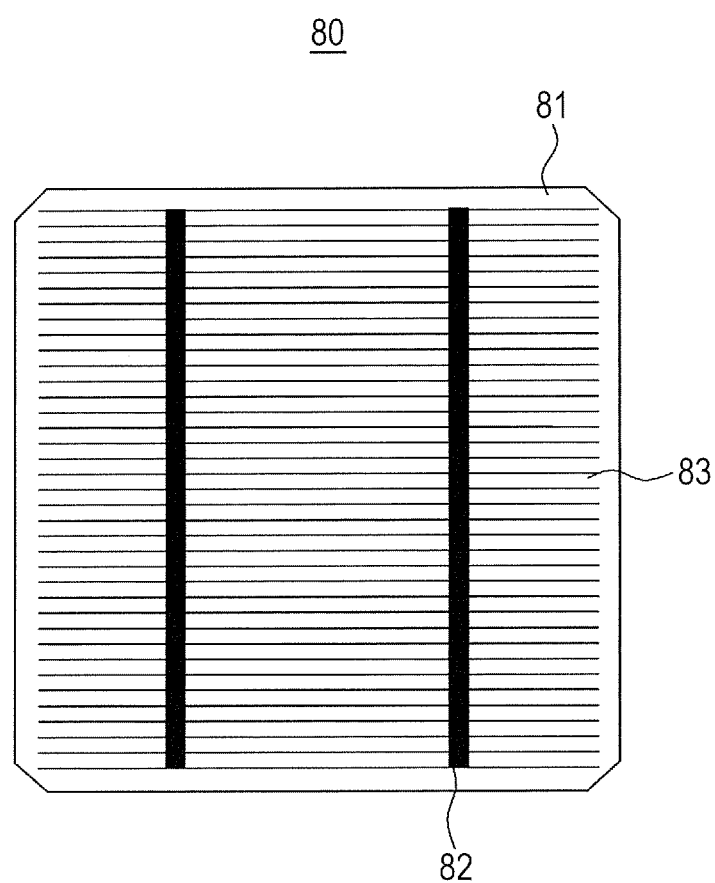
FIG. 8 is a plan view of a surface of a solar cell showing an outline of an electrode line which is formed on the surface of the solar cell described in an embodiment 2 of the present invention.

A schematic view of the electrode wiring formed on the surface of the solar cell 80 is shown in FIG. 8. As the surface electrode wiring, a wide lined bus electrode wiring 82 and a thin lined grid electrode wiring 83 (hereinafter, the bus electrode wiring 82 and the grid electrode wiring 83 being collectively referred to as conductive wiring) are formed on the surface of substrate 81.

Hereinafter, to confirm advantageous effects acquired when the surface electrode wiring of the solar cell 80 of this embodiment is formed by transferring the mask pattern, advantageous effects acquired by a comparison example are explained firstly, and advantageous effects acquired by this embodiment will be explained thereafter.

COMPARISON EXAMPLE

Figure 9A:
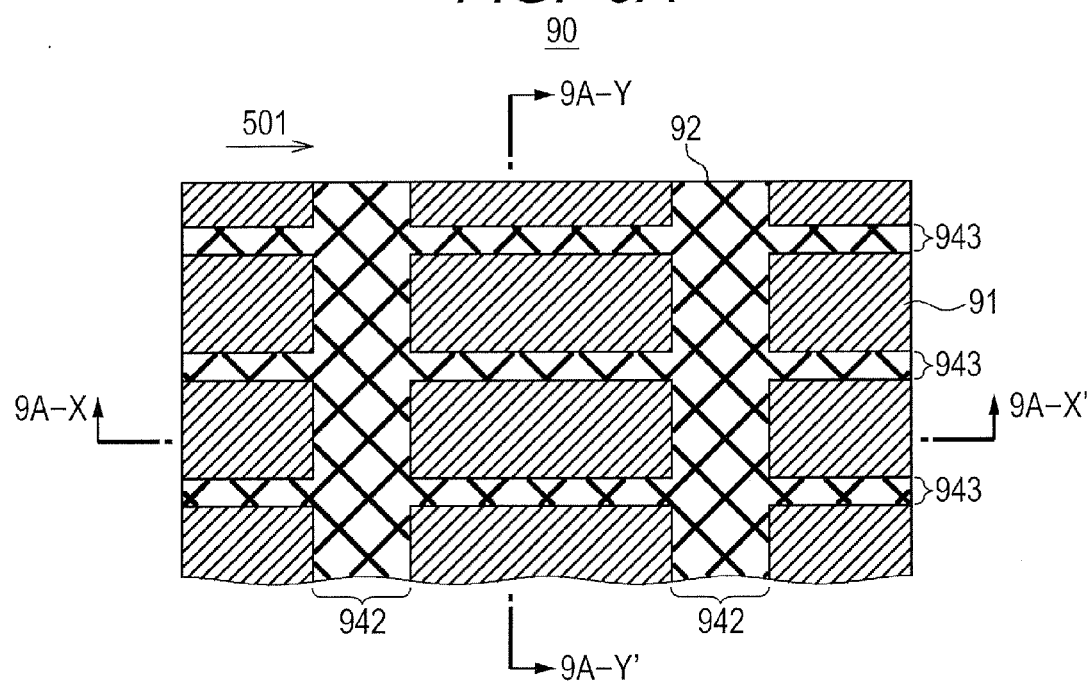
FIG. 9A is a plan view of the mask showing in an enlarged manner a portion of the mask on which the pattern to be transferred to the surface of the solar cell is formed according to the embodiment 2 of the present invention.

FIG. 9A is a locally enlarged schematic view of the pattern forming mask 90 which is used for forming the surface electrode wiring of the solar sell 80 as viewed from a side of the pattern forming object.

The pattern forming mask 90 has an opening pattern (942 and 943) for forming the electrode wiring on the metal mesh 92 by patterning using an emulsion 91. The metal mesh 92 used here is #360 having a wire diameter of 16 µm. A thickness of the emulsion 91 is set to 65 µm which is larger than a width 60 µm of the opening portion 943 for forming the grid electrode wiring 83 by patterning. Here, the thickness of the emulsion 91 is a value obtained by subtracting a thickness of the metal mesh 92 from a total thickness of the pattern forming mask 90.

Silver particles, organic binder components and organic solvents which are conductive materials are mixed into the paste which forms the conductive wiring. During the drying step which follows the pattern forming, the organic solvent scatters so that a volume of the paste is decreased. Also, depending on a kind of the paste, the paste may be baked at a high temperature. In such a case, the organic binder component is dissipated and so that the volume of the paste is decreased.

Although it is necessary to lower the specific resistance of the conductive material to obtain the desired line resistance, it is also necessary to increase a cross-sectional area of the conductive line. Also, the conversion efficiency can be increased by narrowing a line width of the conductive line thus increasing an area where the sun light is irradiated. Further, when the number of times that wiring pattern forming is performed is increased, it is necessary to perform alignment with high accuracy. When the positional displacement occurs, a line width of the conductive line is increased thus causing the lowering of the conversion efficiency. In view of the above, it is necessary to form a line having a high aspect ratio by performing pattern forming once. Accordingly, a thickness of the emulsion 91 of the pattern forming mask 90 used in pattern forming is increased.

To form the bus electrode line 82, opening portions 942 for forming a bus electrode wiring pattern are formed by the emulsion 91. To form grid electrode lines 83 formed of a thin line, opening portions 943 for forming a grid electrode wiring pattern is formed by the emulsion 91.

Figure 9B:
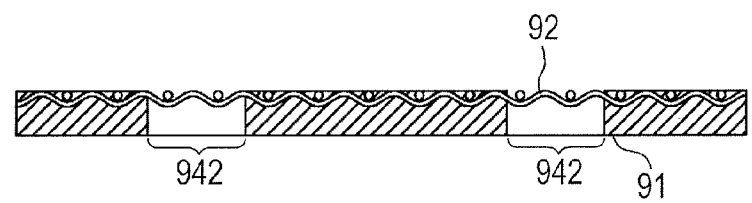
FIG. 9B is a cross-sectional view of the pattern forming mask in FIG. 7A taken along a line 9A-X-9A-X'.

With respect to the pattern forming mask 90 shown in FIG. 9A, FIG. 9B is a cross sectional view taken along a line 9A-X-9A-X' in FIG. 9A. The emulsion 91 is formed on a pattern forming object side of the metal mesh 92 thus forming opening portions 942 for the bus electrode line.

Figure 9C:
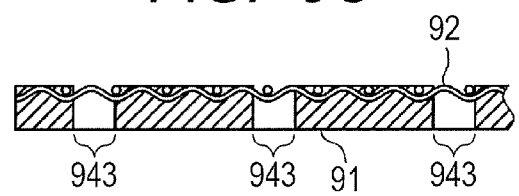
FIG. 9C is a cross-sectional view of the pattern forming mask in FIG. 7A taken along a line 9A-Y-9A-Y'.

With respect to the pattern forming mask 90 shown in FIG. 9A, FIG. 9C is a cross sectional view taken along a line 9A-Y-9A-Y' in FIG. 9A. The emulsion 91 is formed on a pattern forming object side of the metal mesh 92 thus forming opening portions 943 for the grid electrode line.

The pattern forming direction (the moving direction of the squeegee with respect to the pattern forming mask 90) is the direction parallel to the longitudinal direction of the opening portions 943 for the grid electrode lines formed of a thin line (in the direction of the arrow 501 shown in FIG. 9A).

Figure 10:
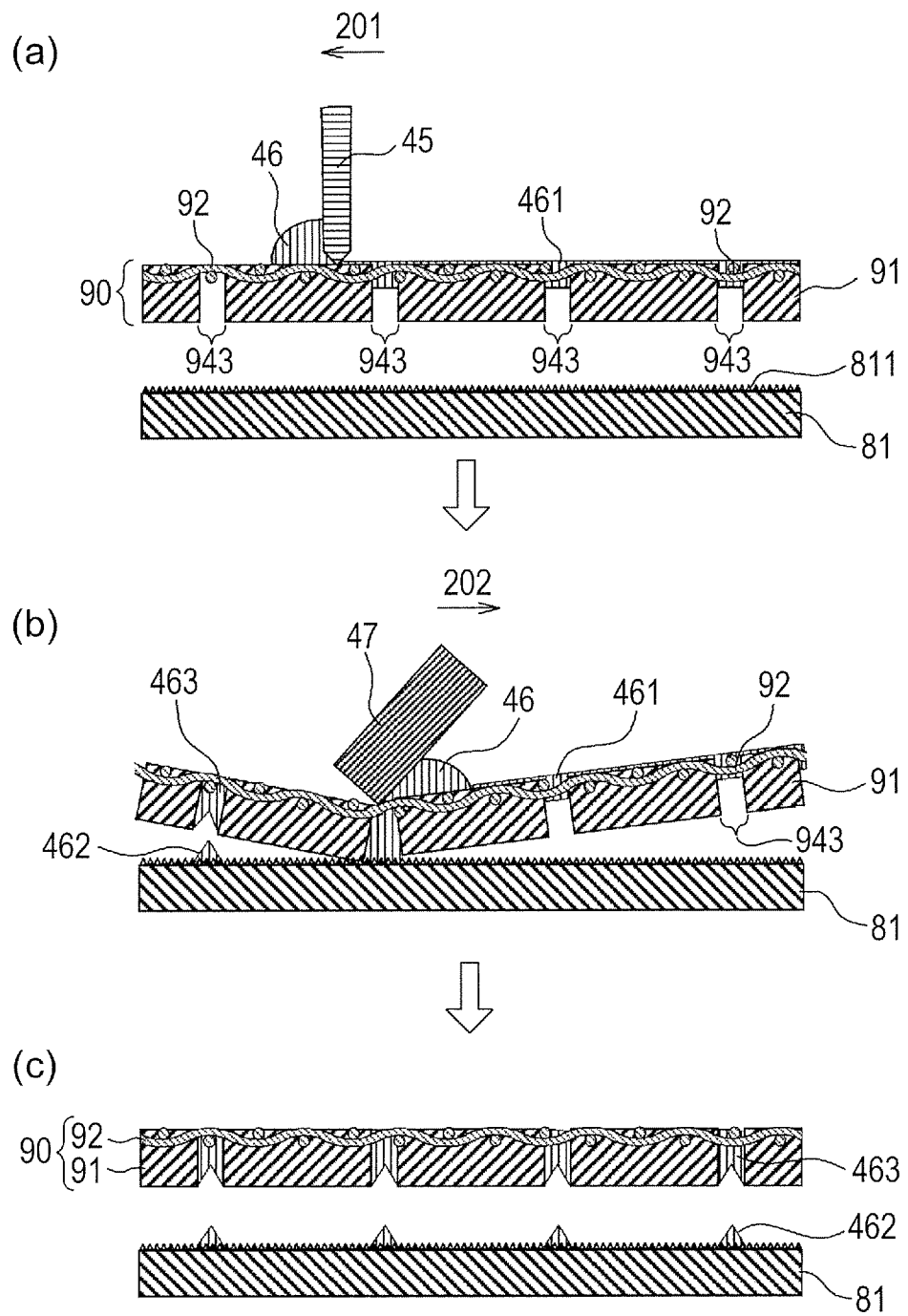
FIG. 10 is an overall view of the process explaining a pattern forming state of a grid electrode wiring shown in a comparison example according to the embodiment 2 of the present invention.

FIG. 10 (a) to (c) are schematic views showing a process for explaining the manner of operation where the grid electrode wiring pattern is formed. For the sake of convenience of explanation, the pattern forming direction is indicated in the drawing as the direction perpendicular to the longitudinal direction of the opening portions 943 for forming the grid electrode lines (the direction at a right angle with respect to an arrow 501 shown in FIG. 9A).

FIG. 10(a) is a view showing a step where a paste 46 is coated by a scraper 45 on the whole surface of the upper side of the pattern forming mask 90 in a state where the pattern forming mask 90 is arranged close to the surface of the substrate 81 which is the pattern forming object with a clearance (gap) formed between the metal mesh 92 of the pattern forming mask 90 and a pattern forming object 41 (corresponding to the substrate 81 in FIG. 8). FIG. 10A shows a state where the scraper 45 is in the midst of the movement in the direction indicated by an arrow 201. The paste 46 is applied to the inner side of the metal mesh 92 and an upper side of the pattern forming mask 90 thus forming a coated paste 461.

FIG. 10(b) is a view showing a step where, using the pattern forming mask 90 having a surface on which the paste 461 is formed in step (a), a pattern is formed on an upper side of the substrate 81 using the paste 46 by moving the flat squeegee 47 in the direction indicated by an arrow 202 along the surface 901 of the pattern forming mask with the corner portion at the edge of the flat squeegee 47 pressed against the pattern forming mask 90. Since an aspect ratio (thickness of emulsion/width of opening) of a grid electrode wiring opening portion 943 formed using the emulsion 91 is large, the paste 46 filled into the opening portion 943 formed using the emulsion 91 cannot be completely transferred to the substrate 81. Accordingly, as shown in FIG. 10(b), only a small amount of the paste pattern 462 is transferred to the substrate 81 and the paste 463 remains in the opening portion 943 formed using the emulsion 91.

When the transfer using the flat squeegee 47 is performed once, as shown in FIG. 10(c), a transfer amount of paste pattern 462 to the substrate 81 is small so that the wiring pattern transferred on the substrate 81 cannot acquire the desired line resistance. Accordingly, it is necessary to perform lamination pattern forming where the transfer is repeatedly performed while performing the positioning of the pattern forming mask 90 with respect to the substrate 81.

It is difficult for the pattern forming of the comparison example described here to perform wiring forming with a high aspect ratio.

FIG. 11 is a schematic view showing a process for explaining the manner of operation where the pattern of the bus electrode wiring 82 is formed. The pattern forming direction (the moving direction of the squeegee with respect to the pattern forming mask 90) is the direction perpendicular to the longitudinal direction of the bus electrode wiring 82.

FIG. 11(a) is a view showing a step where the paste 46 is applied by coating to the whole surface of the upper side of the pattern forming mask 90 by scanning the scraper 45 in the direction indicated by an arrow 203 in a state where the pattern forming mask 90 is arranged close to the surface of the substrate 81 with a clearance (gap) formed between the metal mesh 92 of the pattern forming mask 90 and the substrate 81. The paste 46 is applied to the inner side of the metal mesh 92 and an upper side of the pattern forming mask 90 by coating thus forming a coated paste 461.

FIG. 11(b) is a view showing a step where, using the pattern forming mask 90 having a surface on which the paste 461 is coated in step (a), a pattern is formed on an upper side of the substrate 81 using the paste 46 by moving the flat squeegee 47 in the direction indicated by an arrow 204 along the surface 901 of the pattern forming mask with the corner portion at the distal end of the flat squeegee 47 pressed against the pattern forming mask 90. A width of the opening portion 942 for bus electrode wiring formed in a portion where the emulsion 91 is not supplied is large and hence, the flat squeegee 47 is pressed to the metal mesh 92 in the opening portion 942 so that the flat squeegee 47 is brought into contact with the texture 811 which is formed on the upper side of the substrate 81 and breaks a top portion of the texture 412 in an area where the flat squeegee 47 contacts with the texture 811 (see FIG. 11(c)). Accordingly, a transparent conductive film and an insulation film (depending on a case) which are formed as films on the texture 811 are damaged and hence, functions of the transparent conductive film and the insulation film are deteriorated (not shown in the drawing). To overcome this problem, it is necessary to design the opening pattern formed using the emulsion such that the metal mesh 92 will not come into contact with the texture 811 formed on the upper side of the substrate 81 by forming no area where an emulsion does not exist in the width direction along which the flat squeegee 47 and the pattern forming mask 90 come into contact with each other (direction perpendicular to a surface of paper on which the drawing is made in FIG. 11(b)).

When the transfer is performed once, an amount of paste equivalent to the volume of the opening portion 942 formed using the emulsion 91 cannot be transferred completely. That is, only a part of the paste pattern 462 is transferred to the upper side of the substrate 81 so that the irregularities in shape become large. Accordingly, as shown in FIG. 11(c), the paste 463 remains in the inside the emulsion opening portion 942 formed in the pattern forming mask 90. Particularly, the paste 46 adheres to the metal mesh 92. This is because the paste 46 strongly adheres to the metal mesh 92.

The transfer thickness of the paste pattern is small not only in the grid electrode wiring but also in the bus electrode wiring whereby the desired line resistance cannot be acquired.

[Present Embodiment]

Figure 12A:
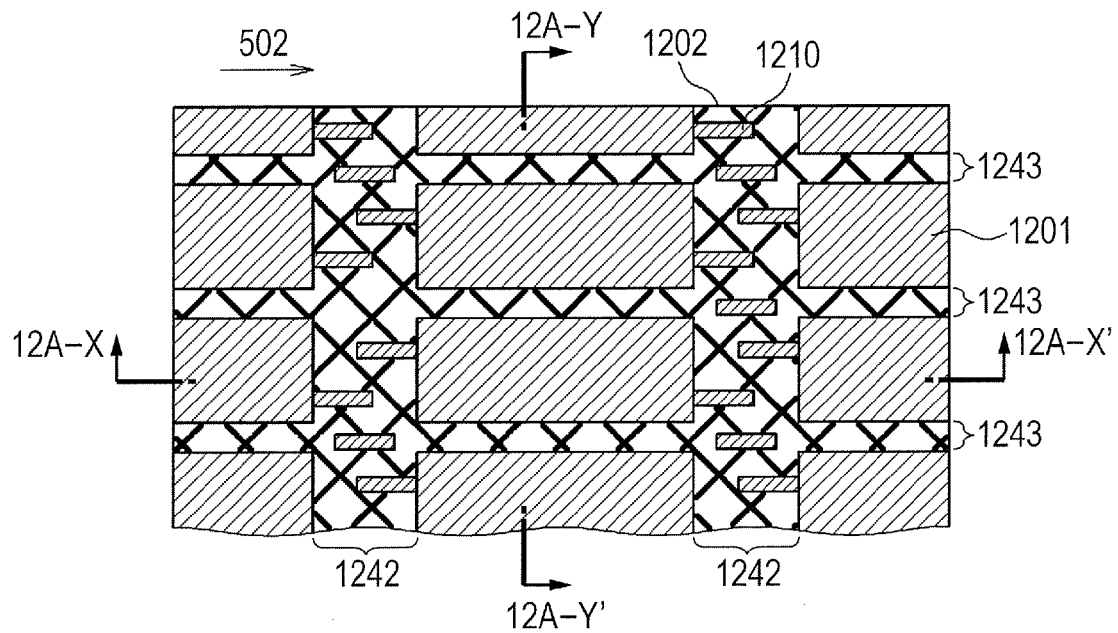
FIG. 12A is a plan view of a pattern forming mask for forming pattern of an electrode wiring on a surface of a solar cell according to the embodiment 2 of the present invention as viewed locally and in an enlarged manner from a pattern forming object side.

FIG. 12A is a locally enlarged schematic view of a pattern forming mask 1200 which is used for forming surface electrode wiring of a solar sell 80 as viewed from a side of a pattern forming object.

Opening patterns (1242 and 1243) for forming the electrode wiring on a metal mesh 1202 by patterning using an emulsion 1201 are formed on the pattern forming mask 1200. In an emulsion opening portion 1242 for forming the bus electrode wiring 82(see FIG. 8) by pattering, a pattern 1210 made of a dummy emulsion is formed so as to prevent a metal mesh 1202 to which a discharge portion 101 corresponding to the squeegee 47 shown in the comparison example is pressed from coming into contact with the texture 811 on a surface of a substrate 81.

The metal mesh 1202 used here is #360 having a wire diameter of 16 μm. A thickness of the emulsion 1201 is set to 65 μm which is larger than a width 60 μm of the opening portion 1243 for forming the grid electrode wiring 83 (see FIG. 8) by patterning. Here, the thickness of the emulsion 1201 is a value obtained by subtracting a thickness of the metal mesh 1202 (mesh thickness) from a total thickness of the pattern forming mask 1200.

Silver particles, organic binder components and organic solvents which are conductive materials are mixed into a paste which forms conductive wiring. During a drying step which follows pattern forming, an organic solvent scatters so that a volume of the paste is decreased. Also, depending on a kind of the paste, the paste may be baked at a high temperature. In such a case, the organic binder component is dissipated so that the volume of the paste is decreased.

Although it is necessary to lower the specific resistance of the conductive material to obtain the desired line resistance, it is also necessary to increase a cross-sectional area of the conductive line. Also, the conversion efficiency can be increased by narrowing a line width of the conductive line thus increasing an area where the sun light is irradiated.

Further, as described in the comparison example, when the number of times that wiring pattern forming is performed is increased by repeating the pattern transferring in the same area plural times, it is necessary to perform alignment of the pattern transferred to the substrate and the pattern forming mask 90 with high accuracy. When the positional displacement occurs, a line width of the conductive line is increased thus causing the lowering of the conversion efficiency. In view of the above, it is necessary to form a line having a high aspect ratio by performing pattern forming (transferring) once. Accordingly, a thickness of the emulsion 1201 of the pattern forming mask 1200 used in pattern forming is increased.

Further, a hydrocarbon film 1203 explained in conjunction with the embodiment 1 which has high liquid repellency is formed on a surface of the discharge portion 101 is formed on the exposed metal mesh 1202 of the pattern forming mask 1200 and the surface of the emulsion 1201 thus enhancing mold release properties of the paste 46.

On the pattern forming mask 1200, to form the bus electrode line 82, opening portions 1242 for forming a bus electrode wiring pattern are formed by the emulsion 1201. To form grid electrode lines 83 formed of a thin line, opening portions 1243 for forming a grid electrode wiring pattern is formed by the emulsion 1201.

Figure 12B:
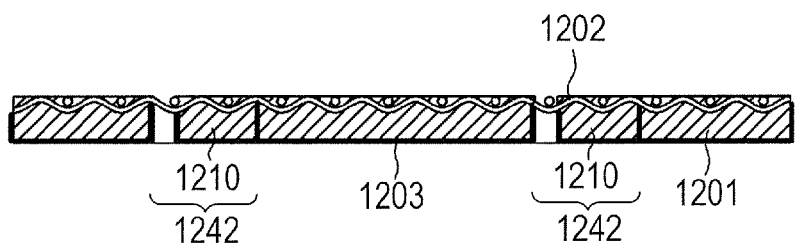
FIG. 12B is a cross-sectional view of the pattern forming mask in FIG. 12A taken along a line 12A-X-12A-X'.

With respect to the pattern forming mask 1200 shown in FIG. 12A, FIG. 12B is a cross sectional view taken along a line 12A-X-12A-X' in FIG. 12A. The emulsion 1201 is formed on a pattern forming object side (substrate 81 side) of the metal mesh 1202 thus forming opening portions 1242 for the bus electrode line. On the opening portions 1242 for the bus electrode line, a pattern 1210 made of a dummy emulsion is formed so as to prevent the metal mesh 1202 from coming into contact with the texture 811 formed on the upper side of the substrate 81.

Figure 12C:
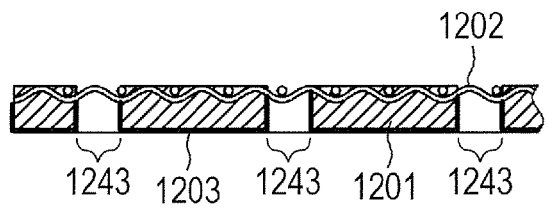
FIG. 12C is a cross-sectional view of the pattern forming mask in FIG. 12A taken along a line 12A-Y-12A-Y'.

With respect to the pattern forming mask 1200 shown in FIG. 12A, FIG. 12C is a cross sectional view taken along a line 12A-Y-12A-Y' in FIG. 12A. The emulsion 1201 is formed on a pattern forming object side (substrate 81 side) of the metal mesh 1202 thus forming opening portions 1243 for the grid electrode line.

The pattern forming direction (the moving direction of the discharge portion 101) is the direction parallel to the longitudinal direction of the opening portions 1243 for the grid electrode lines formed of a thin line (in the direction of the arrow 502 shown in FIG. 12A).

Figure 13:
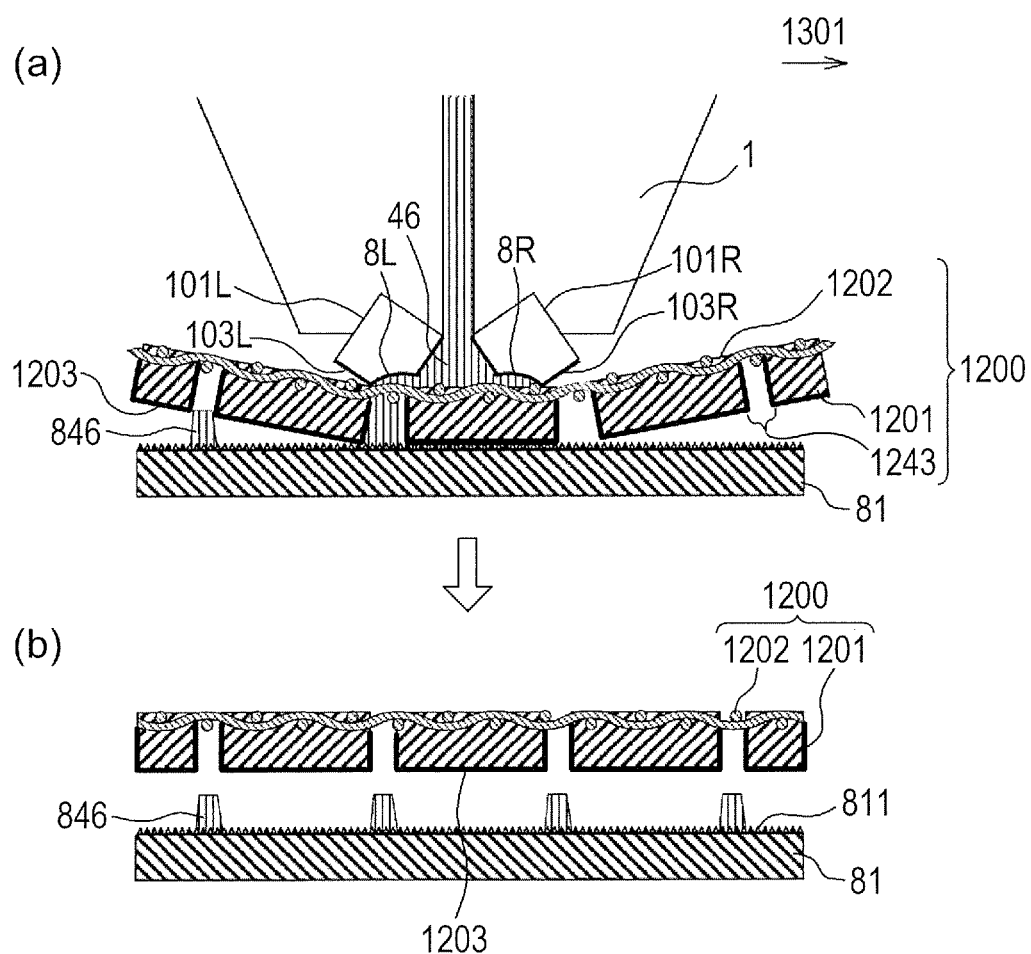
FIG. 13 is an overall view of the process explaining a pattern forming state of a grid electrode wiring shown in the embodiment 2 of the present invention.

FIG. 13(*a*) and FIG. 13(*b*) are schematic process views for explaining the manner of operation where the grid electrode wiring pattern 83 is formed. The actual pattern forming direction (the scanning direction of the discharge mechanism part 1 with respect to the pattern forming mask 1200) is the direction indicated by an arrow 502 shown in FIG. 12A. However, for the sake of convenience of explanation, the pattern forming direction is indicated in the drawing as the direction perpendicular to the longitudinal direction of the opening portions 1243 for forming the grid electrode lines (the direction at a right angle with respect to an arrow 502 shown in FIG. 12A).

FIG. 13(*a*) is a step view showing a step where, with the use of the discharge mechanism part 1 on which a pair of discharge portions 101R and 101L is mounted as explained in conjunction with the embodiment 1 of the present invention, the pattern 846 is formed on the upper side of the substrate 81 using the paste 46 by moving the pair of discharge portions 101R and 101L in the direction indicated by an arrow 1301 while pressing the discharge portions 101R and 101L to the pattern forming mask 1200. By using the discharge mechanism part 1 having excellent discharge property where a pair of discharge portions 101R and 101L have arc-shaped concave portions 8R and 8L having surfaces to which a liquid-repellent treatment is applied by forming diamond-like carbon films 103R and 103L on the surfaces as explained in conjunction with the embodiment 1 of the present invention, the pattern 846 formed using the paste 46 can be transferred to the upper portion of the substrate 81.

FIG. 13(*b*) is a schematic view showing a state where the formation of the pattern 846 on the substrate 81 is finished and the pattern forming mask 1200 is separated from the substrate 81 which is the pattern forming object. In spite of the fact that an aspect ratio (thickness of emulsion/width of opening) of the opening portion 1243 for transferring the pattern of the grid electrode wiring 83 formed of the emulsion 1201 is large, the pattern 846 formed using the paste 46 which is filled into the opening portion 1243 of the emulsion 1201 can be completely transferred to the upper side of the substrate 81.

A paste pattern 846 with a high aspect ratio is transferred to the upper side of the substrate 81, and the paste 46 does not remain inside the opening portion 1243 formed using the emulsion 1201 on the pattern forming mask 1200. It is considered that the mold release properties of the paste 46 from the metal mesh 1202 and the emulsion 1201 is improved by giving liquid repellent property to the exposed portion of the metal mesh 1202 and the emulsion 1201 of the pattern forming mask 1200, by forming a diamond-like carbon film 1203 in the same manner as the pair of discharge portions 101R and 101L.

Figure 14:
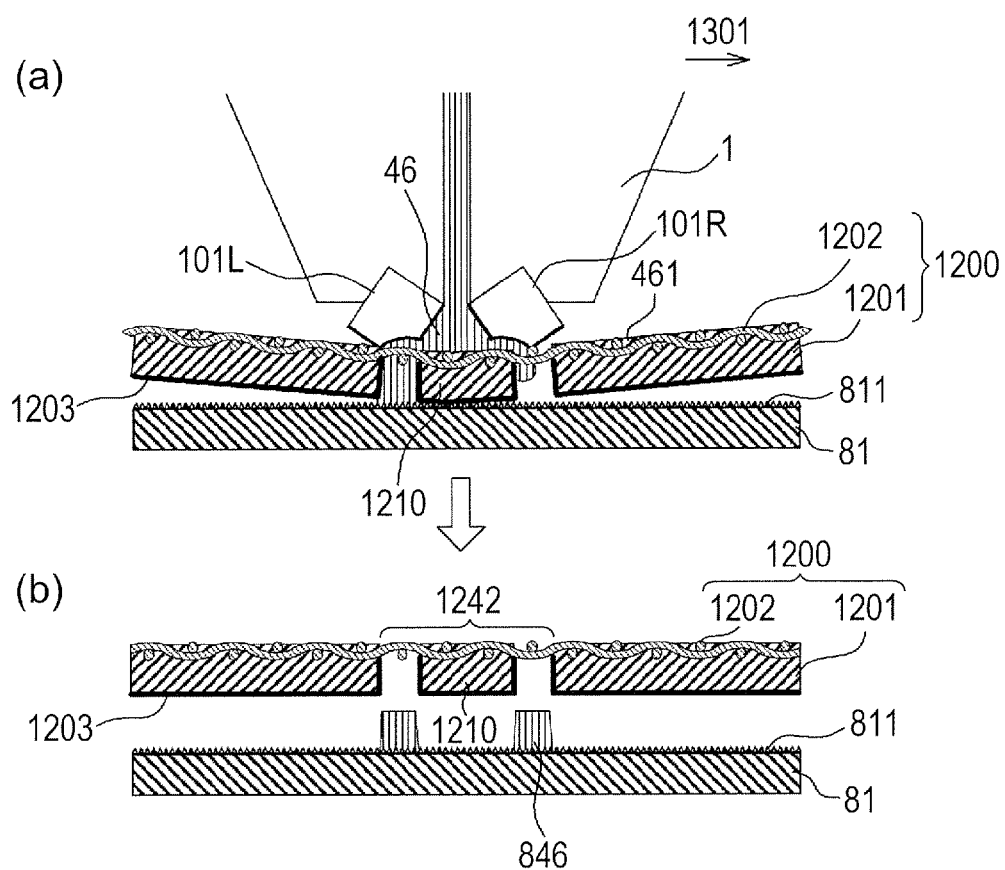
FIG. 14 is an overall view of the process explaining a pattern forming state of a bus electrode wiring shown in the embodiment 2 of the present invention.

FIG. 14 is a schematic view showing a process for explaining the manner of operation where the pattern of the bus electrode wiring 82 is formed. The pattern forming direction is the direction perpendicular to the longitudinal direction of the opening portion 1242 for the bus electrode wiring formed by the emulsion 1201 (the direction indicated by an arrow 502 in FIG. 12).

In the same manner as the constitution explained in conjunction with FIG. 13(*a*), FIG. 14(*a*) is a step view showing a step where, with the use of the discharge mechanism part 1 explained in conjunction with the embodiment 1 of the present invention, the pattern is formed on the upper side of the substrate 81 using the paste 46 by moving the pair of discharge portions 101R and 101L in the direction indicated by an arrow 1301 while pressing the pair of discharge portions 101R and 101L to the pattern forming mask 1200. Since the dummy emulsion 1210 is formed on the opening portion 1242 for the bus electrode wiring, the pattern of the opening portion 1242 formed on the pattern forming mask 1200 using the emulsion 1201 can be transferred to the substrate 81 without bringing the metal mesh 1202 into contact with the texture 811 formed on the surface of the substrate 81.

Further, the pattern of the opening portion 1242 formed using the paste 46 can be transferred to the upper side of the substrate 81 by using the discharge mechanism part 1 having excellent discharge property explained in conjunction with the first embodiment of the present invention.

FIG. 14(*b*) shows a state where a scanning of a predetermined stroke by the discharge mechanism part 1 is finished, and the pattern forming using the paste 46 on the substrate 81 has been finished. FIG. 14(*b*) is a schematic view showing a state where the pattern forming mask 1200 is separated from the substrate 81 which is the pattern forming object, and the paste pattern 846 is formed on the substrate 81 (a state where the step S208 in FIG. 2 is finished).

Although the aspect ratio (thickness of emulsion/width of opening) of the opening portion 1242 for the bus electrode wiring formed of the emulsion 1201 is large, the paste 46 which is filled into the opening portion 1242 of the emulsion 1201 can be completely transferred to the upper side of the substrate 81. To the upper side of the wafer, a paste pattern 846 with a high aspect ratio is transferred. The paste 46 does not remain inside the opening portion 1242 of the emulsion 1201. It is considered that this is because the mold release properties of the paste 46 from the metal mesh 1202 and the emulsion 1201 is improved by giving liquid-repellency to the portions of the pattern forming mask 1200 where the metal mesh 1202 and the emulsion 1201 are exposed by forming a diamond-like carbon film 1203 on the exposed portions.

According to this embodiment, it is possible to form a pattern with a desired line resistance on the upper side of the substrate 81 by just scanning the discharge mechanism part 1 once, with the discharge mechanism part 1 pressed to the pattern forming mask 1200. As a result, it is unnecessary to perform alignment with high accuracy to repeatedly perform pattern forming plural times. That is, pattern forming can be performed on plural substrates at a time without setting the substrate 81 one by one in performing the pattern forming in each step. Accordingly, not only f electrode wiring can be formed favorably but also a tact time can be shortened thus enhancing productivity.

[Embodiment 3]

In the embodiment 3, the filling of a conductive material into a silicon wafer is taken up as one example of the filling of a conductive paste into a through hole having an opening of a high aspect ratio. As a device which has the through holes having an opening of a high aspect ratio, a back-contact-type solar cell, a TSV semiconductor element and the like can be named. In this embodiment, the back-contact-type solar cell will be explained by also taking a comparison example. This embodiment is substantially equal to the embodiments 1 and 2 except for a device by which printing is performed, a discharge part formed on a distal end of a discharge mechanism part 1, a pattern forming mask and a paste.

Figure 15A:
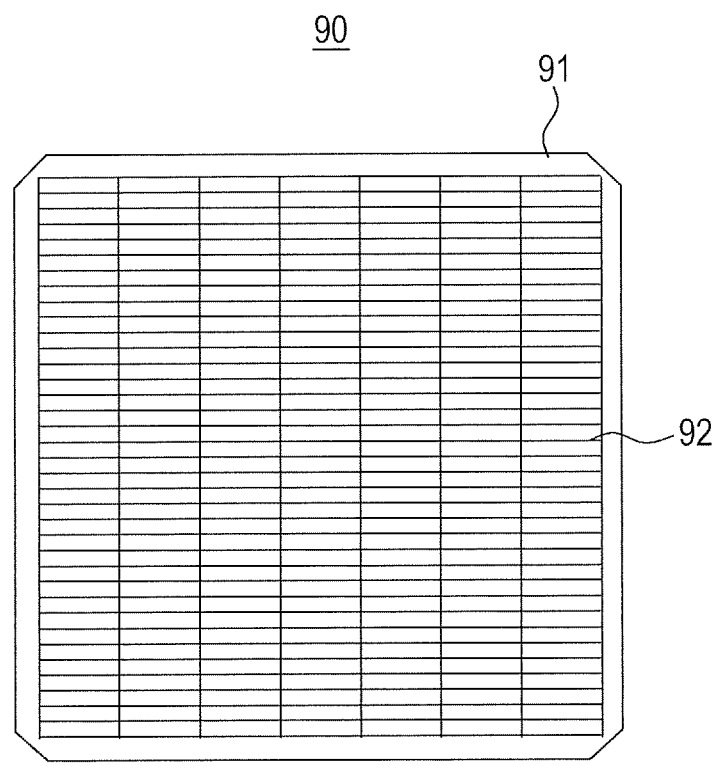
FIG. 15A is a plan view of a surface of a back-contact-type solar cell showing an outline of an electrode wiring which is formed on the surface of the back-contact-type solar cell according to an embodiment 3 of the present invention.
Figure 15B:
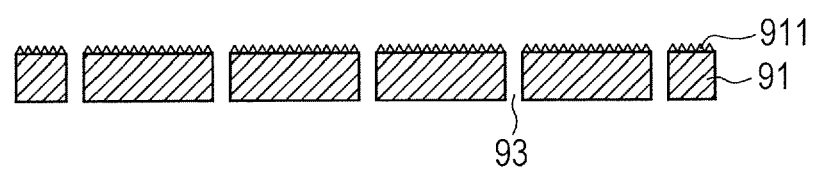
FIG. 15B is a cross-sectional view of the back-contact-type solar cell according to the embodiment 3 of the present invention.

FIG. 15A is a plan view of the back-contact-type solar cell 90, and FIG. 15B is a cross-sectional view of the back-contact-type solar cell 90. In the back-contact-type solar cell 90, front surface contact lines 92 are formed on a front surface side of a substrate 91, and through holes 93 for connecting the front surface side and a back surface side of the substrate 91 are formed in the substrate 91. Further, a texture 911 which is formed of minute projections is formed on a front surface of the substrate 91.

In this embodiment, the explanation is made with respect to a method for forming an electrode wiring on a back surface of the substrate 91 by filling a paste into the through holes 93 without damaging the texture 911.

COMPARISON EXAMPLE

Figure 16:
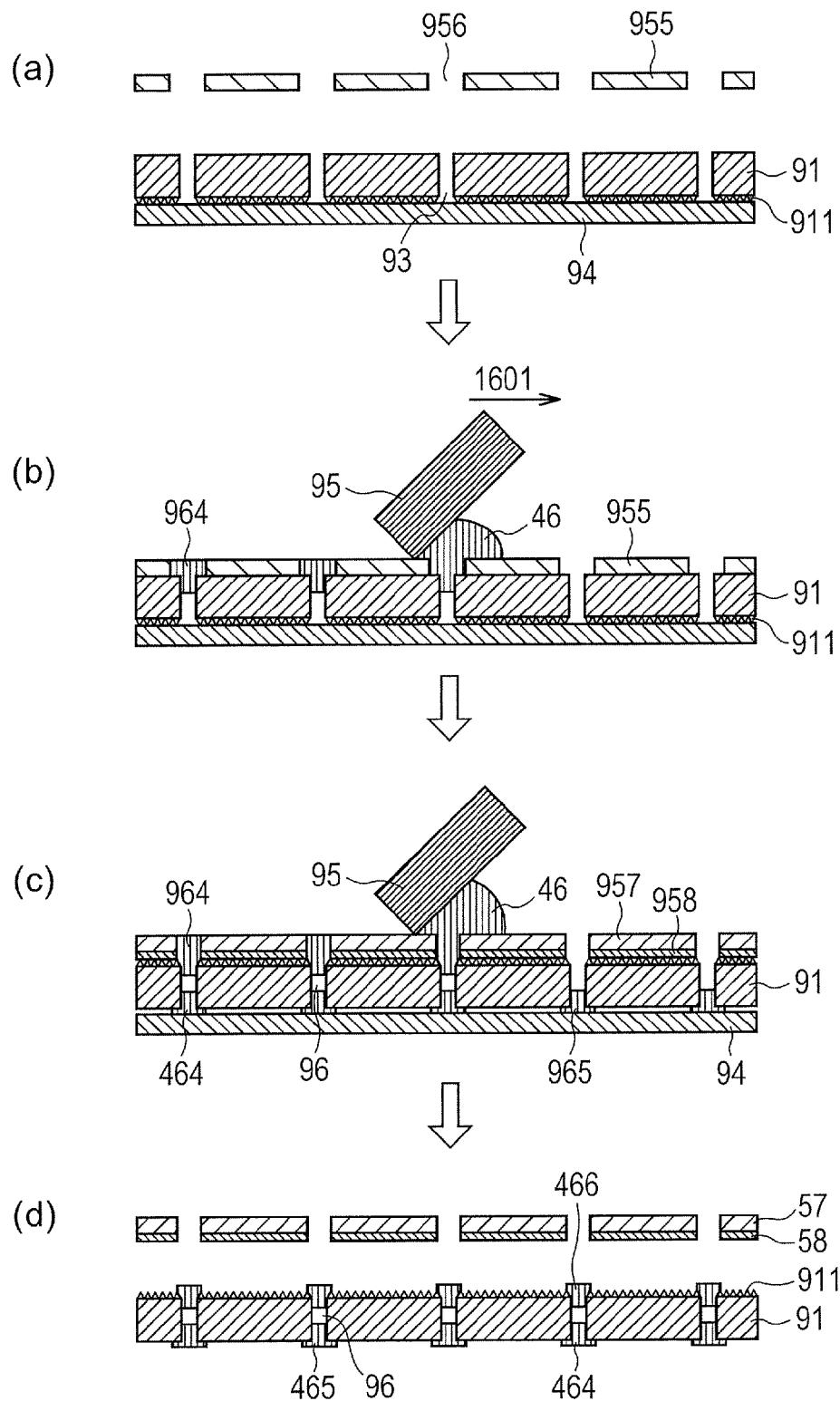
FIG. 16 is an overall view of the process explaining a filling state of a paste into a through hole shown in a comparison example according to the embodiment 3 of the present invention.

With reference to FIG. 1 and FIG. 16, the explanation is made with respect to the filling of a paste into the through holes 93 which are formed in the substrate 91 of the back-contact-type solar cell 90 for making front/back surface electrodes conductive with each other.

A squeegee which is used for filling a paste into the through holes 93 in this embodiment is a flat squeegee 47 which is used in the comparison example of the embodiment 2. Further, in filling the paste from the back surface of the substrate 91, there may be a case where the projection-shaped texture 911 which is formed on the front surface of the substrate 91 of the back-contact-type solar cell 90 is brought into contact with a table 231 of a pattern forming apparatus 100, and the projection-shaped texture 911 is broken. To prevent such breaking of the projection-shaped texture 911, as shown in FIG. 16(*a*), a texture protection film 94 is used.

The texture protection film 94 has flexibility thus protecting the texture 911 from being broken. Further, the texture protection film 94 is made of a porous material and hence, it is possible to provide a vacuum chuck for fixing the substrate 91 to the table 231 of the pattern forming apparatus 100 through the texture protection film 94.

Further, to form a back surface electrode pattern 965 simultaneously with the filling of the paste into the through holes 93 formed in the back-contact-type solar cell 90 for making the front/back surface electrodes conductive with each other, as a pattern forming mask, a metal mask 955 is used where an opening portion 956 corresponding to the back surface electrode pattern 965 is formed at a predetermined position.

The formation of the back surface electrode pattern and the filling of the paste to the through holes 93 are performed as follows. In a state where the front surface of the substrate 91 on which the texture 911 is formed is protected by the texture protection film 94, the substrate 91 is fixed to the table 231 such that a front surface side of the substrate 91 constitutes a lower side. In a state where the metal mask 955 is brought into contact with a back surface side constituting an upper side, as shown in FIG. 16(*b*), the substrate 91 is made to move in the direction indicated by an arrow 1601 while the flat squeegee 47 is brought into pressure contact with the metal mask 955.

As a result, although the back surface electrode pattern can be formed, the through holes 93 formed in the back-contact-type solar cell 90 cannot be completely filled with the paste 46.

To completely fill the through holes 93 with paste 46, after the filling of the paste is performed from the back surface of the substrate 91 (FIG. 16(*b*)), it is necessary to perform the filling of the paste from the front surface of the substrate 91 (FIG. 16(*c*)) in a state where the substrate 91 is reversed so that the front surface of the substrate 91 constitutes the upper side.

The filling of the paste from the front surface of the substrate 91 is performed as follows. The substrate 91 is fixed to the table 231 in a state where the back surface side constituting a lower side on which the electrode pattern is formed is protected by the texture protection film 94, and the texture protection film 94 which is formed on the front surface side of the substrate 91 is peeled off. In this state, a metal mask 957 is used for filling the paste 46 into the through holes 93 from the front surface side of the substrate 91. With respect to a metal mask 957, as shown in FIG. 16(*c*), a cushion material 958 made of emulsion is formed on the metal mask 957 so as to prevent the metal mask 957 from breaking an upper portion of the texture 911 when the metal mask 957 is brought into contact with the texture 911 formed on the upper portion of the substrate 91.

The filling of the paste 46 into the through holes 93 is performed from the back surface of the substrate 91 as well as from the front surface of the substrate 91. However, with the opening having an aspect ratio (wafer thickness/through hole diameter) of 2 (wafer thickness: 160 μm/through hole diameter: φ80 μm), as shown in FIG. 16(*d*), an air hole (cavity) 96 is formed in an approximately center portion of the through hole 93 thus giving rise to a conduction failure. Accordingly, with the aspect ratio of 2 or more (wafer thickness: 160 μm/through hole diameter: φ80 μm), the filling of the paste 46 into the through holes 93 cannot be performed.

When the through hole 93 has an aspect ratio (substrate thickness/through hole diameter) of 1.5 (substrate thickness: 120 μm/through hole diameter: φ80 μm), the filling of the paste 46 into the through holes 93 can be performed. However, it is necessary to perform the filling from both surfaces, that is, from the back surface and the front surface and hence, there exists a drawback that the filling of the conductive material takes time. Further, a thickness of the substrate 91 is small, that is, 120 μm. Accordingly, the substrate 91 warps so that it becomes difficult to fix the substrate 91 to the table 231 of a printer by suction whereby there may arise a case where the production is stopped due to an alarm which informs a suction failure or a case where the substrate 91 is broken.

Even with the same aspect ratio (1.5), when a thickness of the substrate 91 is changed to 160 μm, a diameter of a through hole 93 exceeds 100 μm. Accordingly, when a width of a surface connection wiring of the back-contact-type solar cell 90 is taken into consideration, an irradiation area of a solar light becomes small due to the surface electrode wiring thus giving rise to a drawback that conversion efficiency is lowered.

°Present Embodiment<

The filling of a paste into through holes having an opening of a high aspect ratio which cannot be realized in the comparison example is attempted using a pattern forming apparatus 100 of this embodiment. The explanation is made in conjunction with FIG. 17.

Figure 5:
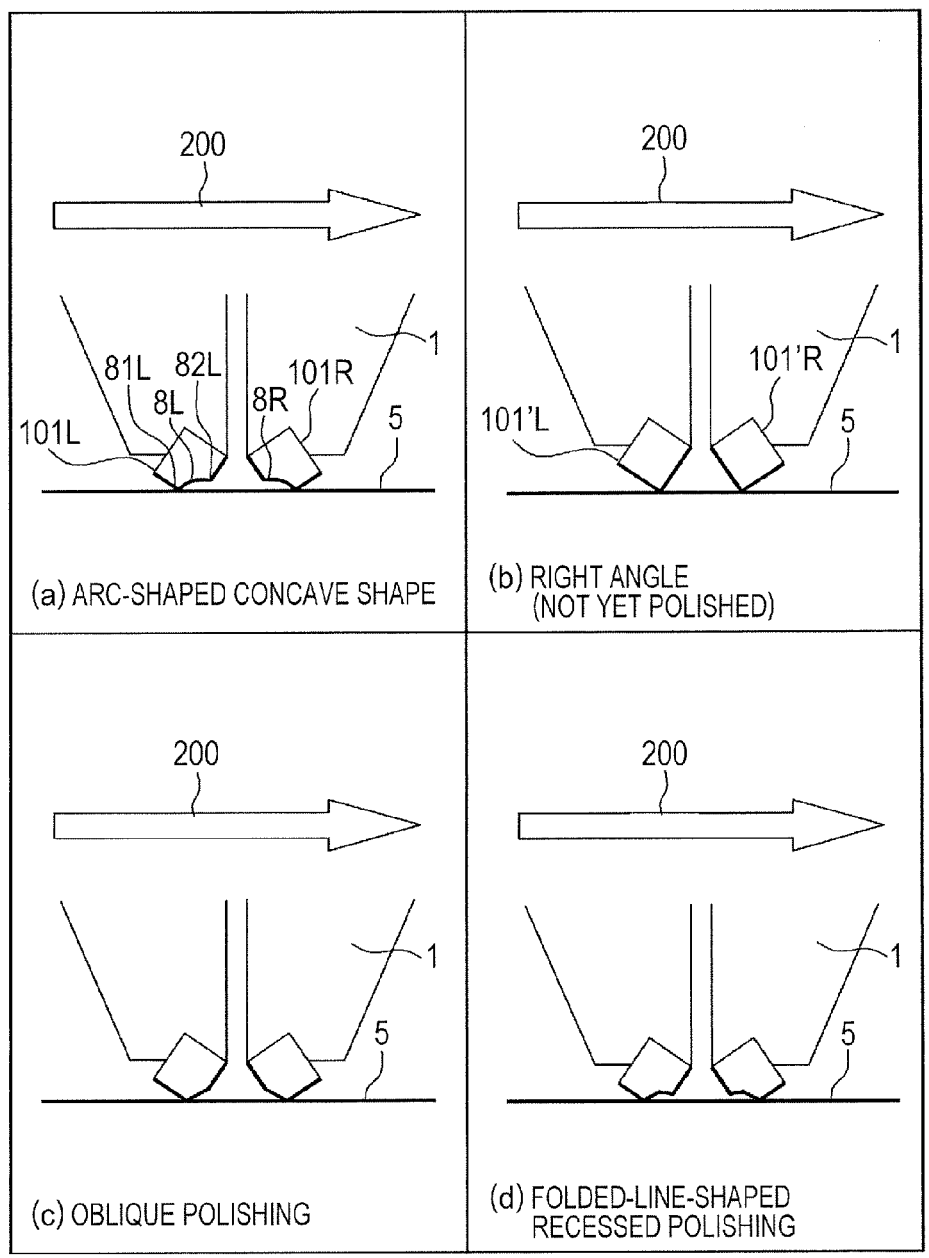
FIG. 5 is a schematic view of shapes of the distal ends of various discharge mechanism parts which are used in evaluation experiments according to the embodiment 1 of the present invention.
Figure 17:
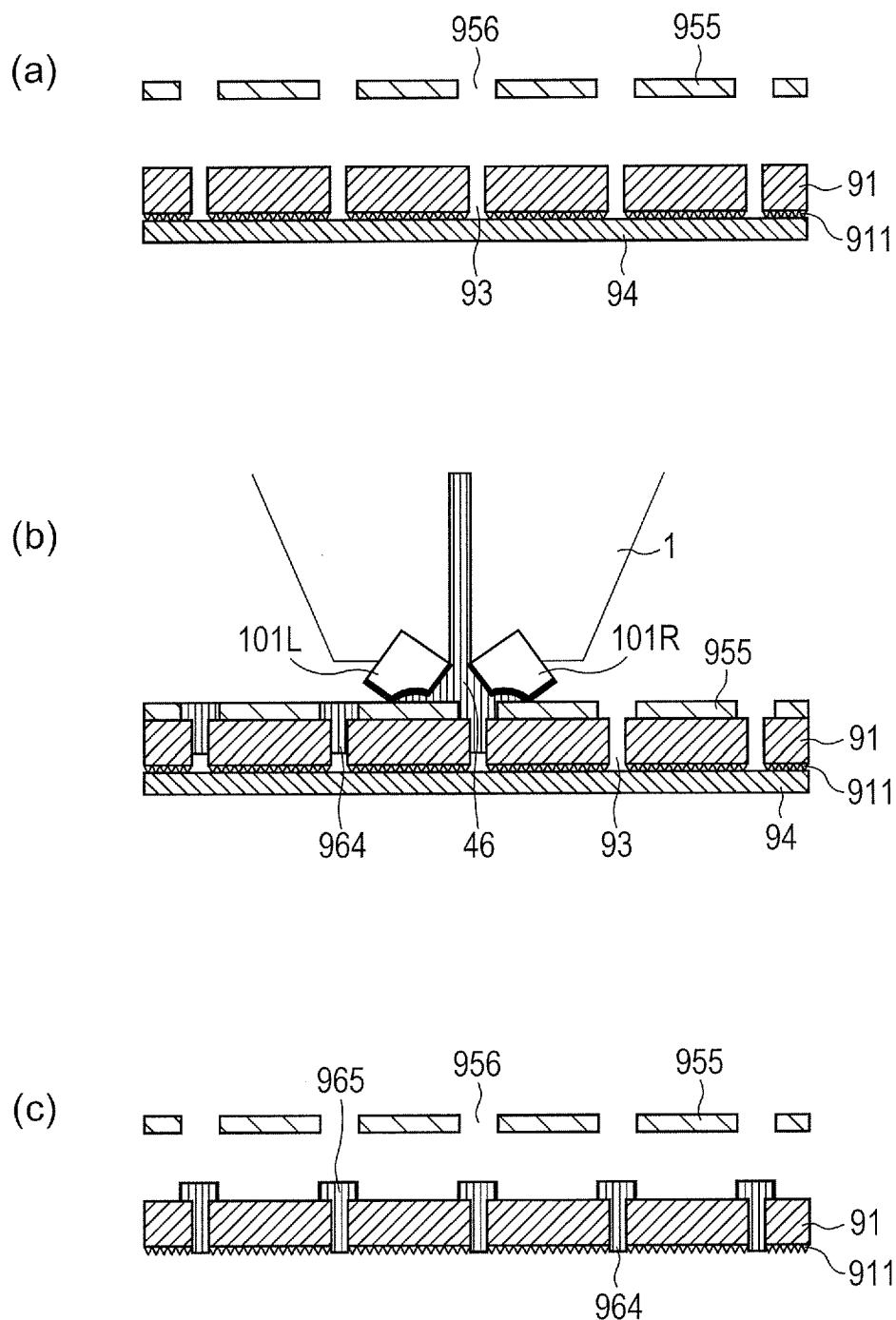
FIG. 17 is an overall view of the process explaining a filling state of a paste into the through hole according to the embodiment 3 of the present invention.

A distal end portion 101 of a discharge mechanism part 1 which is used in filling a paste 46 into the through holes 93 has, in the same manner as the embodiments 1 and 2, the structure where the distal end portion 101 is formed into an arc-shaped concave shape (a shape shown in FIG. 5(*a*)). Further, in filling the paste 46 from the back surface of the substrate 91, there may be a case where the projection-shaped texture 911 which is formed on a front surface of the substrate 91 of the back-contact-type solar cell 90 is brought into contact with a table 231 of a printer so that the projection-shaped texture 911 is broken. To prevent such breaking of the projection-shaped texture 911, as shown in FIG. 17(*a*), a texture protection film 94 which is substantially equal to the texture protection film 94 used in the comparison example of this embodiment is used.

The texture protection film 94 has flexibility thus protecting the texture 911 from being broken. Further, the texture protection film 94 is made of a porous material and hence, it is possible to provide a vacuum chuck for fixing the substrate 91 to the table 231 of the printer through the texture protection film 94.

Further, to form a back surface electrode pattern 965 simultaneously with the filling of the paste into the through holes 93 formed in the back-contact-type solar cell 90 for making the front/back surface electrodes conductive with each other, a metal mask 955 is used where an opening portion 956 corresponding to the back surface electrode pattern 965 is formed at a predetermined position.

The filling of the paste 46 into the through holes 93 formed in the back-contact-type solar cell 90 is performed as follows. The substrate 91 is fixed to the table 231 in a state where a back surface side of the substrate 91 constitutes an upper side and a front surface of the substrate 91 which is protected by the texture protective film 94 constitutes a lower side (see FIG. 17(*a*)). With the substrate 91 held in this state, using a discharge mechanism part 1 on which a pair of discharge portions 101R and 101L is mounted and which is explained in conjunction with the embodiment 1, the filling of the paste 46 into the through holes 93 is performed by moving the substrate 91 while bringing the pair of discharge parts 101R and 101L into pressure contact with the metal mask 955 which is hermetically adhered to a back surface side of the substrate 91 which constitutes the upper side (FIG. 16(*b*)). As a result, the through holes 93 can be completely filled with the paste 964, and the printing of the back-surface electrode wiring 965 can be simultaneously performed.

When the through hole 93 has an aspect ratio (wafer thickness/through hole diameter) of 2 (wafer thickness: 160 μm/through hole diameter: φ80 μm), as shown in FIG. 17(*c*), an air hole (cavity) 96 shown in FIG. 16(*c*) is not formed in the through hole 93 so that the through holes 93 are completely filled with the paste. Accordingly, with the aspect ratio of (wafer thickness: 160 μm/through hole diameter: φ80 μm) 2 or less, the filling of the paste into the through holes 93 can be easily performed.

When the through hole 93 has an aspect ratio (wafer thickness/through hole diameter) of 3 (wafer thickness: 180 μm/through hole diameter: φ60 μm), the filling of the paste into the through holes 93 can be completely performed. Further, it is possible to narrow a width of the surface connection wiring 92 of the back-contact-type solar cell 90 and hence, an irradiation area of a solar light is increased due to the surface connection wiring 92 thus enhancing conversion efficiency.

Here, the surface connection wiring 92 of the back-contact-type solar cell 90 is formed using the same method as the embodiment 2.

Further, since the filling of the paste can be performed with respect to the through hole having a high aspect ratio and hence, there exists a possibility that such filling is applied to a TSV semiconductor element where a large number of through holes are formed in a silicon wafer.

In this manner, with the use of the printer which can mount the discharge part formed on the distal end of the discharge mechanism part 1 explained in conjunction with the embodiment 1 of the present invention, it is possible to completely fill the paste into the through holes having a high aspect ratio by performing printing once and hence, a tact can be shortened and high efficiency of solar cells can be achieved.

[Embodiment 4]

According to an embodiment 4, as one example of pattern forming of a device which demands forming of wiring having a high aspect ratio where a height of a paste with respect to a line width is large, forming of an electrode wiring pattern on a solar cell surface will be explained. The constitution of this embodiment 4 is substantially equal to the constitution of the above-mentioned embodiment 2 except for a pattern forming mask 60A.

Figure 18:
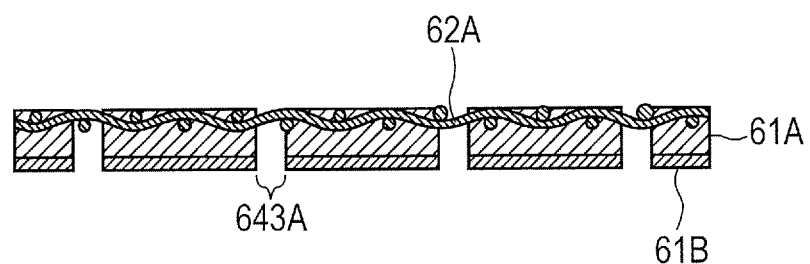
FIG. 18 is a locally enlarged cross-sectional view of a pattern forming mask according to an embodiment 4 of the present invention.

FIG. 18 shows an enlarged schematic view of a partial cross-section for explaining the pattern forming mask 60A used in this embodiment 4.

The pattern forming mask 60A has an opening pattern 643 for forming electrode lines by patterning in a metal mesh 62A using two kinds of emulsions 61A and 61B. The pattern of an emulsion opening portion is formed in the same manner as the corresponding pattern according to the embodiment 2.

Here, #360 having a line diameter of 16 μm is used for forming the metal mesh 62A. Two kinds of emulsions 61A and 61B differ in hardness. Considering that resolution is important in forming an opening pattern, an emulsion having high hardness is used as the emulsion 61A. On the other hand, considering that following property of emulsion to the texture (irregularities) formed on a solar cell surface is important, an emulsion having low hardness is used as the emulsion 61B.

The hardness of emulsion is measured using a thin film hardness meter Fischer scope H100CU. The measurement is performed under the condition that the emulsion is pressurized to 200 mN for 10 seconds and, after holding a pressurized state for 5 seconds, decompression is performed for 10 seconds. The emulsion having a thickness of 30 μm is applied to the metal mesh 62A by coating and is dried to obtain emulsion served for measurement. The hardness is evaluated based on the maximum value of the emulsion hardness when an indentation depth is 5 μm or less. An emulsion having hardness of 50 N/mm$^2$ or more is used for the emulsion 61A requiring high hardness, while an emulsion having hardness of 40 N/mm$^2$ or less is used for the emulsion 61B requiring low hardness.

There is correlation between the hardness of the emulsion and the resolution of the opening pattern forming, and the higher the hardness of the emulsion is, the higher the linearity of opening pattern portion is. When the hardness of the emulsion is high, it can be expected that deformation of the mesh is restrained and hence, it is effective in enhancing the positional accuracy at the time of continuous printing. However, when the hardness of the emulsion is high, the emulsion cannot follow irregularities on the surface of the printing object and hence, when a gap is formed, the paste exudes due to a capillary phenomenon so that the linearity of the wiring pattern is decreased. For assuring the resolution of the opening pattern in forming of fine wiring, the emulsion hardness of 50 N/mm$^2$ or more is necessary. It is preferable that the emulsion requiring high hardness has emulsion hardness of 100 N/mm$^2$ or more. When the emulsion hardness is 50 N/mm$^2$ or more, even when the paste is pressurized to 200 mN using a thin film hardness meter, an indentation depth is approximately 10 μm and hence, the paste cannot deal with the texture (irregularities) formed over the whole surface of the wafer.

On the other hand, when the hardness of the emulsion is low, in forming a fine opening pattern, the emulsion swells at the time of development with water and hence, resolving is impossible. However, when a thickness of the emulsion is small, it is possible to suppress an emulsion swelling amount at the time of development with water. It is confirmed that, by forming the emulsion in two-layered structure, the emulsion having low hardness can be also resolved with the substantially same level of resolution as the emulsion having high hardness. The emulsion having low hardness can follow the irregularities on the printing object surface and hence, the pattern forming mask can be brought into close contact with the printing object so that the exuding of the paste can be prevented. Particularly, to enable the emulsion according to this embodiment to follow the texture formed on the solar cell surface, it is necessary to set hardness of the emulsion to 40 N/mm$^2$ or less. It is necessary to set a thickness of the emulsion having low hardness 61B to twice as large as the irregularities of the texture. With respect to the emulsion having hardness of 40 N/mm$^2$ or less, when the emulsion is pressurized to 200 mN using a thin film hardness meter, an indentation depth is approximately 15 μm and hence, the emulsion can deal with the texture (irregularities) formed over whole surface of the substrate 91. Further, the lower the hardness of emulsion is, the more favorable the result becomes and hence, it is preferable that the hardness of emulsion is set to 20 N/mm$^2$ or less.

The thickness of the irregularities of the texture formed on the solar cell surface used in this embodiment is 5 μm and hence, the emulsion hardness of the emulsion having low hardness 61B is set to 20 N/mm$^2$ and a thickness of the emulsion 61B is set to 15 μm.

A total thickness of two kinds of emulsions 61A and 61B is set to 65 μm which is larger than a width of 60 μm of the opening portion 643 by which a pattern of the grid electrode wiring 43 is formed. Here, a thickness of the emulsion is a value obtained by subtracting a thickness (mesh thickness) of the metal mesh 62A from the total thickness of the pattern forming mask 60. According to this embodiment, the emulsion hardness of the emulsion having high hardness 61A is set to 100 N/mm$^2$ and a thickness of the emulsion 61B is set to 50 μm.

In a paste which forms a conductive line, silver particles which constitute a conductive material, an organic binder component and an organic solvent are mixed. In a drying step after a pattern is formed, the organic solvent dissipates and hence, a volume of the paste is decreased. Some pastes need to be baked at a high temperature. In such a case, an organic binder is eliminated so that the volume of the paste is decreased.

Although it is necessary to lower the specific resistance of the conductive material to obtain the desired line resistance, it is also necessary to increase a cross-sectional area of the conductive line. Also, the conversion efficiency can be increased by narrowing a line width of a conductive line thus increasing an area where sun light is irradiated.

According to this embodiment, the emulsion 61B having low hardness can follow the texture (irregularities) formed on the solar cell surface and hence, the emulsion 61B can be brought into close contact with a solar cell surface on which the texture is formed. Accordingly, the exuding of a paste can be prevented and an effective solar light receiving area on a surface of the substrate 91 can be increased so that conversion efficiency can be enhanced.

Further, when the number of times of forming a wiring pattern is increased, it is necessary to perform alignment with high accuracy. When a misalignment occurs, a line width is broadened thus lowering conversion efficiency. Accordingly, it is necessary to form a line having a high aspect ratio by performing pattern forming by moving the discharge mechanism part 1 in one direction only once. Accordingly, a thickness of the emulsion of the mask 60A used for pattern forming is set large.

According to this embodiment, it is sufficient to perform the pattern forming once to obtain a desired line resistance and hence, alignment with high accuracy which is required when pattern forming is repeatedly performed plural times becomes unnecessary. Accordingly, the pattern forming is not performed in such a manner that only one substrate 91 is set at each step, but the pattern forming can be performed on a plurality of substrates 91 at the same time. As a result, not only the electrode wiring is favorably formed but also a tact time is shortened and hence, the productivity is enhanced.

Even when the pattern forming is performed in such a manner that only one substrate 91 is set in each step, it is possible to form a pattern having a high aspect ratio by performing pattern forming once by moving the discharge mechanism part 1 in one direction only once and hence, compared to a conventional case where the pattern forming is performed plural times while performing the alignment every time, a tact time can be shortened and hence, the productivity is enhanced.

[Embodiment 5]

According to an embodiment 5, as one example where mold release properties of a paste from a pattern forming mask is enhanced, an electrode wiring pattern forming of a solar cell surface will be explained. The constitution of this embodiment is substantially equal to the corresponding constitution according to the above-mentioned embodiment 2 except for a pattern forming mask 60B.

Figure 19:
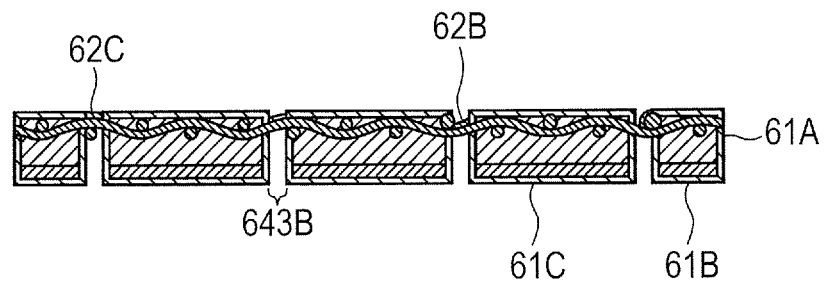
FIG. 19 is a locally enlarged cross-sectional view of a pattern forming mask according to an embodiment 5 of the present invention.

FIG. 19 shows an enlarged schematic view of a partial cross-section for explaining the pattern forming mask 60B used in this embodiment 5.

The pattern forming mask 60B is formed using a method substantially equal to the method used in the embodiment 4. The pattern forming mask 60B is formed such that hydrocarbon films (61C and 62C) having high liquid repellency are formed on a surface of a metal mesh 62B and a surface of emulsions (61A, 61B) which are exposed as well as on a surface of a pair of discharge portions 101R and 101L explained in conjunction with the embodiments 1 to 4 of the present invention so that mold release properties of the paste 46 is enhanced.

When a pattern formed of the paste 46 is formed on a substrate 91 by the pattern forming apparatus 100 described in FIG. 1 using the pattern forming mask 60B, a paste pattern 462 having a high aspect ratio is transferred on an upper portion of the substrate 91 and no paste remains in an emulsion opening portion 643B of the pattern forming mask 60B. It is considered that, by forming the hydrocarbon films (61C and 62C) having high liquid repellency on the portions of the pattern forming mask 60B where the metal mesh 62B and the emulsions (61A, 61B) are exposed, mold release properties of the paste 46 from the metal mesh 62B and the emulsions (61A, 61B) is enhanced.

According to this embodiment, the emulsion 61B having low hardness can follow the texture (irregularities) formed on the solar cell surface and hence, the emulsion 61B can be brought into close contact with the solar cell surface on which the texture is formed. Accordingly, the exuding of the paste can be prevented and an effective solar light receiving area on the surface of the substrate 91 is increased so that conversion efficiency can be enhanced.

Regardless of magnitude of an aspect ratio (emulsion thickness/opening width) of a grid electrode wiring opening portion 643B formed using the emulsions (61A, 61B), it is possible to completely transfer the paste 46 filled into the opening portion 643B of the emulsions (61A, 61B) on the upper portion of the substrate 91 and hence, it is possible to transfer a paste pattern having a high aspect ratio onto an upper portion of the substrate 91. No paste remains in the opening portion 643B. It is considered that by giving the liquid repellency to portions of the pattern forming mask 60B where the metal mesh 62B and the emulsions (61A, 61B) are exposed by forming the hydrocarbon films 61C, 62C, mold release properties of the paste 46 from the metal mesh 62B and the emulsions (61A, 61B) is enhanced.

According to this embodiment, it is sufficient to perform the pattern forming once to obtain a desired line resistance, so that alignment with high accuracy which is required when pattern forming is repeatedly performed plural times becomes unnecessary. Accordingly, the pattern forming is not performed by setting only one substrate 91 at one step, but the pattern forming can be performed on a plurality of substrates 91 at the same time. As a result, not only the electrode wiring is favorably formed but also a tact time is shortened so that the productivity is enhanced.

Even when the pattern forming is performed by setting only one substrate 91 in one step, it is possible to form a pattern having high aspect ratio by one-time pattern forming by moving the discharge mechanism part 1 in one direction only once and hence, compared to a conventional case where the pattern forming is performed plural times while performing the alignment every time, a tact time can be shortened so that the productivity is enhanced.

[Embodiment 6]

Figure 20:
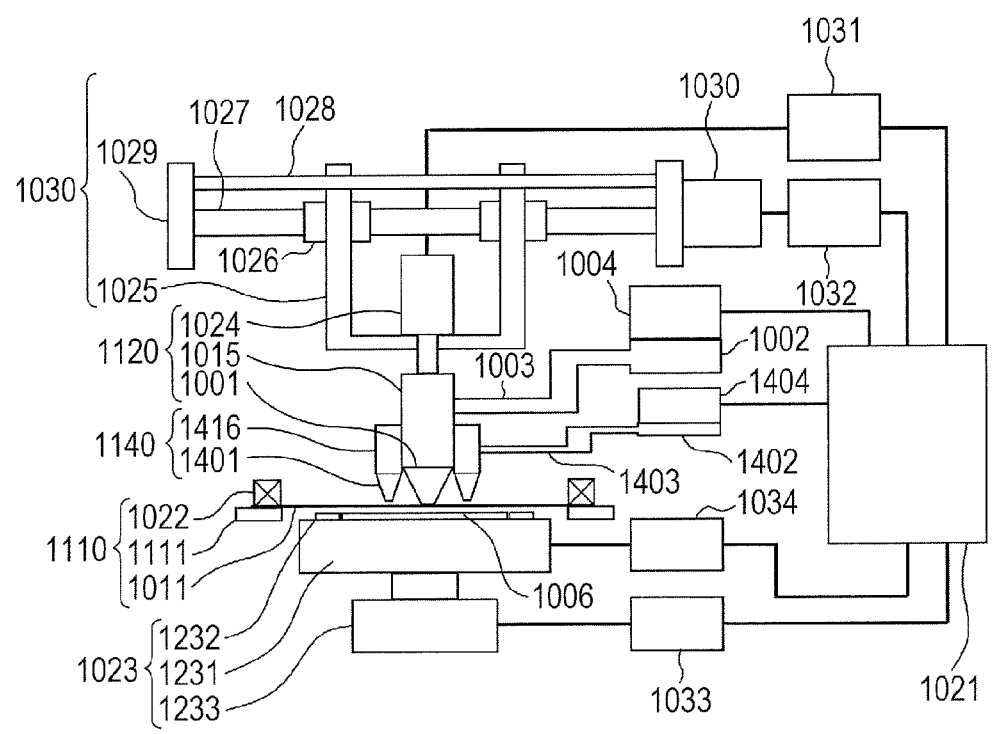
FIG. 20 is a block diagram showing the schematic constitution of a pattern forming apparatus which mounts a discharge mechanism part and an adhesion mechanism thereon according to an embodiment 6 of the present invention.

The constitution of a non-contact pattern forming apparatus 1000 on which a discharge mechanism unit 1120 and an adhesion mechanism unit 1140 according to an embodiment 6 are mounted will be explained in conjunction with FIG. 20. FIG. 20 is a front view of the non-contact pattern forming apparatus 1000 on which a discharge mechanism unit 1120 and an adhesion mechanism unit 1140 according to the embodiment 6 are mounted. In FIG. 20, for the sake of brevity, the detailed constitution of a discharge portion 1001 formed on a distal end of the discharge mechanism unit 1120 and an adhesion portion 1401 formed on a distal end of the adhesion mechanism unit 1140 and the description of a platform, side walls, support struts, supporting members and the like are omitted.

The non-contact pattern forming apparatus 1000 includes a pattern forming mask portion 1110, a pattern-forming-object supporting table part 1023, a discharge mechanism unit 1120, a drive mechanism part of a discharge mechanism unit 1130, a paste pressurizing mechanism 1002, a paste introducing passage 1003, a paste storage tank 1004, the adhesion mechanism unit 1140, a suction pressure mechanism 1402 for adhesion, a suction pressure introducing passage 1403, an air suction mechanism 1404 and a control part 1021.

The pattern forming mask portion 1110 includes a pattern forming mask 1011 which has pattern opening portions formed corresponding to a desired circuit pattern of a pattern forming object (for example, a printed circuit board) 1006, a screen print frame 1022 having a rectangular shape as viewed in a plan view which is held in a tension applied state using a tension mesh surrounding the pattern forming mask 1011, and a support member 1111 which supports the screen print frame 1022.

The pattern-forming-object supporting table part 1023 includes a table 1231 on which the pattern forming object 1006 is mounted, a chuck portion 1232 which fixes the pattern forming object 1006 mounted on the table 1231, and a vertical drive part 1233 which drives the table 1231 upwardly and downwardly.

The discharge mechanism unit 1120 includes the discharge mechanism part 1001, a discharge mechanism part head 1015, and a pneumatic cylinder 1024. The adhesion mechanism unit 1140 includes the adhesion mechanism part 1401 and an adhesion mechanism part head 1416.

The pneumatic cylinder 1024 is fixed to a support member 1025 and drives the discharge mechanism unit 1120 which is connected to the pneumatic cylinder 1024 upwardly and downwardly. The support member 1025 is supported on a bearing portion 1026 which is engaged with a drive shaft 1027. The drive shaft 1027 is formed of a ball screw and is rotationally driven by a motor 1030 so that the bearing portion 1026 engaged with the drive shaft 1027 is moved in the lateral direction in the drawing along a guide shaft 1028, and the discharge mechanism unit 1120 fixed to the support member 1025 is also moved in the lateral direction in the drawing along the guide shaft 1028. The drive shaft 1027 and the guide shaft 1028 are supported on a fixing plate 1029. The adhesion mechanism unit 1140 is arranged in front of and behind the discharge mechanism unit 1120 in the driving direction and moves in an interlocking manner with the movement of the discharge mechanism unit 1120.

An adhesion surface of the adhesion mechanism unit 1140 is arranged above the discharge mechanism unit 1120. The adhesion mechanism unit 1140 has a role of holding the pattern forming mask 1011 at a position where the pattern forming mask 1011 is not brought into contact with a pattern forming object 1006. Although not shown in the drawing, in placing the pattern forming object 1006 on the table 1231, a thickness of the pattern forming object 1006 is detected, and the adhesion mechanism unit 1140 holds the pattern forming mask 1011 at a position higher than the maximum thickness of the pattern forming object 1006.

The control part 1021 controls operations of respective parts of the non-contact pattern forming apparatus 1000. Firstly, a pneumatic cylinder drive part 1031 which drives the pneumatic cylinder 1024 is controlled in response to a control signal from the control part 1021 so that the pneumatic cylinder 1024 is driven. A driver part 1032 of the motor 1030 is controlled in response to a control signal from the control part 1021 so that the motor 1030 is rotated in the normal direction or in the reverse direction. Further, a chuck drive part 1034 which drives the chuck portion 1232 of the pattern-forming-object supporting table part 1023 is controlled in response to a control signal from the control part 1021 so that the open and close operation of the chuck portion 1232 which fixes the pattern forming object 1006 mounted on the table 1231 is performed. Still further, the table drive part 1033 which drives the vertical drive part 1233 of the pattern-forming-object supporting table part 1023 is controlled in response to a control signal from the control part 1021 so that the table 1231 is moved upwardly and downwardly.

The non-contact pattern forming apparatus including the above-mentioned constitution is operated in the same manner as the operation according to the above-mentioned embodiment 1 except for mounting the adhesion mechanism unit 1140.

The constitution of the discharge portion 1101 formed on the distal end of the discharge mechanism part 1001 is basically substantially equal to the corresponding constitution described in FIG. 3A and explained in conjunction with the above-mentioned embodiment 1. The structure of the discharge portion 1101 formed on the distal end of the discharge mechanism part 1001 according to the embodiment 6 is shown in FIG. 21 and FIG. 22.

Figure 21:
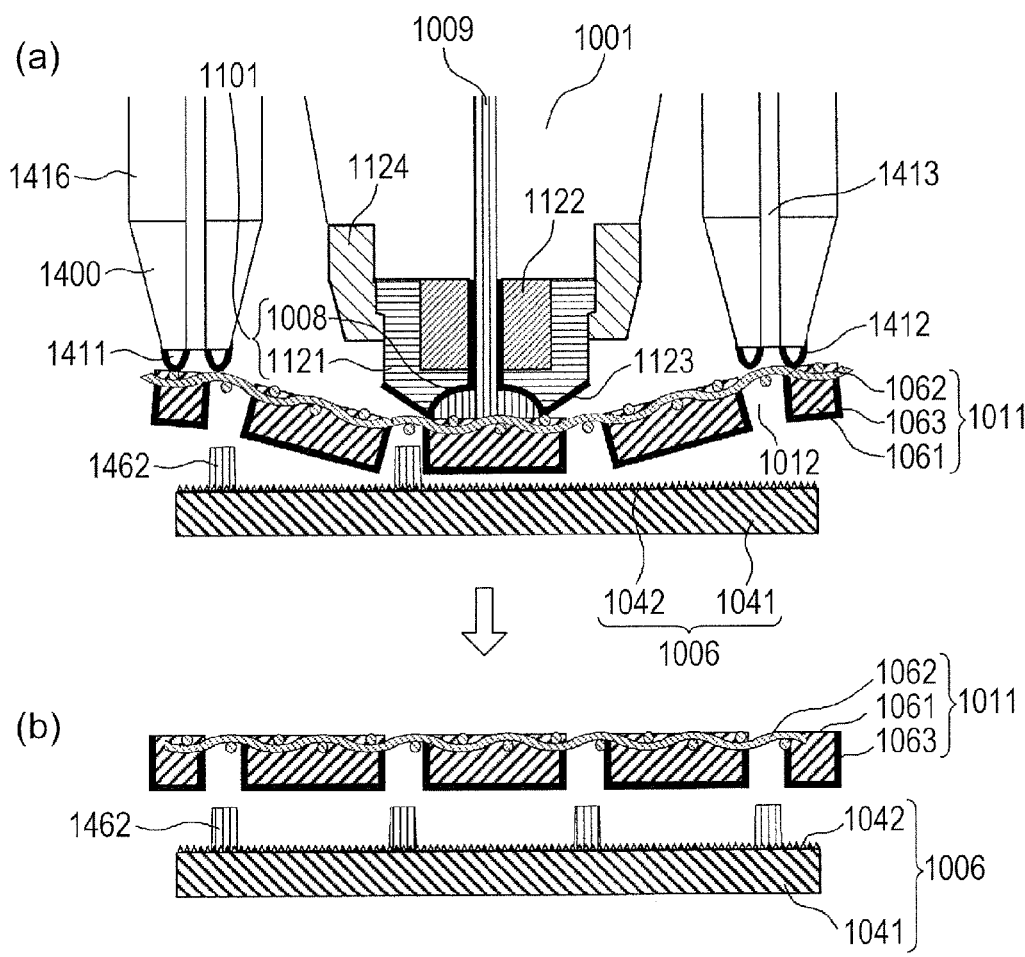
FIG. 21 is a cross-sectional view of front surfaces of a discharge mechanism part and an adhesion mechanism part showing the constitution when the discharge mechanism part and the adhesion mechanism part are independently arranged according to the embodiment 6 of the present invention.

FIG. 21 shows a state where the discharge mechanism unit 1120 and the adhesion mechanism unit 1140 are arranged independently, wherein in conformity with the discharge mechanism unit 1120, a height, a position and the like of the adhesion mechanism unit 1140 arranged in front of and behind the discharge mechanism unit 1120 in the moving direction of the discharge mechanism unit can be set independently.

Figure 22:
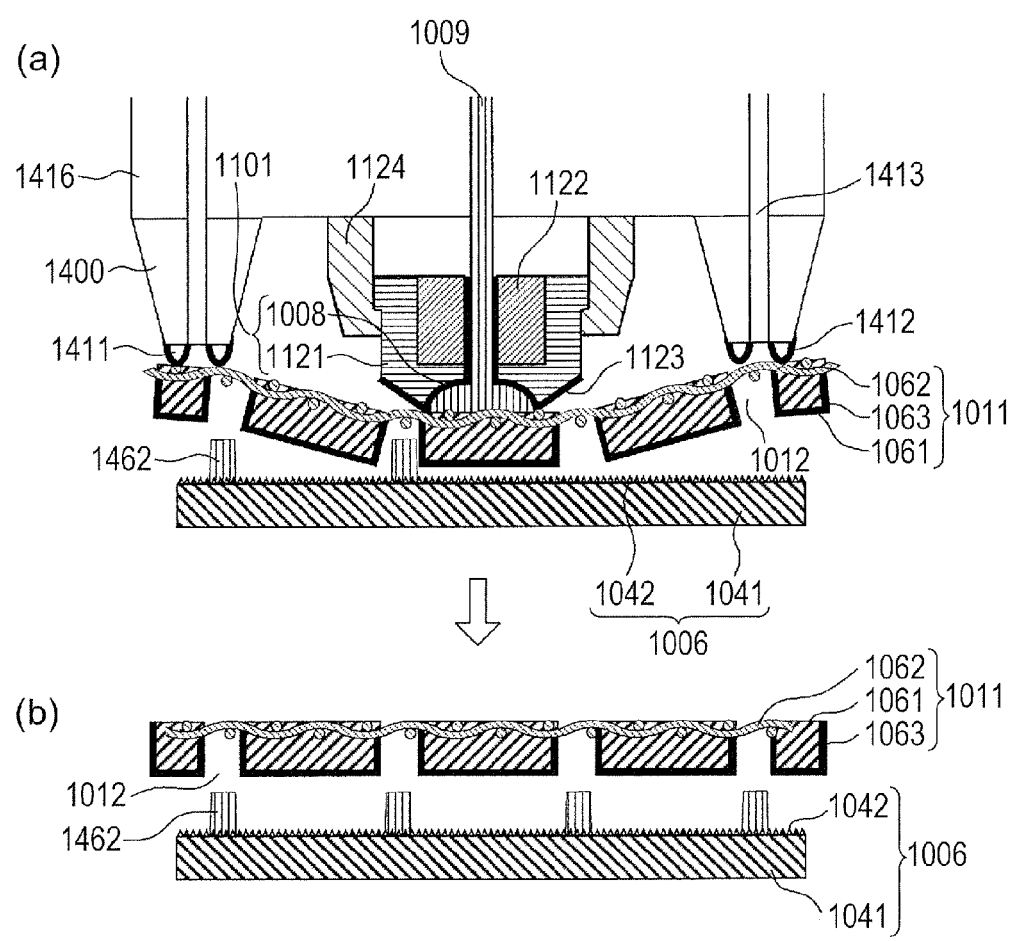
FIG. 22 is a cross-sectional view of front surfaces of the discharge mechanism part and the adhesion mechanism part showing the constitution when the discharge mechanism part and the adhesion mechanism part are arranged integrally according to the embodiment 6 of the present invention.

FIG. 22 shows a state where the discharge mechanism unit 1120 and the adhesion mechanism unit 1140 are formed as an integral body, wherein a height, a position and the like of the adhesion mechanism unit 1140 are fixed in an interlocking manner with the discharge mechanism unit 1120.

As has been explained in conjunction with the embodiment 1, the discharge portion 1101 formed on the distal end of the discharge mechanism part 1001 is formed using a polyurethane resin body 1121 and a reinforcing member 1122 made of stainless steel, and a liquid-repellent film 1123 is formed on one portion of the surface of the discharge mechanism part 1001 (portion which is brought into mainly contact with the paste). Further, an arc-shaped concave portion 1008 which is explained in conjunction with FIG. 4A and FIG. 4B in the embodiment 1 is formed on the discharge portion 1101 formed on the distal end of the discharge mechanism part 1001, wherein the arc-shaped concave portion 1008 is characterized by making the paste 1009 roll in the inside thereof thus generating a force which pushes the paste 1009 to a pattern forming mask 1011 side at an outlet (inlet).

The polyurethane resin body 1121 and the reinforcing member 1122 made of stainless steel of the discharge part 1001 are fixed to the discharge mechanism part 1001 using a fixing member 1124.

In the same manner as the embodiment 1, in the embodiment 6, a pair of left and right discharge portions 1101 is mounted on the discharge mechanism part 1001 and hence, by only moving the discharge mechanism part 1001 in one direction once, it is possible to apply the paste 1009 supplied between the pair of left and right discharge portions 1101 to the pattern forming mask surface 1011 by coating, to fill the paste 1009 into the opening pattern portion 1012 formed in the pattern forming mask 1011 using either one of discharge portions 1101, and to form a pattern on the pattern forming object 1006. Further, the method for forming the discharge portion 1101 formed on the discharge mechanism part 1001 of the embodiment 6 is substantially equal to the method explained in conjunction with the embodiment 1.

This embodiment is characterized by arranging the adhesion mechanism unit 1140 in front of and behind the discharge mechanism unit 1120 in the driving direction of the discharge mechanism unit 1120. When the paste 1009 is discharged from the discharge portion 1101 formed on the discharge mechanism part 1001, the pattern forming mask 1011 is pressed to the pattern forming object 1006 side by a discharge force. Accordingly, even when the pattern forming mask 1011 and the pattern forming object 1006 are set in a non-contact state, there exists a possibility that the pattern forming mask 1011 and the pattern forming object 1006 are brought into contact with each other. To prevent such a contact, by sucking the pattern forming mask 1011 from a distal end of a hole portion 1413 formed in the adhesion portion 1401 by a suction pressure (negative pressure), the lowering of the pattern forming mask 1011 to the pattern forming object 1006 side is prevented. It is necessary to ensure a suction force of a level which can cancel the force necessary for discharging the paste 1009 from the discharge portions 1101 formed on the distal end of the discharge mechanism part 1001.

Further, by arranging the adhesion mechanism unit 1140 in front of and behind the discharge mechanism unit 1120 in the driving direction of the discharge mechanism unit 1120, it is possible to surely maintain a state where the pattern forming mask 1011 and the pattern forming object 1006 are not brought into contact with each other. It is necessary to adjust the suction force applied through the hole portion 1413 formed in the adhesion portion 1401 depending on a strength of the mesh 1062 to be used for the pattern forming mask 1011 (relating to a tension of the pattern forming mask 1011) and the force necessary for discharging the paste 1009 from the discharge portions 1101 formed on the distal end of the discharge mechanism part 1001.

The pattern forming mask 1011 is formed using a method substantially equal to the method used in the embodiment 5. In this pattern forming mask 1011, a hydrocarbon film 1063 having high liquid repellency is formed on a surface of a metal mesh 1062 and a surface of an emulsion 1061 which are exposed thus enhancing mold release properties of the paste 1009 where the paste 1009 is removed from the opening portion of the pattern forming mask 1011 to the pattern forming object 1006.

In the embodiments 1 to 5, the pattern forming mask 1011 and the pattern forming object 1006 are brought into contact with each other and hence, a thickness of the emulsion influences a shape of the transferred paste pattern. However, in the embodiment 6, the pattern forming mask 1011 and the pattern forming object 1006 are not brought into contact with each other and hence, it is possible to control the shape of the paste pattern based on a discharge pressure of the paste 1009, a driving speed of the discharge mechanism and the like without influenced by the thickness of the emulsion.

Further, in the same manner as the above-explained embodiments 1 to 5, also in this embodiment, a hydrocarbon film 1123 having high liquid repellency is formed on a surface of the pair of discharging portions 1101 so that rolling property of the paste 1009 is enhanced thus enhancing filling property of the paste into the opening portion of the pattern forming mask 1011.

Further, in the same manner as the discharge portion 1101, a polyurethane resin body 1411 is formed on the distal end of the absorption portion 1401, and a hydrocarbon film 1412 having high liquid repellency is formed on a surface of the polyurethane resin body 1411 thus reducing friction force generated between the polyurethane resin body 1411 and an upper surface of the pattern forming mask 1011.

Silver particles, organic binder components and organic solvents which are conductive materials are mixed into the paste which forms the conductive wiring. During the drying step which follows the pattern forming, the organic solvent scatters so that a volume of the paste is decreased. Also, depending on a kind of the paste, the paste may be baked at a high temperature. In such a case, the organic binder component is dissipated and so that the volume of the paste is decreased.

To obtain the desired line resistance, although it is necessary to lower the specific resistance of the conductive material, it is also necessary to increase a cross-sectional area of the conductive line. Also, the conversion efficiency can be increased by narrowing a line width of the conductive line thus increasing an area where the sun light is irradiated.

According to this embodiment, the pattern follows the irregularities in thickness of the solar cell wafer 1041, that is, the pattern follows the texture (irregularities) 1042 formed on the surface of the solar cell wafer 1041 and hence, it is possible to form the paste pattern 1462 on the surface of the solar cell wafer 1041 by discharging the paste 1009 through the opening portion of the pattern forming mask 1011 in a state where the pattern forming mask 1011 is not brought into contact with the pattern forming object 1006. The pattern forming mask 1011 is not brought into contact with the pattern forming object 1006 and hence, the paste 1009 does not turn around to a back surface of the pattern forming mask 1011 whereby the widthwise exuding of the paste pattern 1462 formed on the solar cell wafer 1041 can be prevented. Accordingly, an effective solar light receiving area on the surface of the solar cell wafer 1041 is increased so that conversion efficiency can be enhanced.

According to this embodiment, it is sufficient to perform the pattern forming once to obtain a desired line resistance, so that alignment with high accuracy required for the pattern forming which is repeatedly performed plural times is not necessary. Accordingly, the pattern forming is not performed by setting only one solar cell wafer 1041 at one step, but the pattern forming can be performed on a plurality of substrates 91 at the same time. As a result, not only the electrode wiring is favorably formed but also a tact time is shortened whereby the productivity is enhanced.

The hydrocarbon film 1063 having high liquid repellency is formed on the surface of a metal mesh 1062 and the surface of the emulsion 1061 which are exposed from the opening portion formed using the emulsion in the pattern forming mask 1011 and hence, the paste does not remain in the opening portion formed using the emulsion in the pattern forming mask 1011. The reason is considered that the hydrocarbon film 1063 is formed on the exposed portions of the metal mesh 1062 and emulsion 1061 of the pattern forming mask 1011 thus giving liquid repellency to these parts so that mold release properties of the paste 1009 from the metal mesh 1062 and the emulsion 1061 is enhanced.

In the constitution shown in FIG. 21 and FIG. 22, the pair of polyurethane resin bodies 1121 is mounted parallel to each other and perpendicular to the pattern forming object 1006. However, as shown in FIG. 1 to FIG. 5, the polyurethane resin bodies 1121 may be mounted obliquely with respect to the pattern forming object 1006. Further, the discharge portion 101 of the embodiments 1 to 5 may be mounted parallel to each other and in a vertical manner with respect to the pattern forming object 6 in the same manner as in the this embodiment.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

The invention may be embodied in other specific forms without departing form the spirit or essential characteristics thereof. The present embodiments are therefore to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. A pattern forming method comprising the steps of:
bringing a pattern forming specimen into close contact with a mask for forming a pattern or bringing the pattern forming specimen close to the mask;
moving a pair of discharge mechanisms in one direction with respect to the mask while supplying a paste to the mask under pressure between the pair of discharge mechanisms in a state where the pair of discharge mechanisms is brought into pressure contact with the mask;
transferring the pattern formed on the mask to the specimen by peeling off the specimen from the mask in a state where the movement of the pair of discharge mechanisms in one direction is finished thus forming the pattern made of the paste on the specimen,
wherein the pair of discharge mechanisms is moved in one direction while being pressed to the mask to which the paste is applied so that a pattern formed on the mask is transferred to the specimen while accumulating the paste supplied into a space formed between a concave portion formed on a surface of the discharge mechanism arranged on a rear side in the direction where the discharge mechanism is moved in one direction, and pressed to the mask out of the pair of discharge mechanisms and the mask thus forming the pattern made of the paste.

2. The pattern forming method according to claim 1, wherein the concave portion formed on the surface of the discharge mechanism pressed to the mask is covered with a liquid-repellent film, and the pattern is formed by rolling the paste accumulated in the space formed between the concave portion covered with the liquid-repellent film and the mask in the space formed between the concave portion and the mask along the liquid-repellent film which covers the surface of the concave portion.

3. The pattern forming method according to claim 1, wherein either one of a mask formed of a metal plate or a mask formed of a metal mesh is used as a mask.

4. The pattern forming method according to claim 2, wherein a mask whose surface is covered with a liquid-repellent film by forming an emulsion on a metal mesh by adhesion is used as the mask.

5. The pattern forming method according to claim 2, wherein, by forming the pattern while accumulating the paste in the space formed between the concave portion which is formed on the discharge mechanism and whose surface has liquid repellency and the mask by moving the discharge mechanism in one direction while pressing the discharge mechanism to the mask to which the paste is applied, the paste is filled into the inside of through holes formed in the specimen, and the pattern made of the paste is formed on a surface of the specimen.

6. The pattern forming method according to claim 1, wherein in the step of forming the pattern made of the paste by transferring the pattern formed on the mask to the specimen by moving the pair of discharge mechanisms in one direction while pressing the pair of discharge mechanisms to the mask to which the paste is applied, the pattern made of the paste is formed by transferring the pattern formed on the mask to the specimen while sucking the mask toward a side of the discharge mechanism in front of and behind the pair of discharge mechanisms in the moving direction when the pair of discharge mechanisms is brought into pressure contact with the mask.

7. The pattern forming method according to claim 1, wherein the specimen is a solar cell, and a grid electrode wiring pattern and a bus electrode wiring pattern of the solar cell formed on the mask are transferred to a surface of the solar cell by moving the pair of discharge mechanisms in one direction with respect to the mask while supplying the paste under pressure.

8. The pattern forming method according to claim 1, wherein the specimen is a back-contact-type solar cell, and the pattern formed on the mask is transferred to a back surface of the solar cell by moving the pair of discharge mechanisms in one direction with respect to the mask while supplying the paste under pressure thus forming an electrode wiring pattern made of the paste on the back surface of the back-contact-type solar cell, and the paste is filled in a through hole which connects the back surface and a front surface of the back-contact-type solar cell.

* * * * *